US012765274B2

(12) United States Patent
Huang et al.

(10) Patent No.: US 12,765,274 B2
(45) Date of Patent: Oct. 13, 2026

(54) SPATIAL LIGHT MODULATOR DEVICE USING A PHASE CHANGE MATERIAL AND METHODS FOR FORMING THE SAME

(71) Applicant: Taiwan Semiconductor Manufacturing Company Limited, Hsinchu (TW)

(72) Inventors: Chang-Chih Huang, Taichung (TW); Yu-Wen Wang, Taichung City (TW); Wei-Fang Chen, Taichung City (TW); Han-Yu Chen, Zhubei City (TW); Kuo-Chyuan Tzeng, Chu-Pei city (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 359 days.

(21) Appl. No.: 18/607,599

(22) Filed: Mar. 18, 2024

(65) Prior Publication Data

US 2025/0098555 A1 Mar. 20, 2025

Related U.S. Application Data

(60) Provisional application No. 63/583,392, filed on Sep. 18, 2023.

(51) Int. Cl.

| | |
|---|---|
| ***H10N 70/20*** | (2023.01) |
| ***H10N 70/00*** | (2023.01) |
| *H10B 63/10* | (2023.01) |

(52) U.S. Cl.

CPC ......... *H10N 70/231* (2023.02); *H10N 70/061* (2023.02); *H10B 63/10* (2023.02)

(58) Field of Classification Search

CPC ........................... H10N 70/231; H10N 70/061

USPC ........................................................... 349/25

See application file for complete search history.

(56) References Cited

U.S. PATENT DOCUMENTS

| | | | | |
|---|---|---|---|---|
| 2021/0375988 | A1 | 12/2021 | Ko et al. | |
| 2022/0037401 | A1* | 2/2022 | Park | H10B 63/80 |
| 2022/0208748 | A1 | 6/2022 | Rabkin et al. | |
| 2023/0397510 | A1* | 12/2023 | Li | H10N 70/231 |
| 2024/0389483 | A1* | 11/2024 | Ting | H10N 70/8825 |
| 2025/0185525 | A1* | 6/2025 | Philip | H10N 70/063 |
| 2025/0248319 | A1* | 7/2025 | Yang | H10N 70/068 |

OTHER PUBLICATIONS

TW Patent and Trademark Office; TW Application No. 113117538, Office Action mailed Nov. 22, 2024; 10 pages.

* cited by examiner

*Primary Examiner* — Christopher M Raabe
(74) *Attorney, Agent, or Firm* — The Marbury Law Group, PLLC

(57) ABSTRACT

A spatial light modulator device includes an array of spatial light modulator cells located over a substrate. Each of the spatial light modulator cells includes: a layer stack including a phase change material plate, a spacer dielectric material plate that underlies the phase change material plate, and a metallic heater plate underlying the spacer dielectric material plate and including outer sidewalls; and a pair of bottom electrode via structures contacting a respective surface segment of a bottom surface of the metallic heater plate. Each of the outer sidewalls of the metallic heater plate is vertically coincident with a respective sidewall of the spacer dielectric material plate and with a respective sidewall of the phase change material plate.

20 Claims, 42 Drawing Sheets

SPATIAL LIGHT MODULATOR DEVICE USING A PHASE CHANGE MATERIAL AND METHODS FOR FORMING THE SAME

RELATED APPLICATIONS

This application claims the benefit of priority from U.S. Provisional Application Ser. No. 63/583,392 titled "Mask optimization for phase change material (PCM) spatial light modulator (SLM) process" and filed on Sep. 18, 2023, the entire contents of which are incorporated herein by reference for all purposes.

BACKGROUND

A spatial light modulator (SLM) is an optical device that imposes some form of spatially varying modulation on a beam of light. An SLM modulates the intensity and/or the phase of an optical beam. SLMs may be used in holographic data storage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
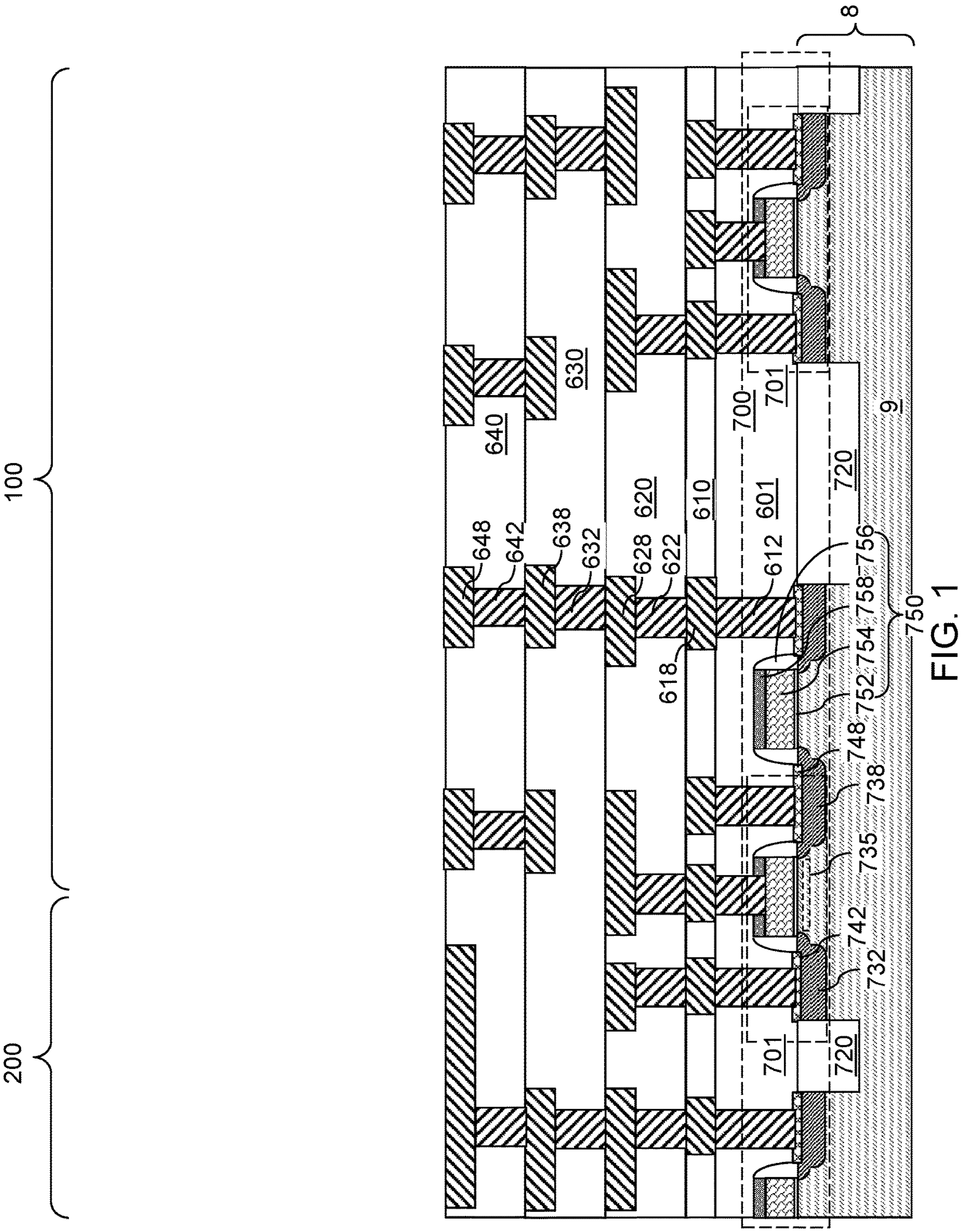
FIG. 1 is a vertical cross-sectional view of an embodiment structure after formation of field effect transistors and metal interconnect structures are formed in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Various embodiments of the present disclosure are directed to a spatial light modulator using a phase change memory material. An optimized mask layout design may be used to pattern an array of spatial light modulator cells having enhanced device performance. A metallic heater material layer may be patterned in a manner that forms openings only within the area of the array of spatial light modulator cells, thereby minimizing dishing of a dielectric fill material that fills the openings during a subsequent planarization process. The ratio of the area of the metallic heater material layer to the area of the openings may be greater than 9, thereby enabling precise control of the polishing rate in a chemical mechanical polishing process that is used for the planarization process. Dielectric pillar structures are formed in the openings in the metallic heater material layer, and may vertically extend through an underlying via-level dielectric layer, or may be formed entirely within the level of the metallic heater material layer.

A phase change memory material layer and the metallic heater material layer may be subsequently patterned using a same etch mask such as a patterned photoresist layer. Using the same etch mask results in an alignment of outer sidewalls of metallic heater plates with phase change material plates, thereby ensuring areal overlap between the metallic heater plates and the phase change material plates. The dielectric pillar structures may be located entirely within the areas of the metallic heater plates. A dielectric cover layer may be formed over an array of spatial light modulator cells to provide thermal insulation for the spatial light modulator cells. The various configurations of the present disclosure may provide enhanced thermal distribution profile in the array of spatial light modulator cells, and may enhance performance and reliability of the array of spatial light modulator cells.

The phase change material plates function as reflectors with tunable phase modulation. The phase change material plates may be programmed into a crystalline state or into an amorphous state to provide a different phase shift in the incident light. The phase change material in the phase change material plates provides transitions between the amorphous state and the crystalline state when subjected to specific heating and cooling conditions. Generally, rapid quenching from a molten state results in an amorphous phase (i.e., an amorphous state), and a slow cooling from the molten state results in a crystalline phase (i.e., a crystalline state). The amorphous state and the crystalline state may provide two different refractive indices, and thus, modulation of the crystalline phase of the phase change material can induce different phase shifts for an optical beam having a fixed wavelength and reflected off the phase change material. The phase change material may be used as a programmable optical phase modulator that may be repeatedly programmed into two optical states providing different phase shifts. In an illustrative example, the thickness of the phase change material may be selected such that two reflected optical beam components generated at a top surface and at a bottom surface of the phase change material interfere constructively in one of two crystalline phases of the phase change material, and interfere destructively in the other of the two crystalline phases of the phase change material. The optical state, and thus, the crystalline state of the phase change material can be determined by measuring the intensity of a reflective optical beam from the phase change material. Therefore, optical data may be stored in the phase change material portions by controllably changing the distribution of the crystalline states across an array of material plates. The various embodiments of the present disclosure are now described with reference to accompanying drawings.

Referring to FIG. 1, an embodiment structure of the present disclosure is illustrated. The embodiment structure includes a semiconductor substrate 8, which may be a commercially available silicon substrate. The semiconductor substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the semiconductor substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Semiconductor devices such as field effect transistors 701 may be formed over the top surface of the semiconductor material layer 9. For example, each field effect transistor may include a source electrode 732, a drain electrode 738, a semiconductor channel 735 that includes a surface portion of the semiconductor substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor circuits, etc.), and are collectively referred to as CMOS circuitry 700.

One or more of the field effect transistors in the CMOS circuitry 700 may include a semiconductor channel 735 that contains a portion of the semiconductor material layer 9 in the semiconductor substrate 8. In embodiments in which the semiconductor material layer 9 includes a single crystalline semiconductor material such as single crystalline silicon, the semiconductor channel 735 of each field effect transistor in the CMOS circuitry 700 may include a single crystalline semiconductor channel such as a single crystalline silicon channel. In one embodiment, a subset of the field effect transistors in the CMOS circuitry 700 may include a respective node that is subsequently electrically connected to a node of an energy harvesting device and/or to a battery structure to be subsequently formed.

In one embodiment, the semiconductor substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

Various metal interconnect structures formed within dielectric material layers may be subsequently formed over the semiconductor substrate 8 and the semiconductor devices thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640.

The metal interconnect structures may include device contact via structures 612 formed in the first dielectric material layer 601 and contact a respective component of the CMOS circuitry 700, first conductive line structures 618 formed in the first interconnect-level dielectric material layer 610, first conductive via structures 622 formed in a lower portion of the second interconnect-level dielectric material layer 620, second conductive line structures 628 formed in an upper portion of the second interconnect-level dielectric material layer 620, second conductive via structures 632 formed in a lower portion of the third interconnect-level dielectric material layer 630, third conductive line structures 638 formed in an upper portion of the third interconnect-level dielectric material layer 630, third conductive via structures 642 formed in a lower portion of the fourth interconnect-level dielectric material layer 640, and fourth conductive line structures 648 formed in an upper portion of the fourth interconnect-level dielectric material layer 640. While the present disclosure is described using an embodiment in which four levels of conductive line structures are formed in dielectric material layers, embodiments are expressly contemplated herein in which a lesser or greater number of levels of conductive line structures are formed in dielectric material layers.

Each of the dielectric material layers (601, 610, 620, 630, 640) may include a dielectric material such as undoped silicate, a doped silicate, silicon oxynitride, carbon-doped silicon oxide, organosilicate, silicon oxynitride, silicon nitride, silicon nitride carbide, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, MON, TIC, TaC, and WC, and each metallic fill material portion may include W, Cu, Al, Co, Ru, Mo, Ta, Ti, Au, Pt, alloys thereof, and/or combinations thereof. Other suitable metallic liner and metallic fill materials within the contemplated scope of disclosure may also be used. In one embodiment, the first conductive via structures 622 and the second conductive line structures 628 may be formed as integrated line and via structures by a dual damascene process. Generally, any contiguous set of a conductive line structure (628, 638, 648) and at least one underlying conductive via structure (622, 632, 642) may be formed as an integrated line and via structure.

Generally, semiconductor devices may be formed on a semiconductor substrate 8, and metal interconnect structures (612, 618, 622, 628, 631, 638, 642, 648) and dielectric material layers (601, 610, 620, 630, 640) over the semiconductor devices. The metal interconnect structures (612, 618, 622, 628, 631, 638, 642, 648) may be formed in the dielectric material layers (601, 610, 620, 630, 640), and may be electrically connected to the semiconductor devices such as the field effect transistors 701. The embodiment structure may comprise an array region 100 in which an array of spatial light modulator cells is subsequently formed, and a peripheral region 200 in which metallic contact structures are subsequently formed.

According to an aspect of the present disclosure, the field effect transistors 701 comprise heater driver transistors for driving spatial light modulator cells to be subsequently formed. Each spatial modulator cell comprises a metallic heater plate and a phase change material plate. Each field heater driver transistor may be configured to apply a programming pulse that is selected from a first programming pulse of a first duration that may melt the phase change material plate and quench the molten phase change material rapidly to resolidify the phase change material in an amorphous state, and a second programming pulse of a second duration that may melt the phase change material plate and slowly cool the phase change material to resolidify the phase change material in a crystalline state. The first duration may be in a range from 1 ns to 10 ns. The second duration may be in a range from 100 microseconds to 1 millisecond. In one embodiment, each spatial light modulator cell may comprise a pair of bottom electrode via structures (to be subsequently formed). In this embodiment, each of the heater driver transistors may be configured to drive electrical current through the metallic heater plate and the pair of bottom electrode via structures within a respective spatial light modulator cell.

Figure 2:
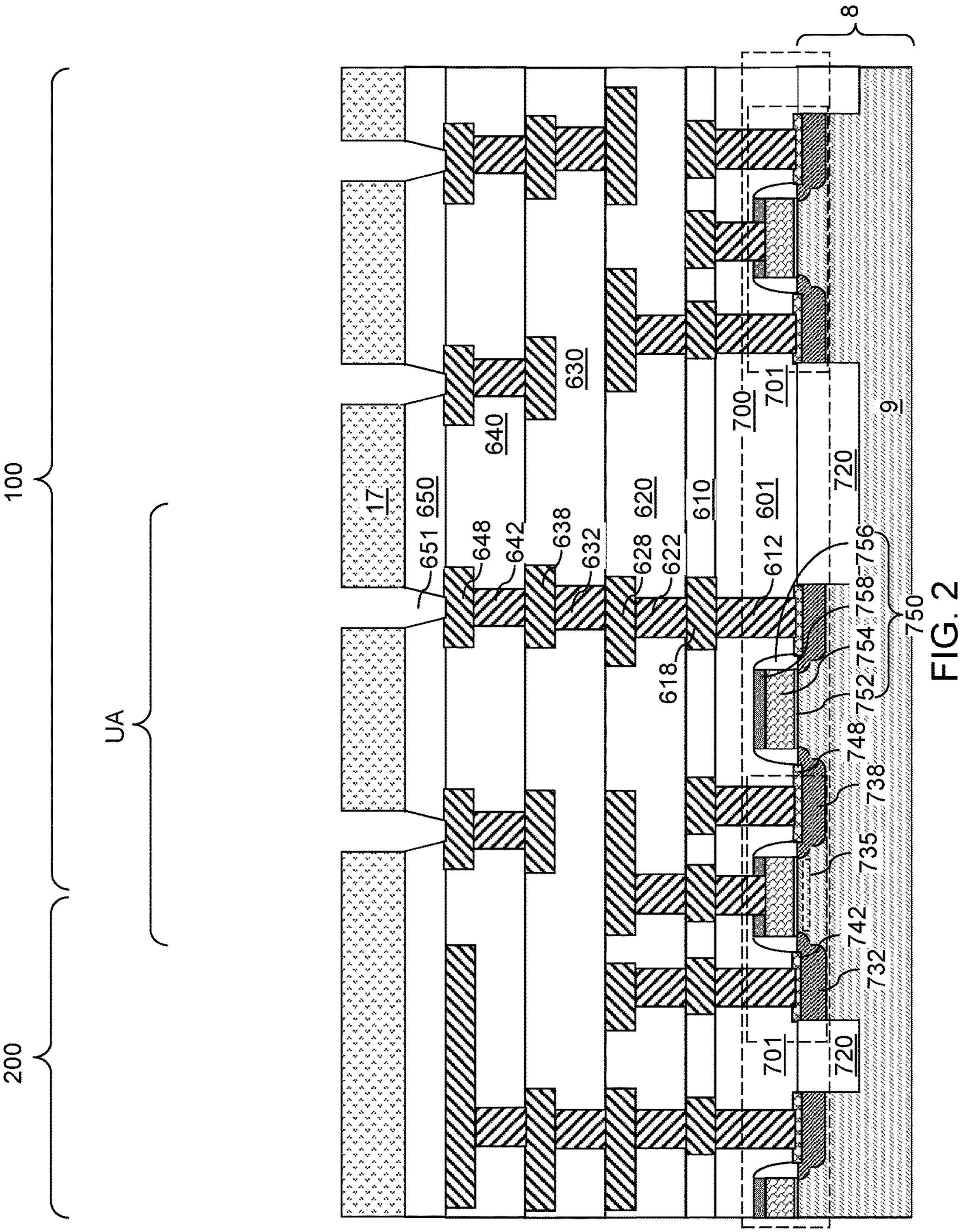
FIG. 2 is a vertical cross-sectional view of the embodiment structure after formation of a via-level dielectric layer and an array of via cavities through the via-level dielectric layer according to an embodiment of the present disclosure.

Referring to FIG. 2, a via-level dielectric layer 650 may be formed over the underlying dielectric material layers (601, 610, 620, 630, 640). The via-level dielectric layer 650 comprises an interlayer dielectric (ILD) material such as undoped silicate, a doped silicate, or organosilicate. The thickness of the via-level dielectric layer 650 may be in a range from 200 nm to 800 nm, although lesser and greater thicknesses may also be used.

A photoresist layer 17 may be applied over the via-level dielectric layer 650, and may be lithographically patterned to form arrays of sets of openings. Each set of openings comprises at least a pair of openings, and is formed within a respective unit area UA within the arrays of sets of openings. In this embodiment, the pattern of the set of openings may be periodically repeated with a periodicity along two horizontal directions, which may, or may not, be perpendicular to each other. In embodiments in which the array of sets of openings is a rectangular array, the two horizontal directions may be perpendicular to each other.

An anisotropic etch process may be performed to transfer the pattern in the photoresist layer 17 through the via-level dielectric layer 650. Via cavities 651 are formed through the via-level dielectric layer 650 underneath the openings in the photoresist layer 17. A top surface of an underlying metal interconnect structure, such as a top surface of a fourth conductive line structure 648, may be physically exposed underneath each via cavity 651. The photoresist layer 17 may be subsequently removed, for example, by ashing.

Figure 3A:
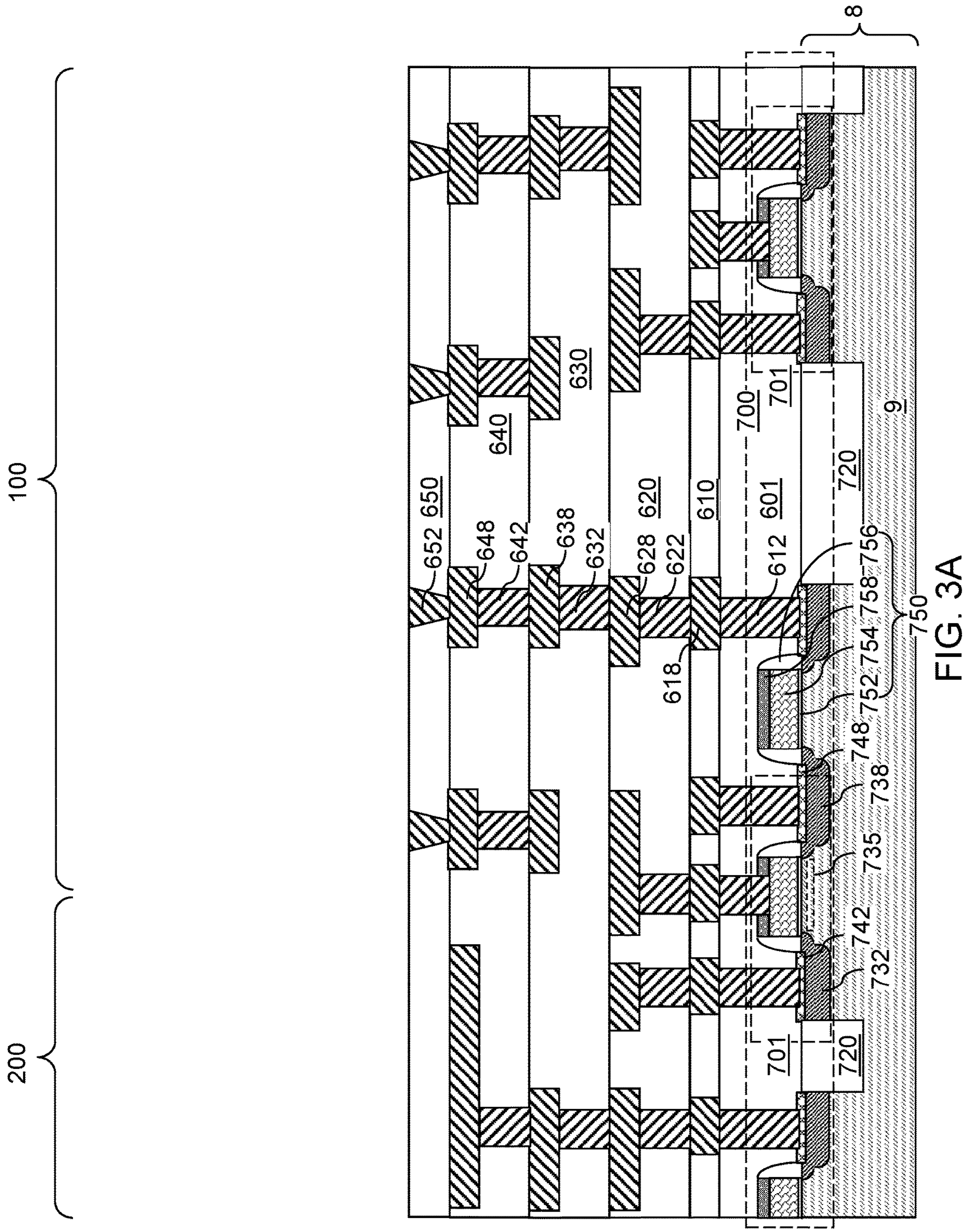
FIG. 3A is a vertical cross-sectional view of the embodiment structure after formation of an array of bottom electrode via structures according to an embodiment of the present disclosure.
Figure 3B:
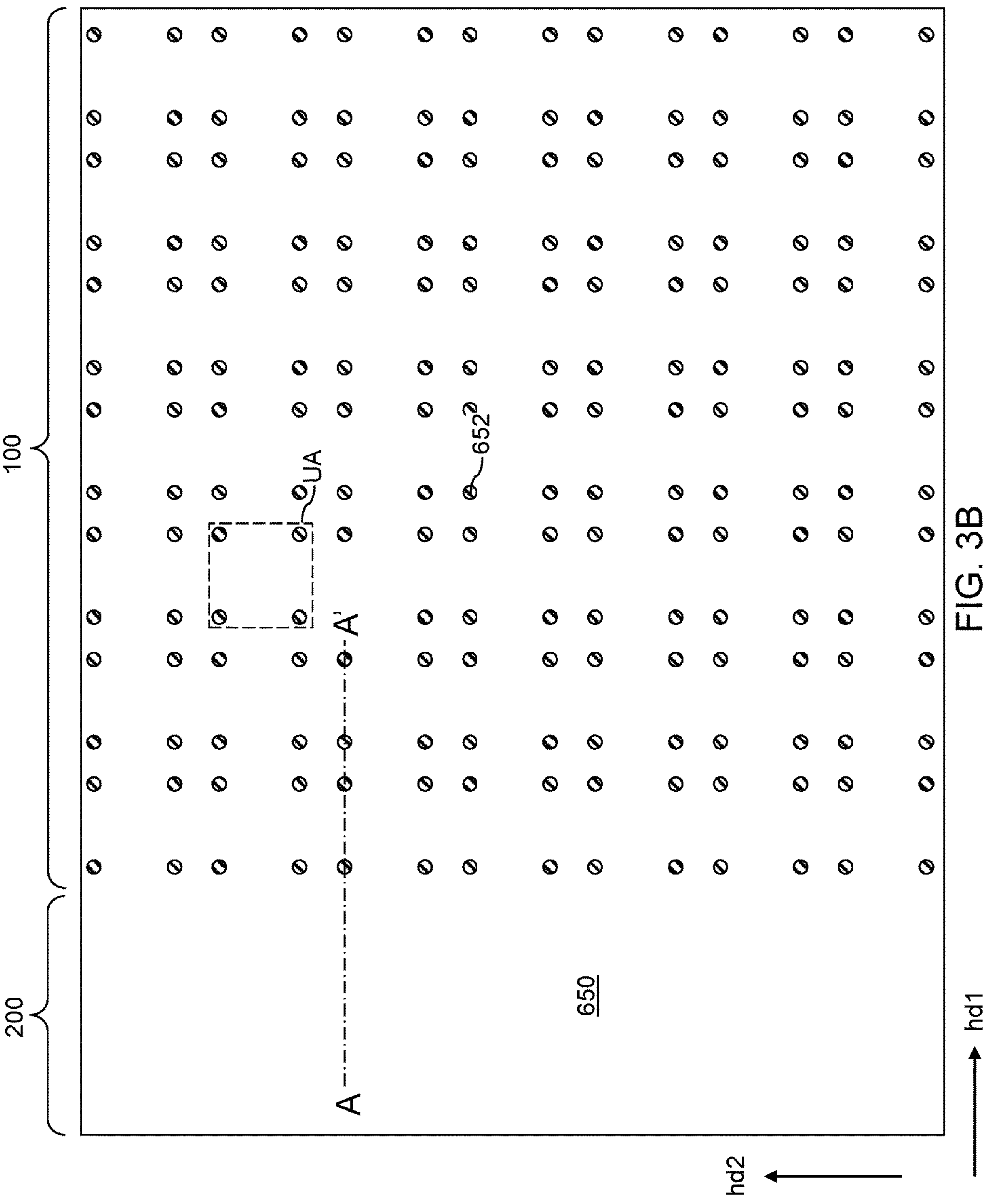
FIGS. 3B, 3C, and 3D are top-down views of various configurations of the embodiment structure of FIG. 3A. The vertical planes A-A' in FIGS. 3B and 3C correspond to the cut plane in FIG. 3A.
Figure 3C:
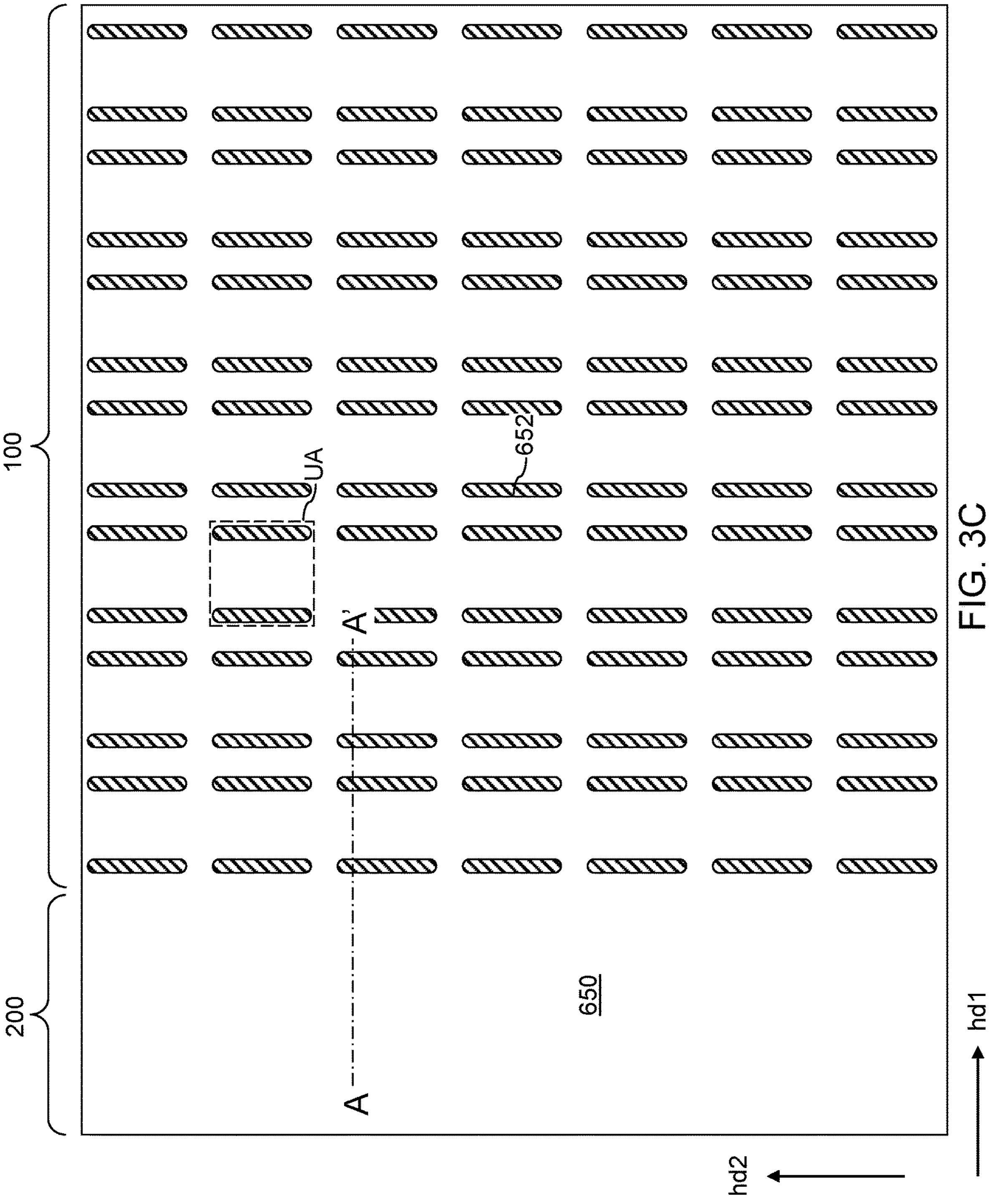
Figure 3D:
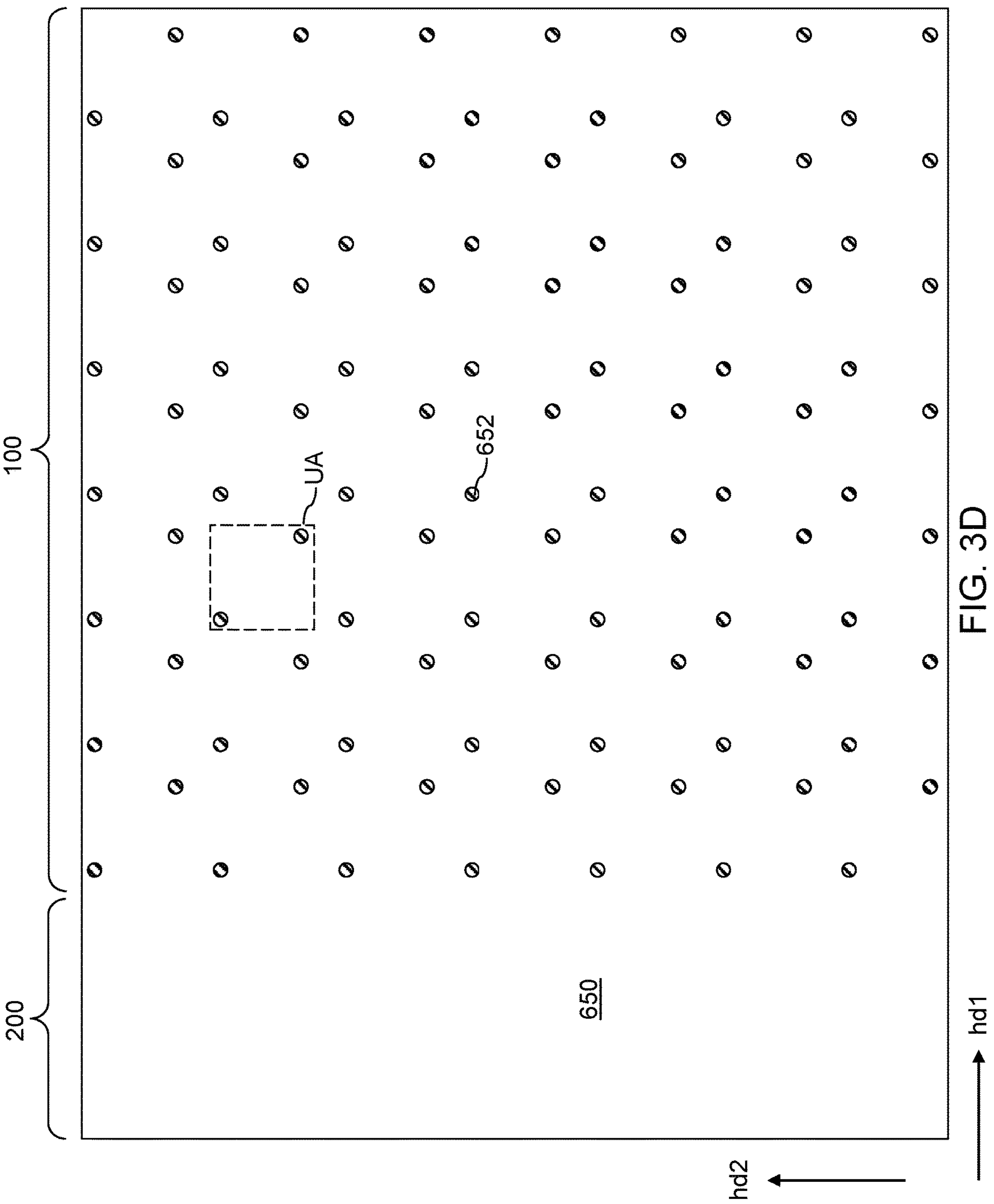

FIG. 3A is a vertical cross-sectional view of the embodiment structure after formation of an array of bottom electrode via structures 652 according to an embodiment of the present disclosure. FIGS. 3B, 3C, and 3D are top-down views of various configurations of the embodiment structure of FIG. 3A. The vertical planes A-A' in FIGS. 3B and 3C correspond to the cut plane in FIG. 3A.

Each bottom electrode via structure 652 may contact a top surface of an underlying metal interconnect structure, which may be a fourth conductive line structure 648. In one embodiment, each bottom electrode via structure 652 may comprise a metallic barrier liner and a metallic fill material portion. The metallic barrier liner may comprise a metallic barrier material such as TiN, TaN, WN, MON, TiC, TaC, WC, or a combination thereof. The metallic fill material portion may comprise Cu, Al, Ru, W, Mo, Co, or a combination thereof. In one embodiment, the metallic fill material may comprise Cu or Al. Top surfaces of the bottom electrode via structures 652 may be formed within a horizontal plane including a top surface of the via-level dielectric layer 650.

Each bottom electrode via structure 652 may contact a top surface of an underlying metal interconnect structure, which may be a fourth conductive line structure 648. In one embodiment, each bottom electrode via structure 652 may comprise a metallic barrier liner and a metallic fill material portion. The metallic barrier liner may comprise a metallic barrier material such as TiN, TaN, WN, MON, TIC, TaC, WC, or a combination thereof. The metallic fill material portion may comprise Cu, Al, Ru, W, Mo, Co, or a combination thereof. In one embodiment, the metallic fill material may comprise Cu or Al. Top surfaces of the bottom electrode via structures 652 may be formed within a horizontal plane including a top surface of the via-level dielectric layer 650.

At least a pair of bottom electrode via structures 652 may be formed within each unit area UA of an array of spatial light modulator cells. FIG. 3B illustrates a configuration in which two pairs of bottom electrode via structures 652 are formed within each unit area UA. In this embodiment, two bottom electrode via structures 652 may be electrically connected to a first output node of a heater driver transistor, and the other two bottom electrode via structures 652 may be electrically connected to a second output node of the heater driver transistor.

FIG. 3C illustrates a configuration in which one pair of bottom electrode via structures 652 is formed within each unit area UA. In this configuration, the bottom electrode via structures 652 within each unit area UA may be laterally elongated along a horizontal direction that is perpendicular to the lateral separation direction of the bottom electrode via structures 652.

FIG. 3D illustrates a configuration in which one pair of bottom electrode via structures 652 is formed within each unit area UA. In this configuration, the bottom electrode via structures 652 within each unit area UA may be diagonally spaced from each other. The lateral separation direction between the bottom electrode via structures 652 may be not parallel to, and not perpendicular to, the repetition directions of the array of spatial light modulator cells to be subsequently formed.

In one embodiment, the unit area UA may be repeated with a periodicity along a first horizontal direction hd1 and along a second horizontal direction hd2. In one embodiment, the second horizontal direction hd2 may be perpendicular to the first horizontal direction. In one embodiment, instances of the unit area UA may be repeated in a periodic rectangular two-dimensional array.

Figure 4:
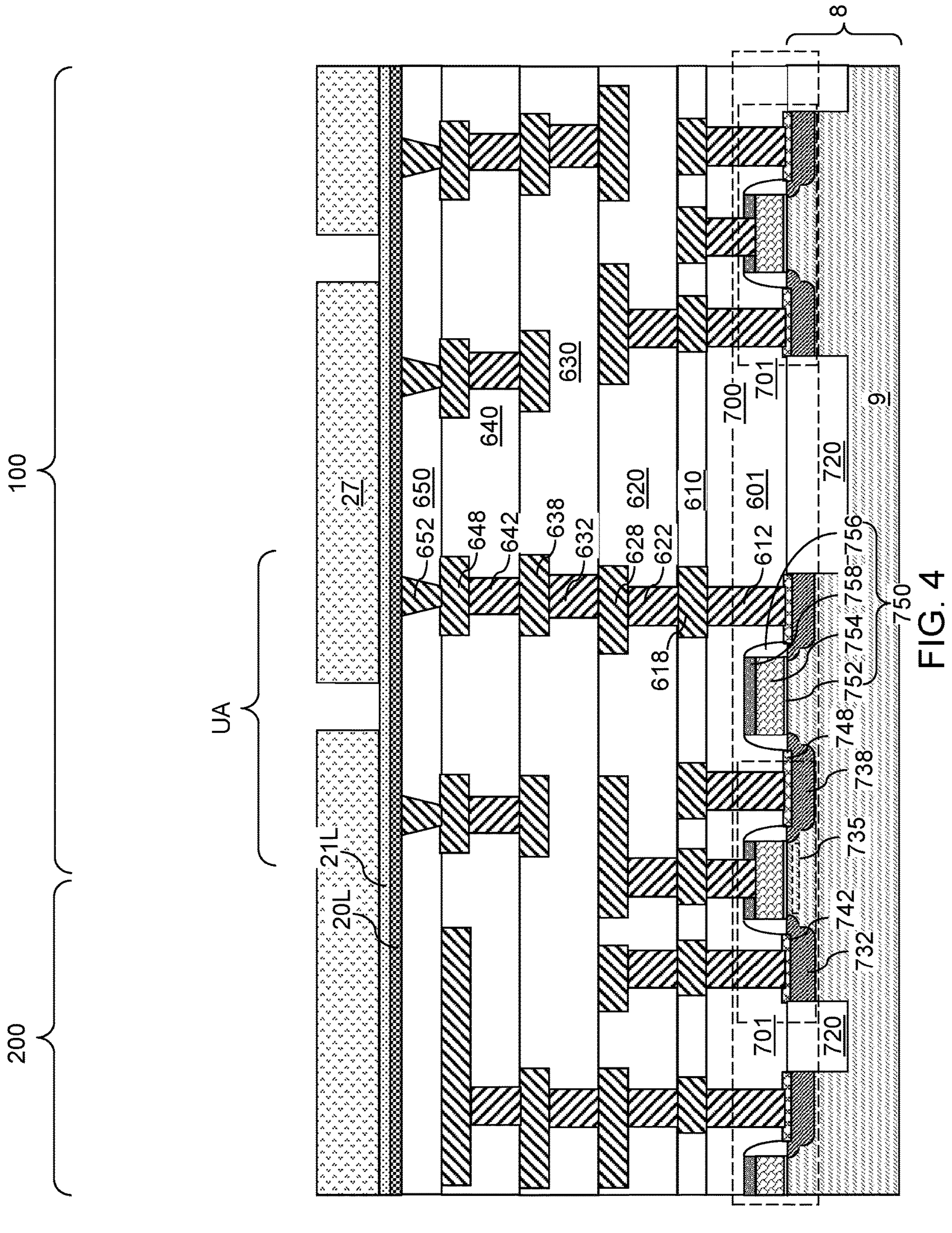
FIG. 4 is a vertical cross-sectional view of the embodiment structure after formation of a metallic heater material layer, a hardmask layer, and a patterned etch mask layer according to an embodiment of the present disclosure.

Referring to FIG. 4, metallic heater material layer 20L, a hardmask layer 21L, and a patterned etch mask layer 27 may be formed above the via-level dielectric layer 650. The metallic heater material layer 20L comprises a metallic material having a melting point higher than 1,500 degrees Celsius. For example, the metallic heater material layer 20L may comprise a refractory metal such as tungsten, tantalum, rhenium, molybdenum, or niobium, or may comprise a metallic nitride material such as TiN, TaN, WN, or MoN. The thickness of the metallic heater material layer 20L may be in a range from 10 nm to 100 nm, although lesser and greater thicknesses may also be used.

A hardmask layer 21L may be deposited over the metallic heater material layer 20L. The hardmask layer 21L may comprise a dielectric material such as silicon oxide, silicon nitride, silicon carbide, silicon oxycarbide, silicon oxynitride, or a dielectric metal oxide material. The thickness of the hardmask layer 21L may be in a range from 20 nm to 100 nm, although lesser and greater thicknesses may also be used.

The patterned etch mask layer 27 may comprise a patterned photoresist layer. The patterned etch mask layer includes discrete openings that are smaller in size than each area in which a metallic heater plate is to be subsequently formed. In one embodiment, a set of at least one opening may be formed in the patterned etch mask layer 27 within each unit area UA. The set of at least one opening may be formed entirely within a respective unit area UA for forming a spatial light modulator cell. Specifically, the set of at least one opening may be formed entirely within the area of a metallic heater plate to be subsequently formed.

Figure 5A:
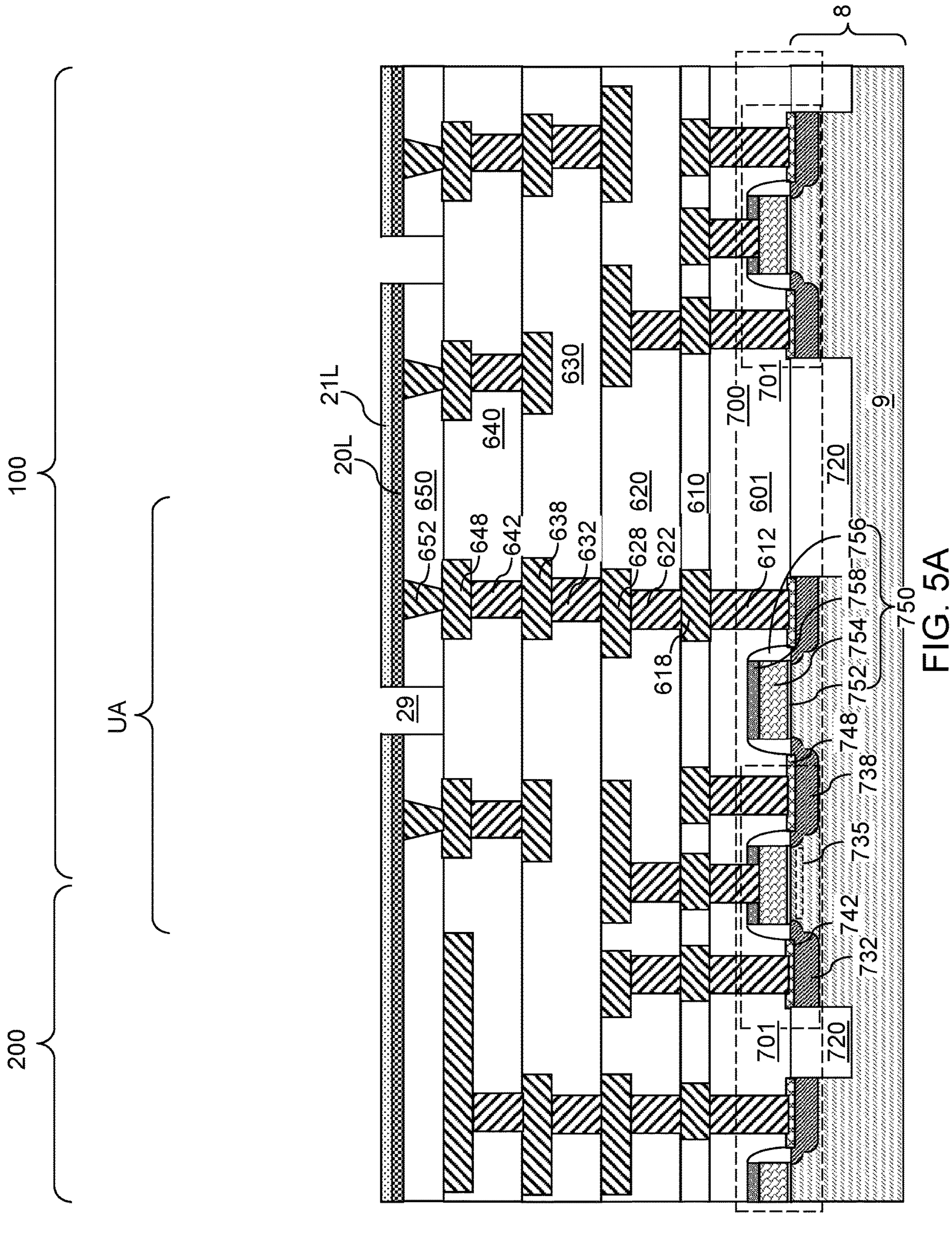
FIG. 5A is a vertical cross-sectional view of the embodiment structure after formation of openings through the hardmask layer, the metallic heater material layer, and the via-level dielectric layer according to an embodiment of the present disclosure.

FIG. 5A is a vertical cross-sectional view of the embodiment structure after formation of openings through the hardmask layer 21L, the metallic heater material layer 20L, and the via-level dielectric layer 650 according to an embodiment of the present disclosure. FIGS. 5B-5J are top-down views of various configurations of the embodiment structure of FIG. 5A. The vertical planes A-A' in FIGS. 5B, 5C, 5E, 5F, and 5I correspond to the cut plane in FIG. 5A.

Referring to FIGS. 5A-5J, an anisotropic etch process may be performed to transfer the pattern of the openings in the patterned etch mask layer 27 through the hardmask layer 21L and the metallic heater material layer 20L. Discrete openings 29 are formed through the hardmask layer 21L, the metallic heater material layer 20L, and the via-level dielectric layer 650. In one embodiment, a top surface segment of an underlying dielectric material layer (such as the fourth interconnect-level dielectric material layer 640) may be physically exposed at the bottom of each opening through the hardmask layer 21L, the metallic heater material layer 20L, and the via-level dielectric layer 650. Generally, a set of at least one discrete opening 29 may be formed within each unit area UA, which corresponds to the area of a single spatial light modulator cell to be subsequently formed. An array of sets of at least one opening may be formed through the hardmask layer 21L and the metallic heater material layer 20L in the array region 100.

An array of discrete openings 29 may be formed through the hardmask layer 21L and the metallic heater material layer 20L in an array region 100. As discussed above, the array region 100 is a region in which an array of spatial light modulator cells is subsequently formed. According to an aspect of the present disclosure, openings are not formed through the metallic heater material layer 20L in the peripheral region 200. Thus, the metallic heater material layer 20L is free of any opening in the peripheral region 200 after formation of the array of openings through the metallic heater material layer 20L.

Figure 5B:
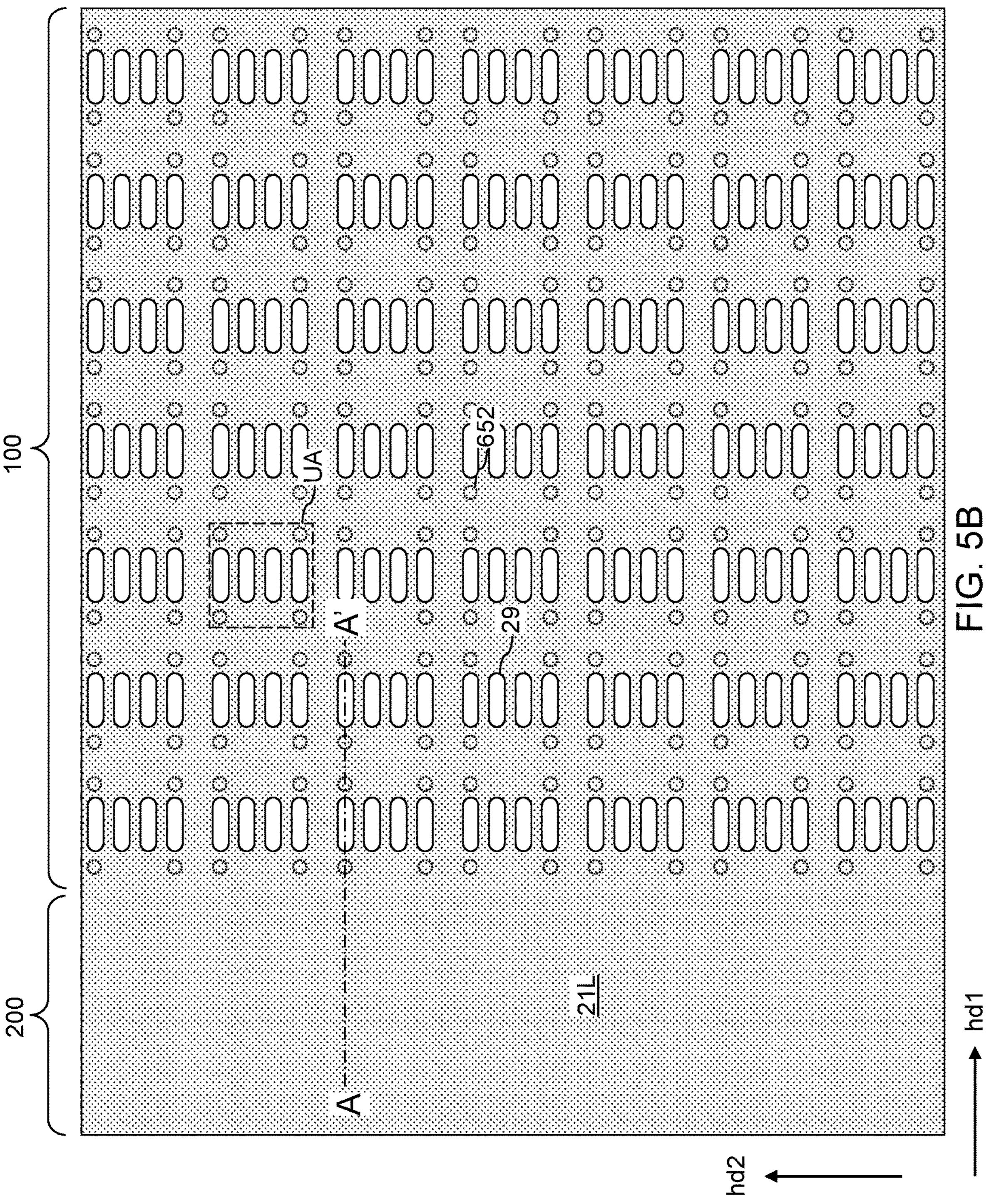
FIGS. 5B-5J are top-down views of various configurations of the embodiment structure of FIG. 5A. The vertical planes A-A' in FIGS. 5B, 5C, 5E, 5F, and 5I correspond to the cut plane in FIG. 5A.
Figure 5C:
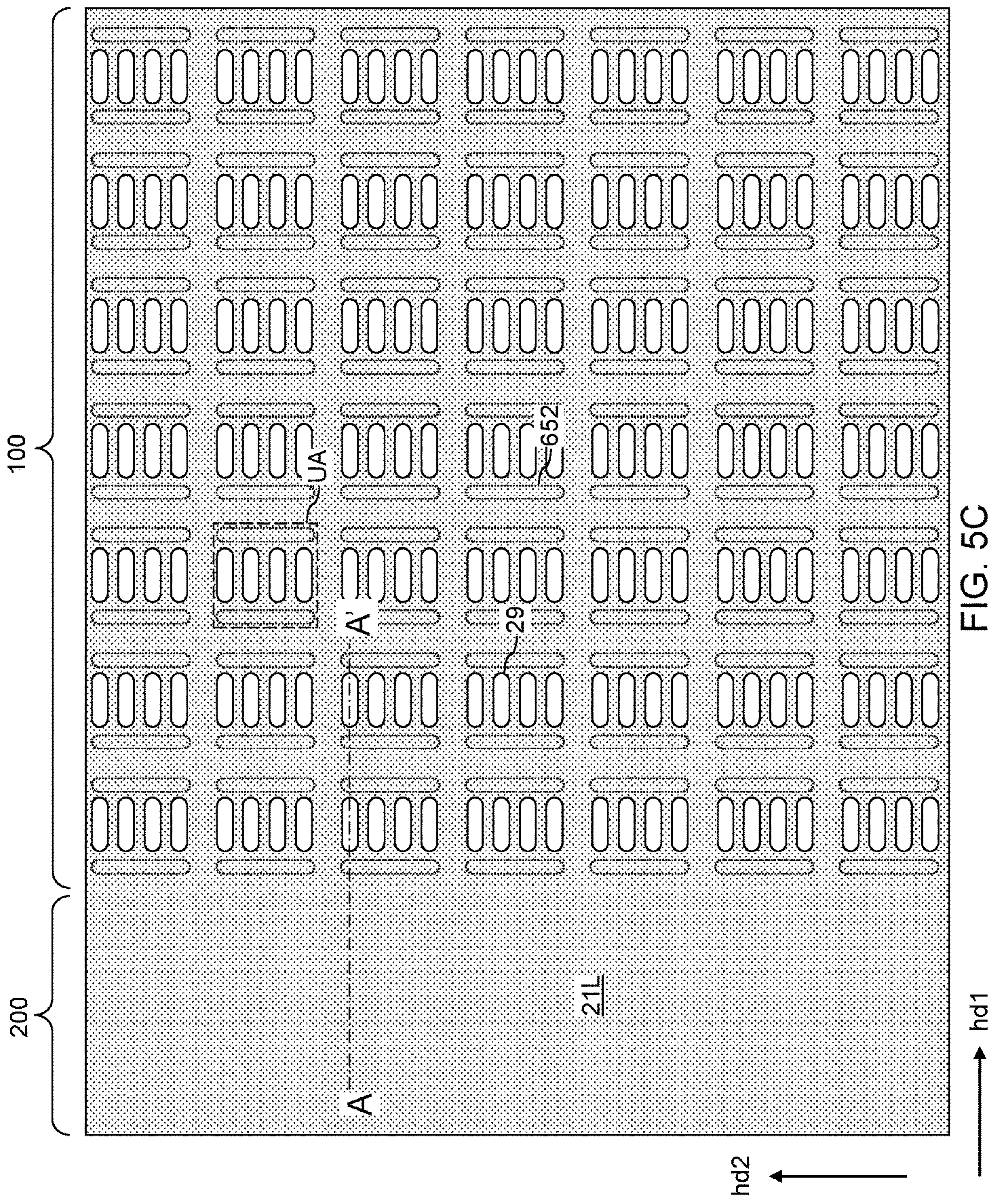
Figure 5D:
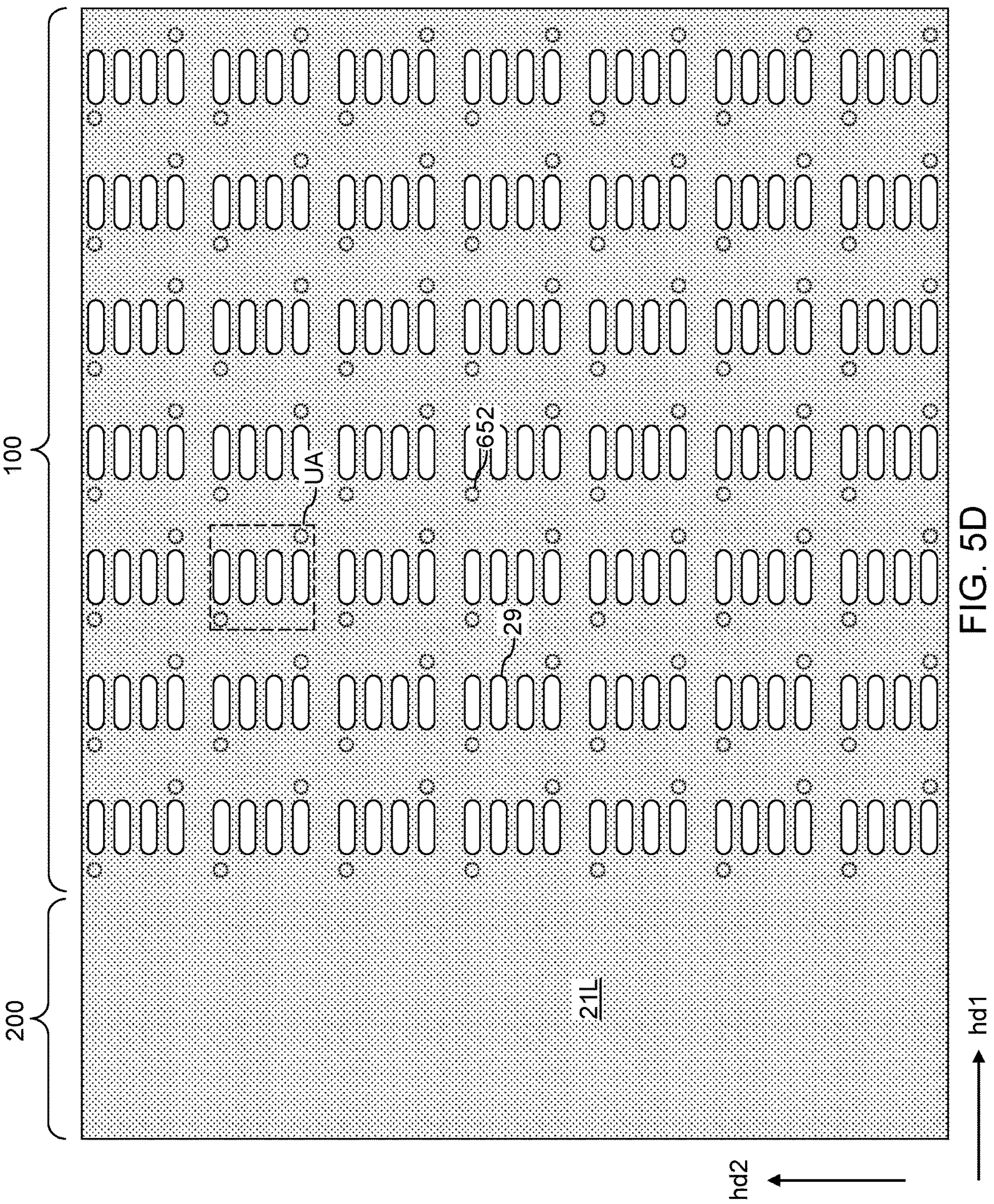
Figure 5E:
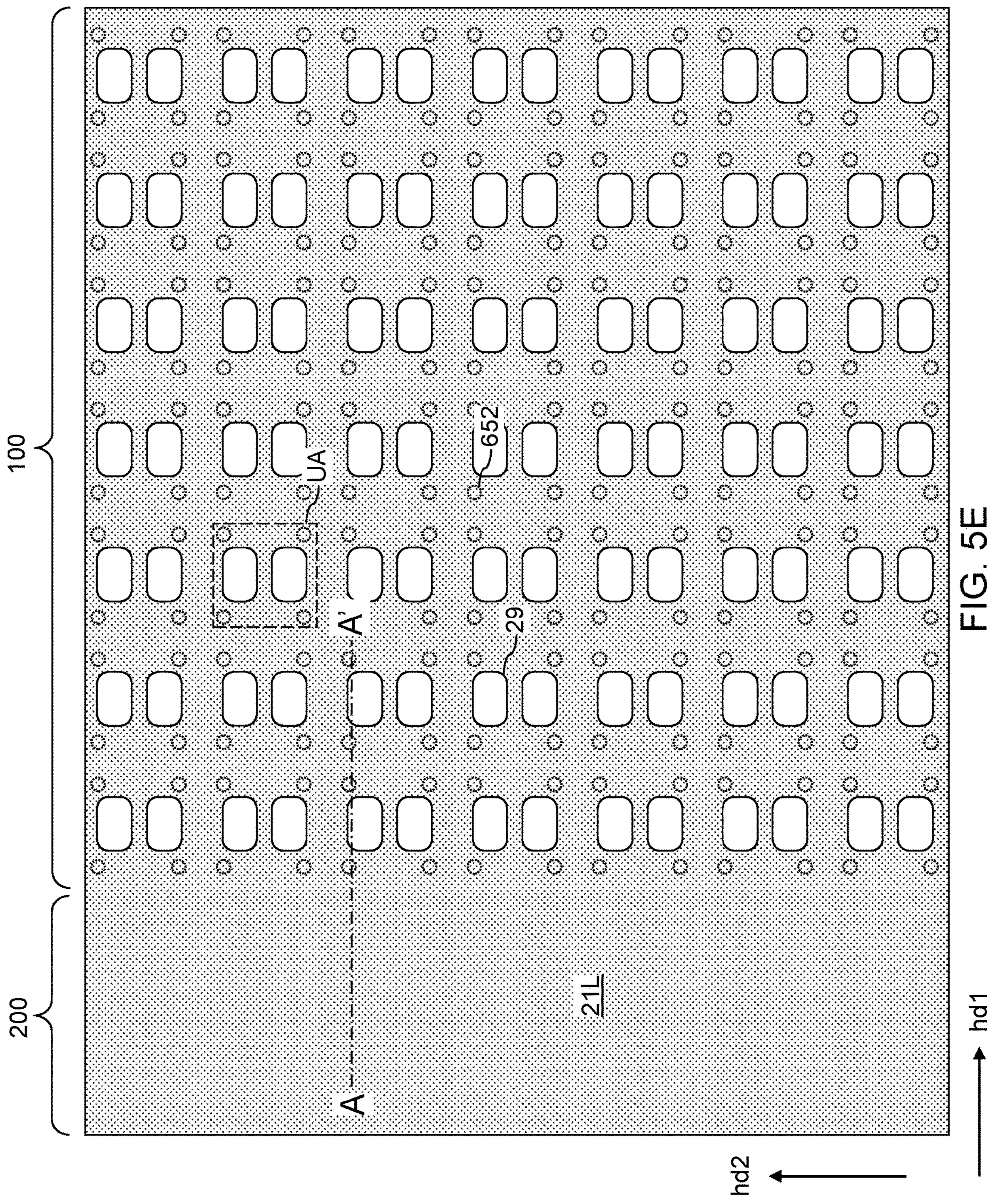
Figure 5F:
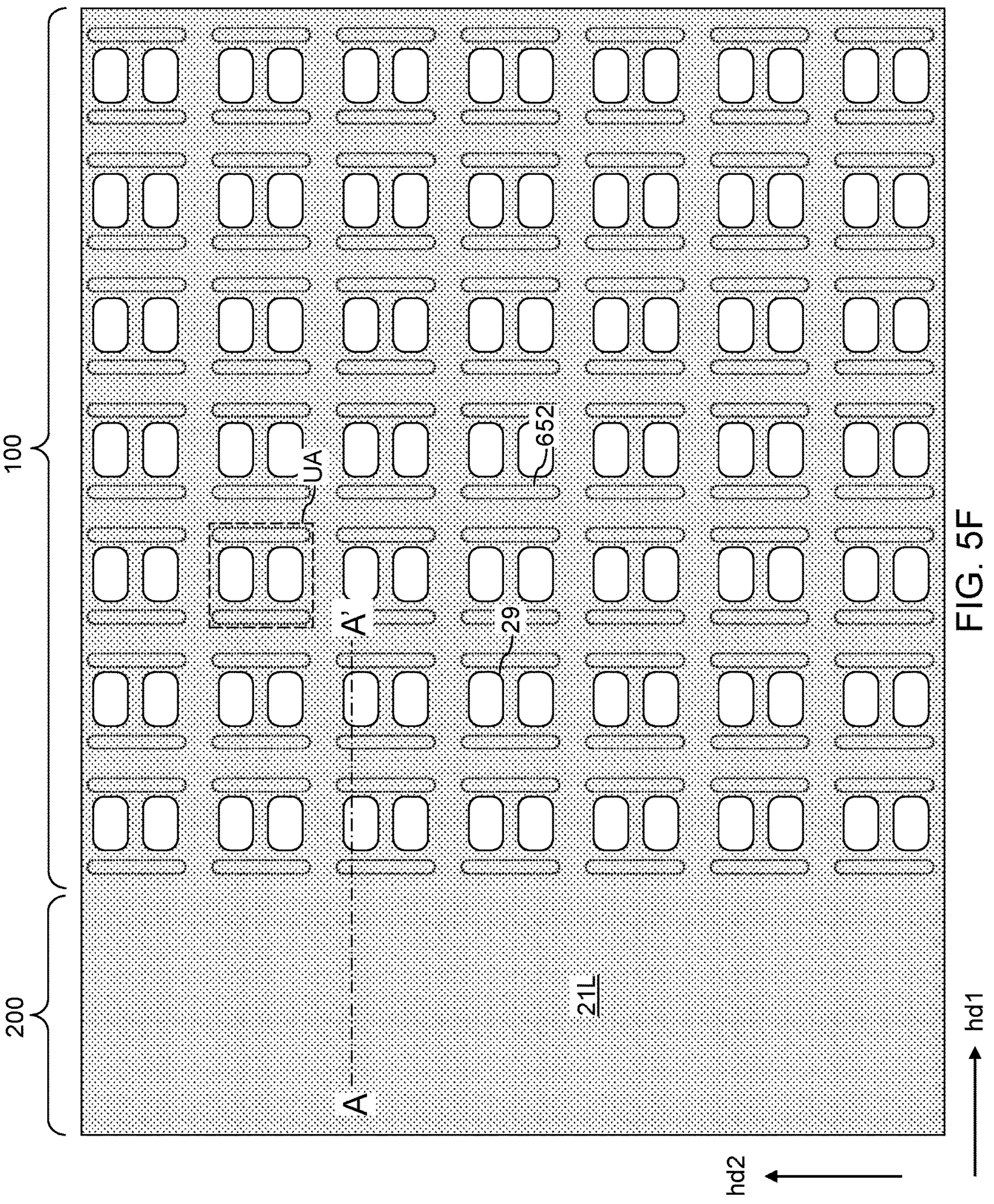
Figure 5G:
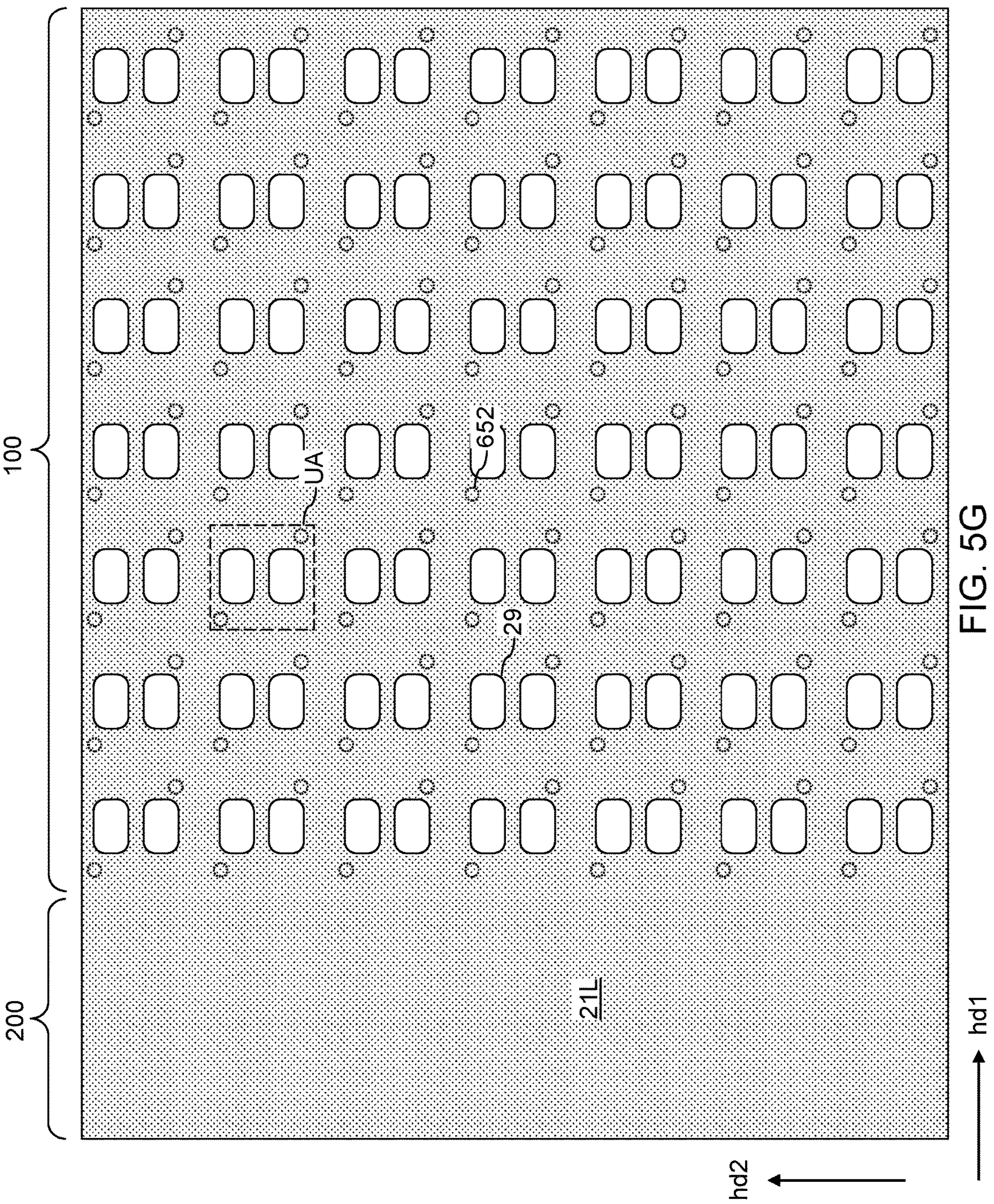
Figure 5H:
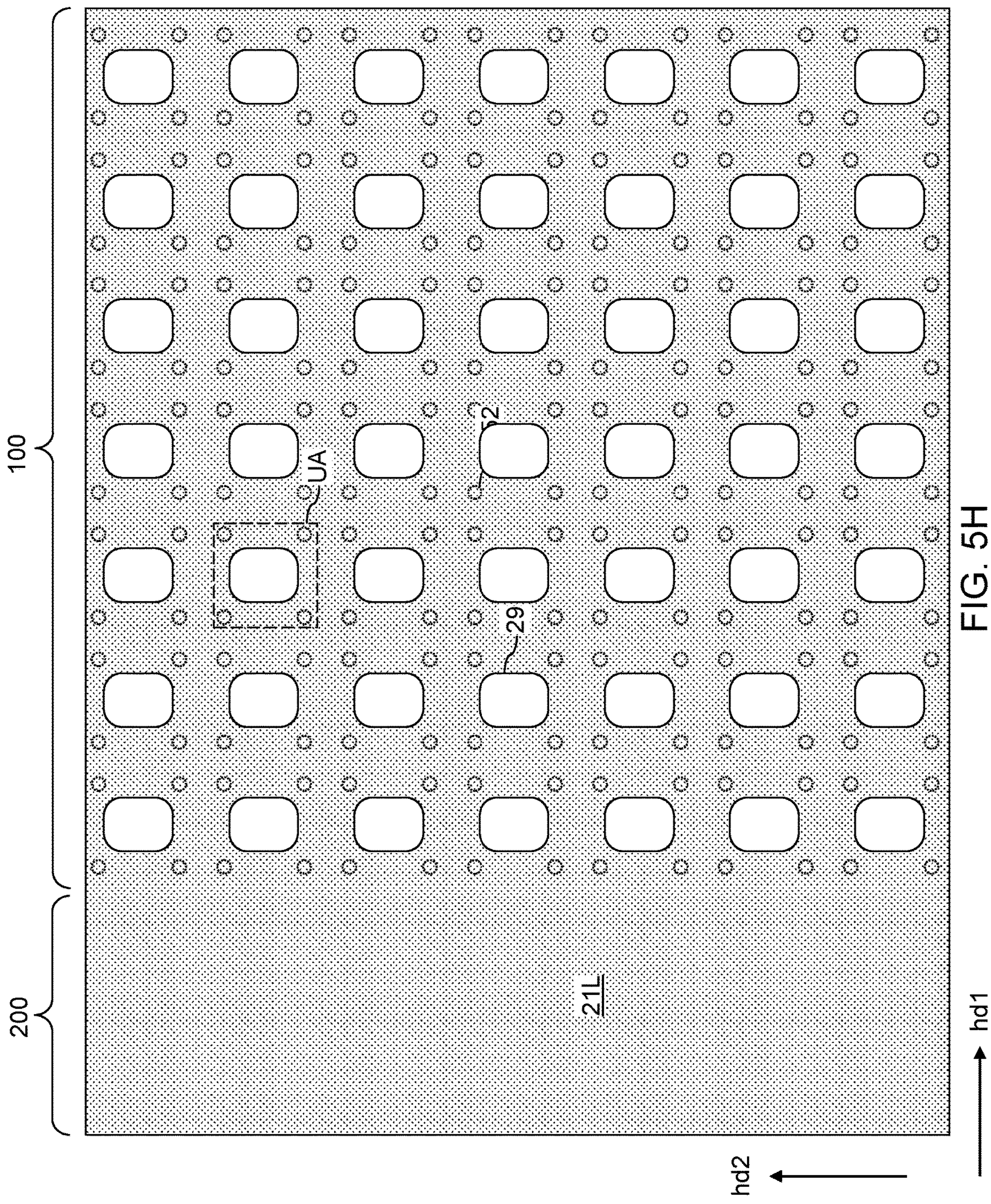
Figure 5I:
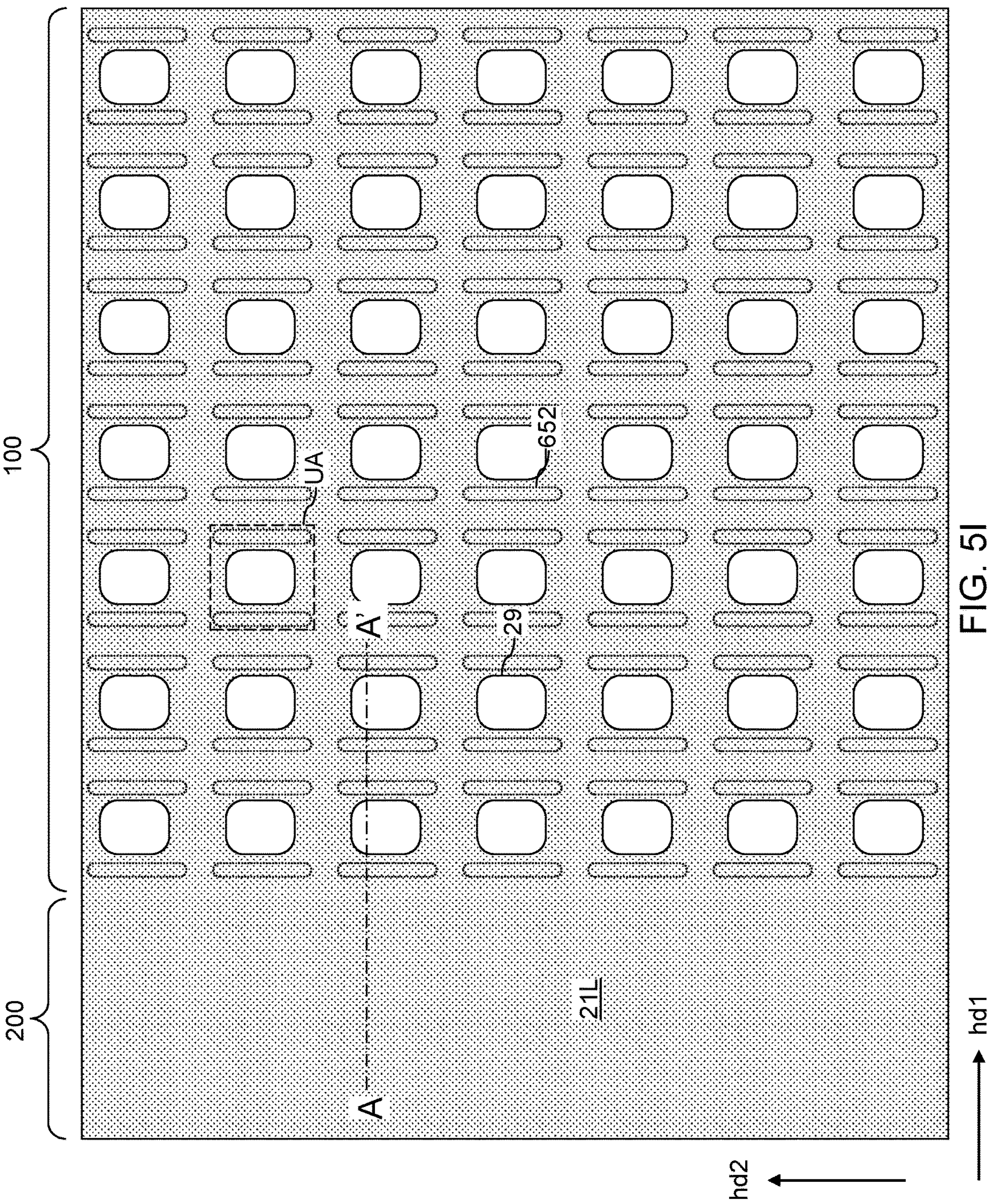
Figure 5J:
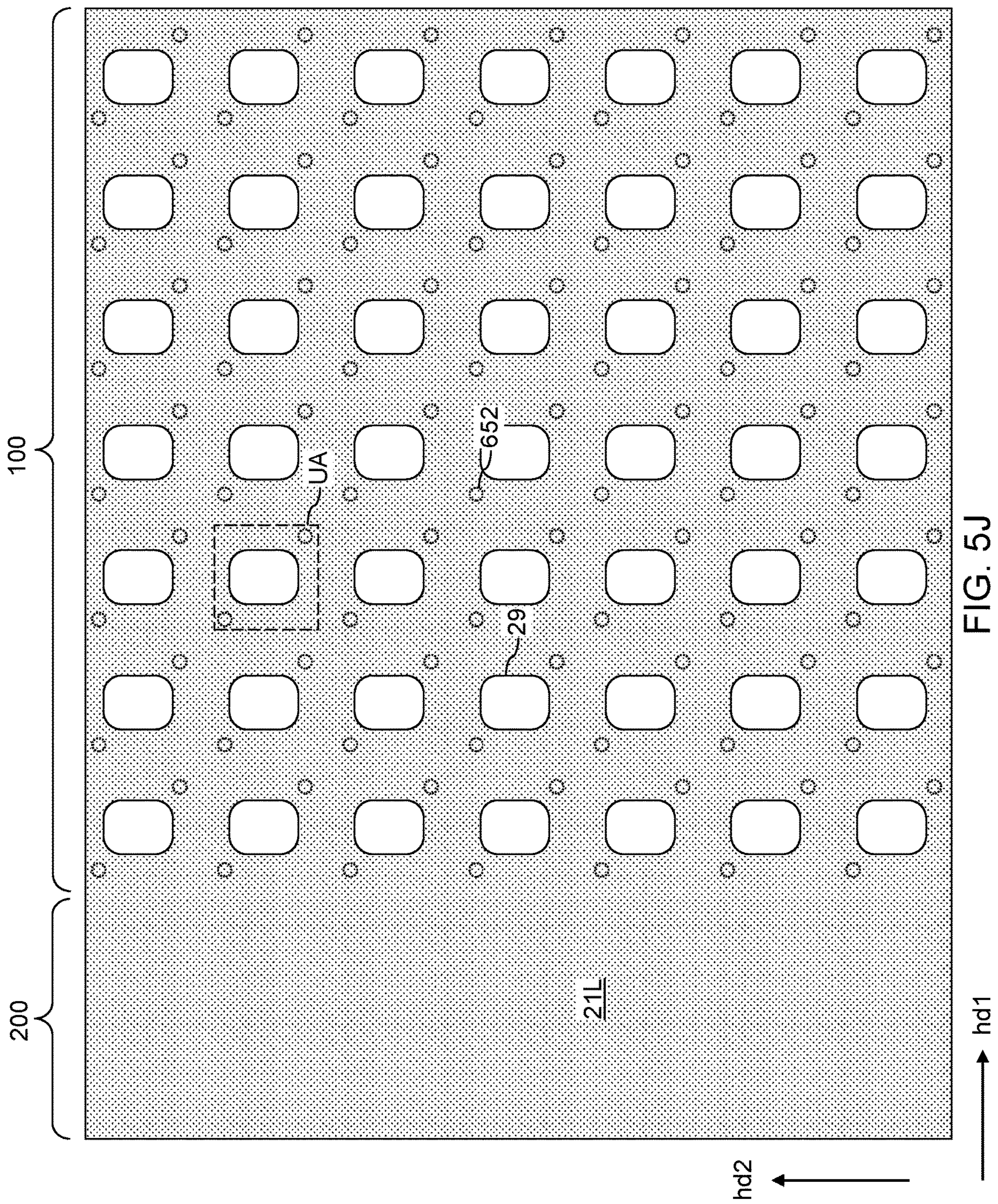

FIGS. 5B, 5E, and 5H correspond to embodiments in which the bottom electrode via structures 652 have a configuration described with reference to FIG. 3B. FIGS. 5C, 5F, and 5I correspond to embodiments in which the bottom electrode via structures 652 have a configuration described with reference to FIG. 3C. FIGS. 5D, 5G, and 5J correspond to embodiments in which the bottom electrode via structures 652 have a configuration described with reference to FIG. 3D. FIGS. 5B, 5C, and 5D correspond to embodiments in which a set of four openings is formed through the hardmask layer 21L and the metallic heater material layer 20L per unit area UA. FIGS. 5E, 5F, and 5G correspond to embodiments in which a set of two openings is formed through the hardmask layer 21L and the metallic heater material layer 20L per unit area UA. FIGS. 5H, 5I, and 5J correspond to embodiments in which a set of one opening is formed through the hardmask layer 21L and the metallic heater material layer 20L per unit area UA. Generally, the openings in each unit area UA may be formed to provide at least one electrically conductive path between a first set of at least one bottom electrode via structure 652 that is used as a first electrode for a metallic heater plate of a spatial light modulator cell and a set of at least another bottom electrode via structure 652 that is used as a second electrode for the metallic heater plate of the spatial light modulator cell. The total number of electrically conductive paths within a unit area may be 1, 2, 3, 4, 5, etc.

Figure 6:
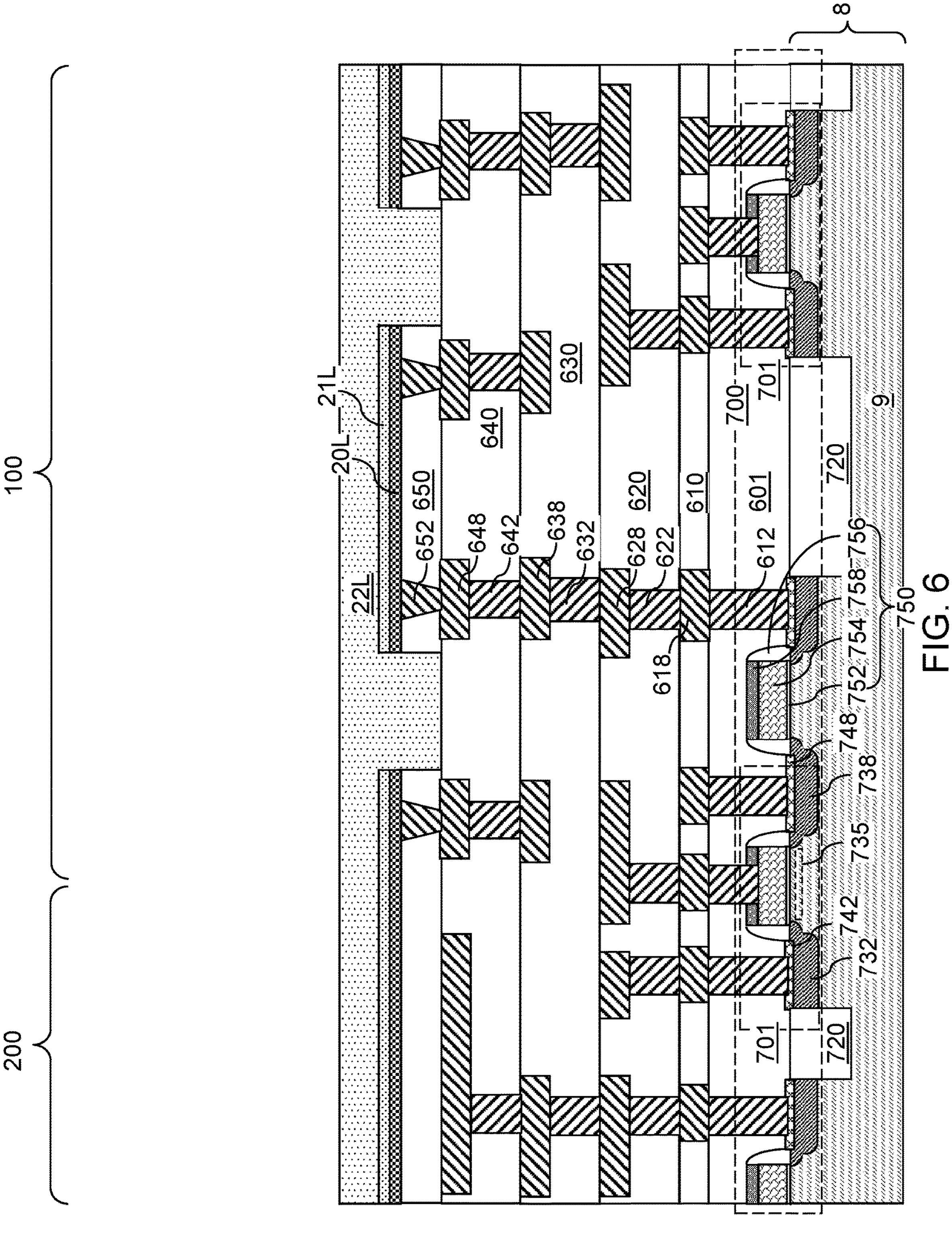
FIG. 6 is a vertical cross-sectional view of the embodiment structure after formation of a dielectric fill material layer according to an embodiment of the present disclosure.

Referring to FIG. 6, a dielectric fill material may be deposited in the openings through the hardmask layer 21L, the metallic heater material layer 20L, and the via-level dielectric layer 650, and over the hardmask layer 21L to form a dielectric fill material layer 22L. The dielectric fill material may comprise undoped silicate glass or a doped silicate glass. The dielectric fill material may be conformally deposited to fill the volumes of the openings. Generally, the thickness of the dielectric fill material layer 22L is greater than one half of the width of each opening in the hardmask layer 21L to form a dielectric fill material layer 22L to ensure that the openings are filled with the dielectric fill material layer 22L.

Figure 7:
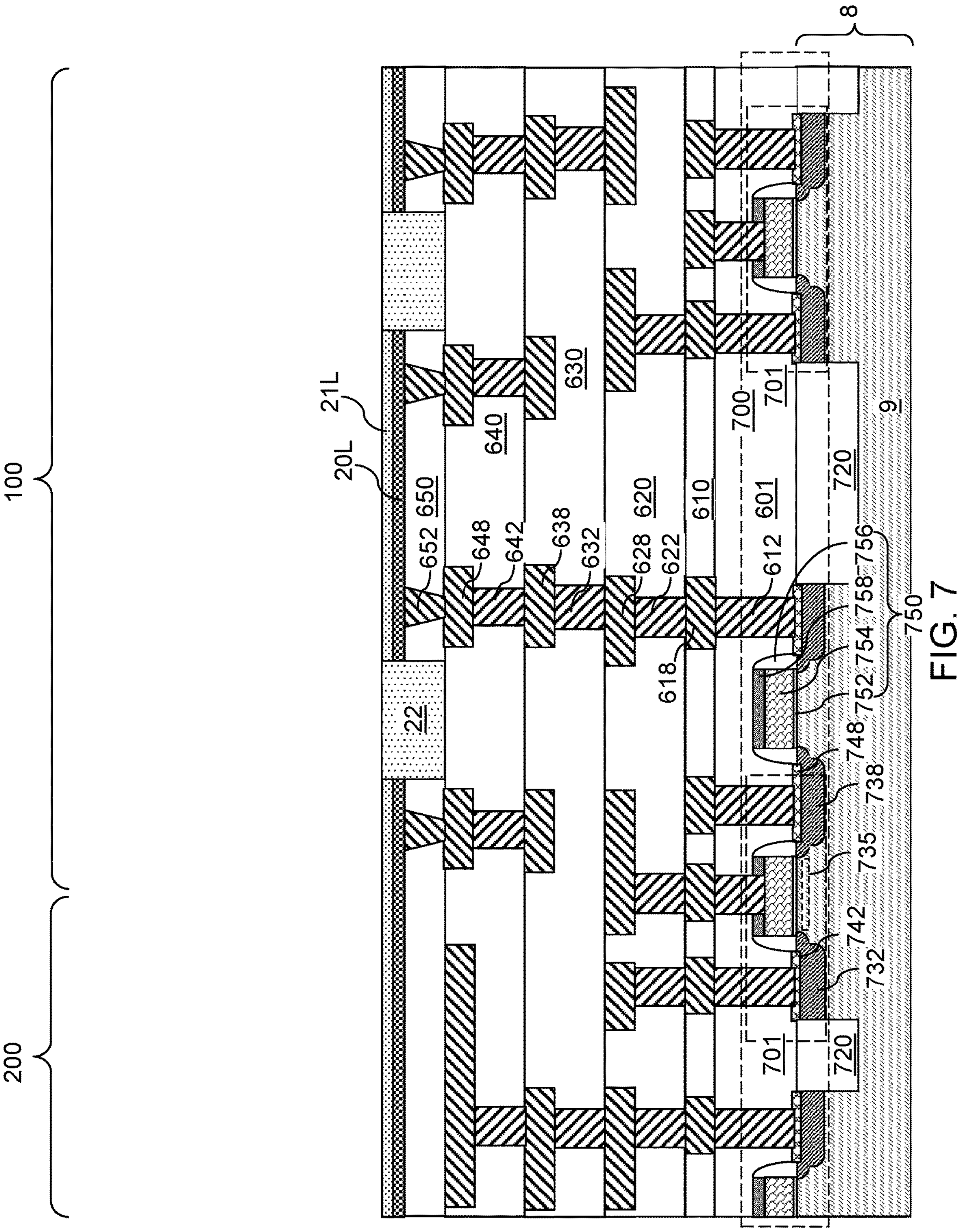
FIG. 7 is a vertical cross-sectional view of the embodiment structure after formation of dielectric pillar structures according to an embodiment of the present disclosure.

Referring to FIG. 7, a planarization process may be performed to remove portions of the dielectric fill material layer 22L that is located above the horizontal plane including the top surface of the hardmask layer 21L. The planarization process may comprise a chemical mechanical polishing process and/or a recess etch process. According to an aspect of the present disclosure, absence of any opening through the metallic heater material layer 20L in the peripheral region 200 may increase the uniformity of the planarization process. For example, the pattern factor of openings, which is defined as the ratio of the area of openings through the hardmask layer 21L and the metallic heater material layer 20L to the total area, may be less than 0.1 in the array region 100, and may be zero in the peripheral region 200. Such low values for the pattern factor enhances uniformity of the planarization process (such as a chemical mechanical polishing process), and avoids dishing of the remaining material portions of the dielectric fill material.

Remaining portions of the dielectric fill material that fills an opening through the hardmask layer 21L, the metallic heater material layer 20L, and the via-level dielectric layer 650 comprise dielectric material portions, which are herein referred to as dielectric pillar structures 22. Each dielectric pillar structure 22 is located within a respective opening through the hardmask layer 21L, the metallic heater material layer 20L, and the via-level dielectric layer 650, and has a straight sidewall that vertically extends from a bottom surface to a top surface. The top surface of each dielectric pillar structure 22 may be formed at, or about, the horizontal plane including the top surface of the hardmask layer 21L. An array of dielectric pillar structures 22 may be formed in the array of openings through the hardmask layer 21L, the metallic heater material layer 20L, and the via-level dielectric layer 650.

In summary, the dielectric pillar structures 22 may be formed in the openings in the metallic heater material layer 20L by depositing a dielectric fill material layer 22L in the openings in the metallic heater material layer 20L and by removing portions of the dielectric fill material layer 22L from above a horizontal plane including a top surface of the metallic heater material layer 20L. In one embodiment, the openings in the metallic heater material layer 20L may vertically extend to a bottom surface of the via-level dielectric layer 650, and the dielectric pillar structures 22 may have sidewalls that vertically extend from the top surface of the metallic heater material layer 20L to the bottom surface of the via-level dielectric layer 650.

Figure 8:
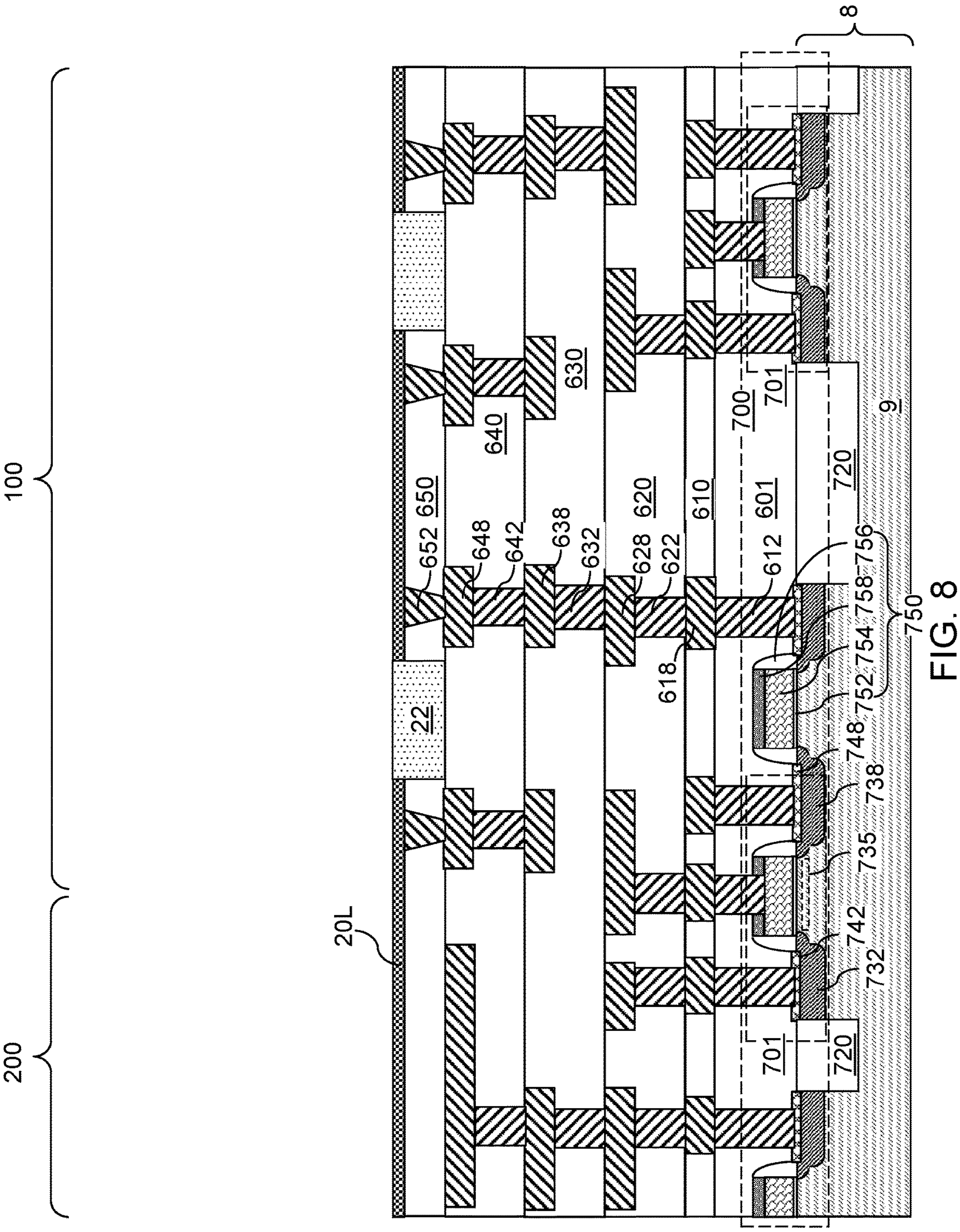
FIG. 8 is a vertical cross-sectional view of the embodiment structure after vertically recessing the dielectric pillar structures and removing the hardmask layer according to an embodiment of the present disclosure.

Referring to FIG. 8, the dielectric pillar structures 22 may be vertically recessed by performing a recess etch process. The recess etch process may comprise an isotropic etch process such as a wet etch process. For example, in embodiments in which the dielectric pillar structures 22 comprise undoped silicate glass, a wet etch process using dilute hydrofluoric acid may be used to vertically recess the top surfaces of the dielectric pillar structures 22. In one embodiment, the top surfaces of the dielectric pillar structures may be formed within, or about, the horizontal plane including the top surface of the metallic heater material layer 20L.

The hardmask layer 21L may be subsequently removed by performing an etch process that etches the material of the hardmask layer 21L selective to the material of the dielectric pillar structures 22. In an illustrative example, in embodiments in which the hardmask layer 21L comprises silicon nitride, a wet etch process using hot phosphoric acid may be used to remove the hardmask layer 21L.

Figure 9:
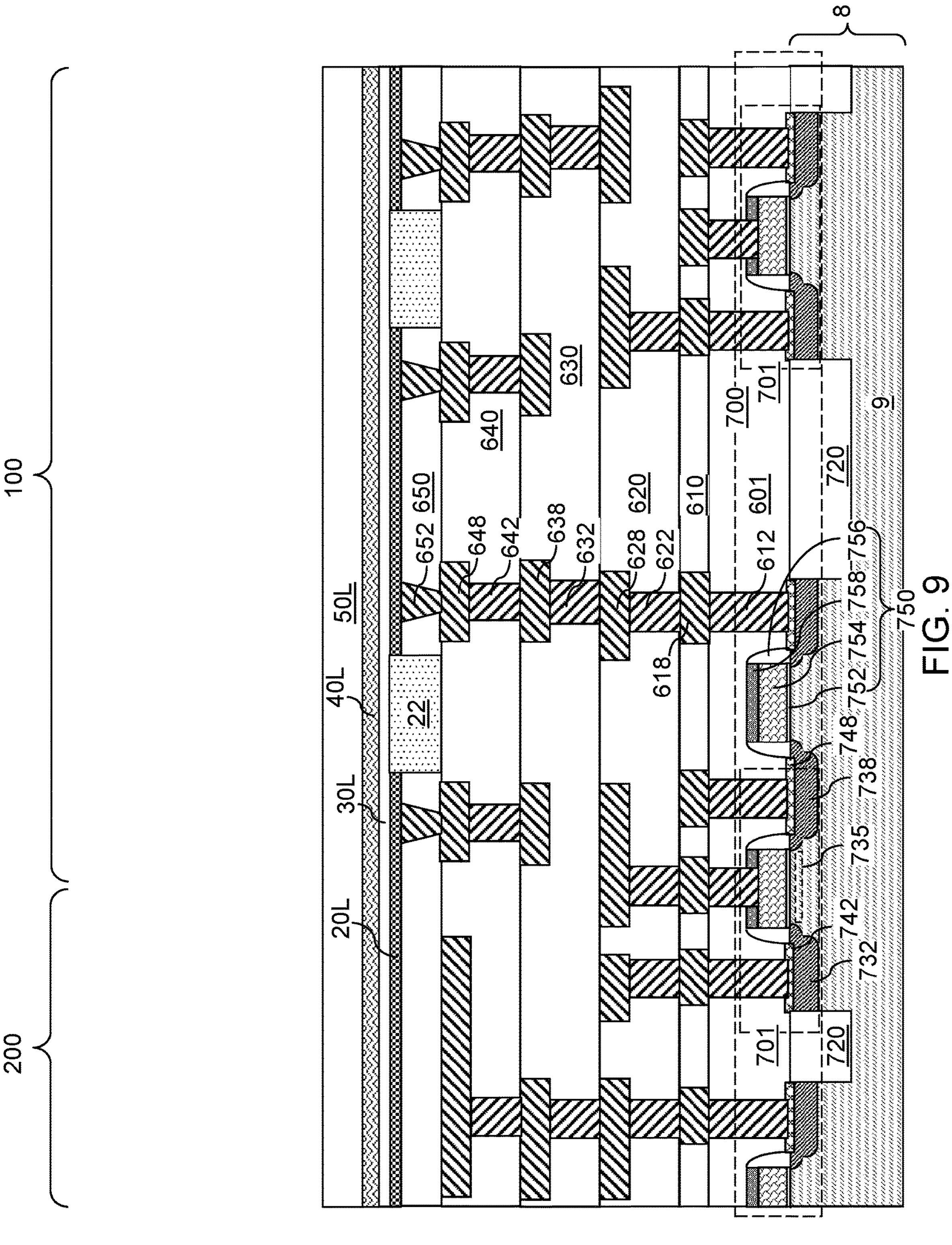
FIG. 9 is a vertical cross-sectional view of the embodiment structure after formation of a spacer dielectric material layer, a phase change material layer, and a capping dielectric material layer according to an embodiment of the present disclosure.

Referring to FIG. 9, a spacer dielectric material layer 30L, a phase change material layer 40L, and a capping dielectric material layer 50L may be sequentially deposited over the metallic heater material layer 20L. The spacer dielectric material layer 30L comprises a dielectric material such as aluminum nitride, undoped silicate glass, a doped silicate glass, silicon nitride, silicon carbide nitride, silicon oxynitride, or a dielectric metal oxide. In one embodiment, the spacer dielectric material layer 30L comprises aluminum nitride, which exhibits high thermal conductivity and low electrical conductivity. The spacer dielectric material layer 30L may have a thickness in a range from 5 nm to 50 nm, such as from 10 nm to 30 nm, although lesser and greater thicknesses may also be used.

The phase change material layer 40L including a phase change material may be deposited over the spacer dielectric material layer 30L. As used herein, a "phase change material" refers to a material having at least two different phases providing different resistivity. A phase change material (PCM) may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state and having a first refractive index. In embodiments in which slow cooling occurs, the phase change material may cool into a crystalline low resistivity state having a second refractive index. According to an aspect of the present disclosure, the phase change material in the phase change material layer 40L is selected such that the second refractive index is different from the first refractive index.

Exemplary phase change materials include, but are not limited to, germanium antimony telluride (GST) compounds such as $Ge_2Sb_2Te_5$ or $GeSb_2Te_4$, antimony sulfide ($Sb_2S_3$), germanium indium antimony telluride compounds, germanium telluride compounds, germanium antimony compounds, indium germanium telluride compounds, aluminum selenium telluride compounds, indium selenium telluride compounds, and aluminum indium selenium telluride compounds. The phase change material may be doped (e.g., nitrogen doped GST) or undoped to enhance resistance-switching characteristics. The thickness of the phase change material layer 40L (which is also referred to as a PCM material layer 40L) may be in a range from 30 nm to 600 nm, such as from 60 nm to 300 nm, although lesser and greater thicknesses may also be used.

Generally, the thickness of the phase change material layer 40L may be selected such that a first reflected light from a top surface of the phase change material layer and from an interface between the phase change material layer 40L and the spacer dielectric material layer 30L interfere constructively in one of the amorphous state and the crystalline state of the phase change material, and interfere destructively in another of the amorphous state and the crystalline state at the wavelength of an optical beam that is used to sense the data in an array of spatial light modulation cells to be subsequently formed.

The capping dielectric material layer 50L comprises a dielectric material such as silicon oxide, silicon nitride, silicon oxynitride, silicon carbide nitride, or a dielectric metal oxide. The thickness of the capping dielectric material layer 50L may be in a range from 50 nm to 600 nm, such as from 100 nm to 300 nm, although lesser and greater thicknesses may also be used.

Figure 10:
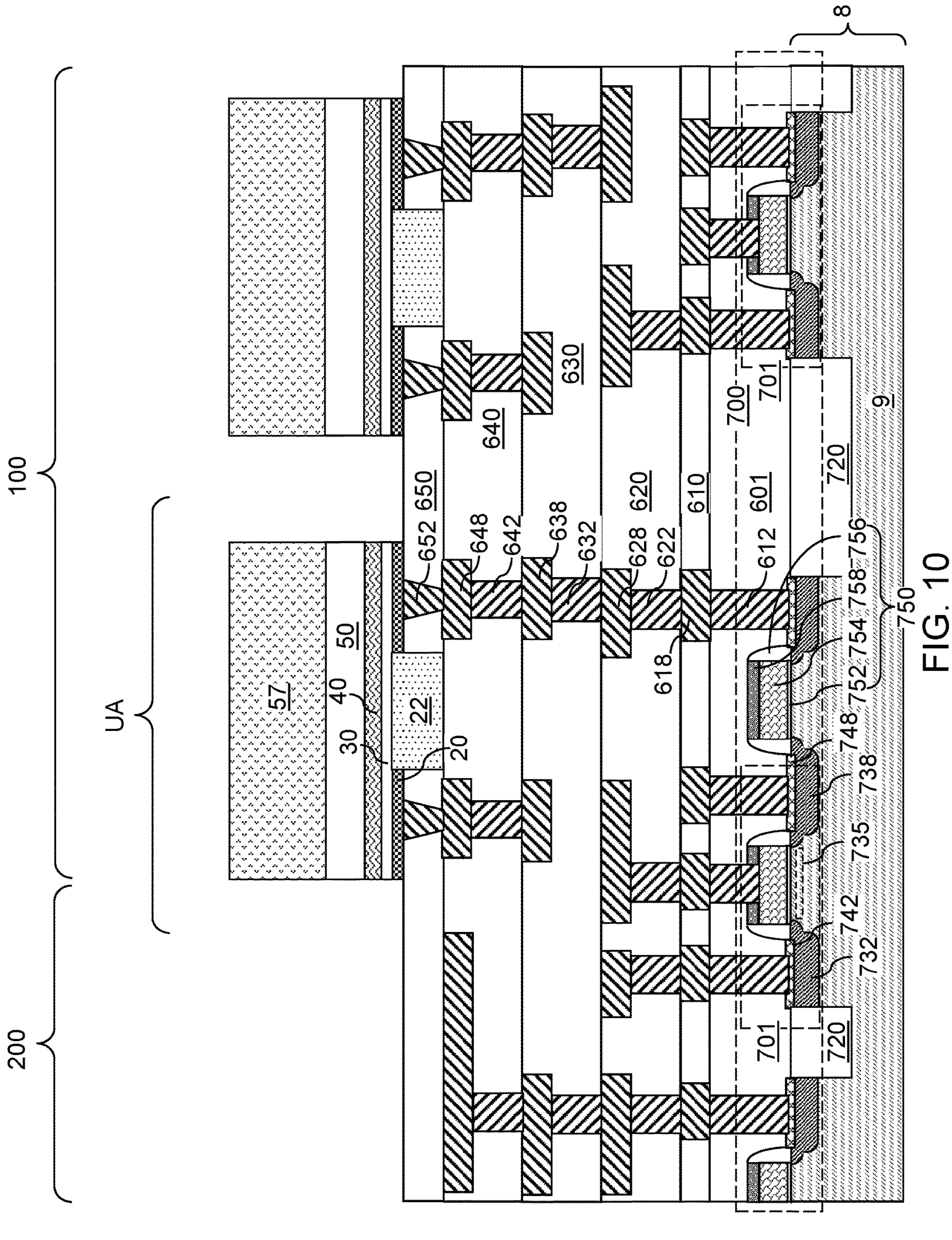
FIG. 10 is a vertical cross-sectional view of the embodiment structure after patterning a set of layers including the capping dielectric material layer, the phase change material layer, the spacer dielectric material layer, and the metallic heater material layer into layer stacks of a metallic heater plate, a spacer dielectric material plate, a phase change material plate, and a capping dielectric material plate according to an embodiment of the present disclosure.

Referring to FIG. 10, a patterned etch mask layer 57 may be formed over the set of layers including the capping dielectric material layer 50L, the phase change material layer 40L, the spacer dielectric material layer 30L, and the metallic heater material layer 20L. For example, a photoresist layer may be applied over the set of layers including the capping dielectric material layer 50L, the phase change material layer 40L, the spacer dielectric material layer 30L, and the metallic heater material layer 20L, and may be lithographically patterned into the patterned etch mask layer 57. In this embodiment, the patterned etch mask layer 57 may comprise a two-dimensional array of patterned photoresist material portions each having a respective area that corresponds to the area of a phase change material plate 40 to be patterned out of the phase change material layer 40L.

In one embodiment, the pattern of the two-dimensional array of patterned photoresist material portions may comprise a pattern of a two-dimensional periodic array of unit shapes. Each unit shape may be formed entirely within a respective unit area UA. The unit shape may be a rectangular shape, a shape of a rounded rectangle, a circular shape, or any other two-dimensional shape having a closed periphery. In an illustrative example, each unit shape may be a rectangular shape having a length in a range from 200 nm to 500 nm and having a width in a range from 200 nm to 500 nm, and each gap between neighboring pairs of unit shapes may be in a range from 50 nm to 100 nm, although lesser and greater dimensions may also be used for the length, the width, and the gap.

The pattern in the patterned etch mask layer 57 may be transferred through the set of layers including the capping dielectric material layer 50L, the phase change material layer 40L, the spacer dielectric material layer 30L, and the metallic heater material layer 20L by performing at least one anisotropic etch process, which may comprise a sequence of anisotropic etch processes that etches, in order, unmasked portions of the capping dielectric material layer 50L, the phase change material layer 40L, the spacer dielectric material layer 30L, and the metallic heater material layer 20L. Generally, the set of material layers (20L, 30L, 40L, 50L) may be patterned into an array of layer stacks (20, 30, 40, 50) by performing at least one anisotropic etch process that transfers a pattern in a patterned etch mask layer 57 through each layer within the set of material layers (20L, 30L, 40L, 50L).

Each patterned portion of the capping dielectric material layer 50L, the phase change material layer 40L, the spacer dielectric material layer 30L, and the metallic heater material layer 20L comprises a layer stack (20, 30, 40, 50) of a metallic heater plate 20, a spacer dielectric material plate 30, a phase change material plate 40, and a capping dielectric material plate 50. Each capping dielectric material plate 50 is a patterned portion of the capping dielectric material layer 50L. Each phase change material plate 40 is a patterned portion of the phase change material layer 40L. Each spacer dielectric material plate 30 is a patterned portion of the spacer dielectric material layer 30L. Each metallic heater plate 20 is a patterned portion of the metallic heater material layer 20L. A top surface of the via-level dielectric layer 650 is exposed after the at least one anisotropic etch process. The terminal anisotropic etch process selected from the at least one anisotropic etch process may have an etch chemistry that etches the spacer dielectric material layer 30L selective to the material of the via-level dielectric layer 650. In this embodiment, collateral recessing of the top surface of the via-level dielectric layer 650 may be minimal or zero.

Physically exposed sidewalls of each element within each layer stack (20, 30, 40, 50) of a metallic heater plate 20, a spacer dielectric material plate 30, a phase change material plate 40, and a capping dielectric material plate 50 may be vertically coincident to one another. As used herein, two or more surfaces are "vertically coincident" in instances in which the two or more surfaces overlie or underlie each other or one another and in instances in which a vertical plane exists which contains each of the two or more surfaces. In this embodiment, each outer sidewall of a metallic heater plate 20 may be vertically coincident with an overlying sidewall of the spacer dielectric material plate 30, an overlying sidewall of the phase change material plate 40, and an overlying sidewall of the capping dielectric material plate 50 within each of the layer stacks (20, 30, 40, 50).

Generally, a patterned etch mask layer 57 including an array of etch mask material portions can be formed over a set of material layers (30L, 40L, 50L) including the capping dielectric material layer 50L, the phase change material layer 40L, and the spacer dielectric material layer 30L and over the metallic heater material layer 20L, and at least one anisotropic etch process can be performed to transfer a pattern in the patterned etch mask layer 57 through each layer within the set of material layers (30L, 40L, 50L) and through the metallic heater material layer 20L.

Figure 11A:
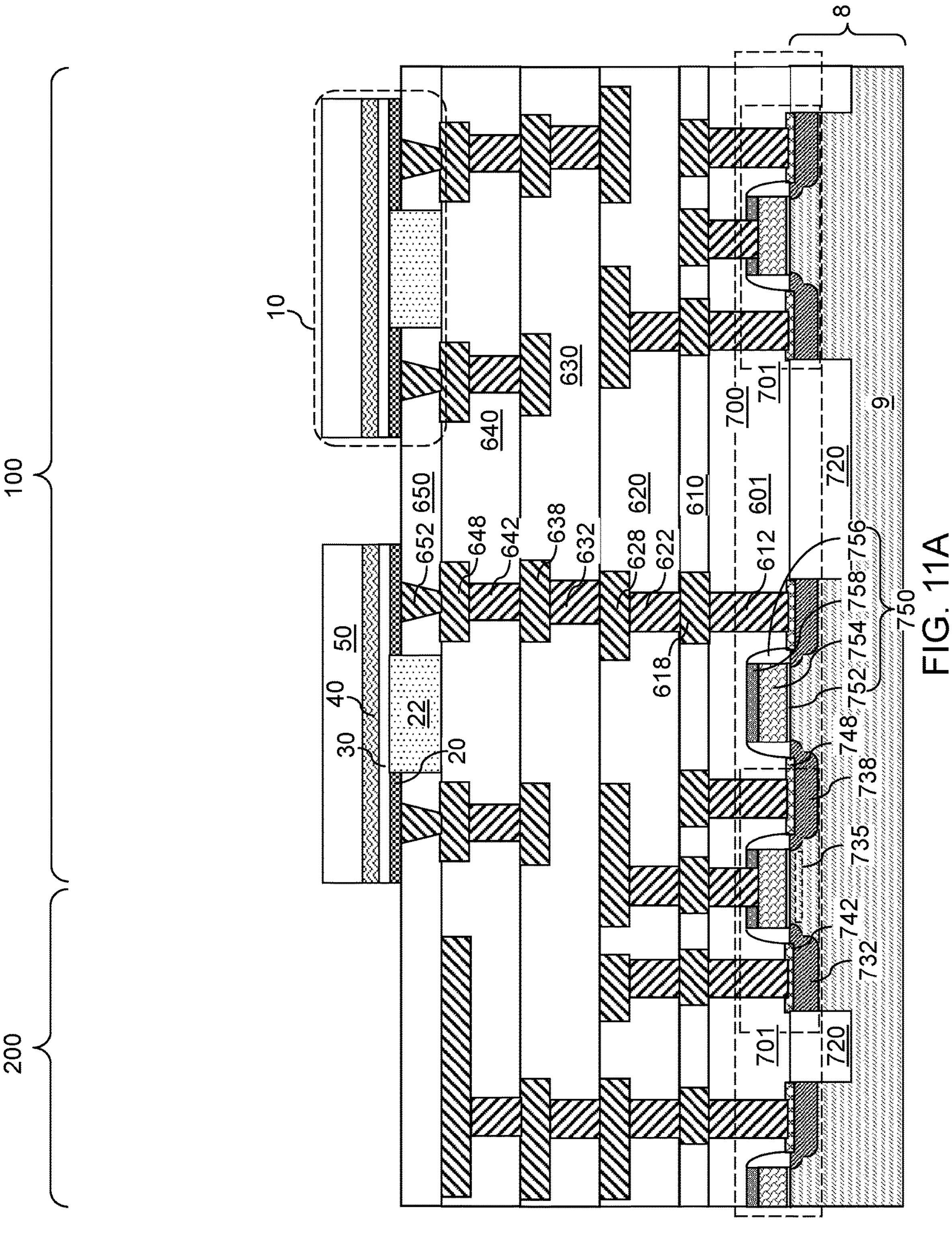
FIG. 11A is a vertical cross-sectional view of the embodiment structure after removal of a patterned photoresist layer according to an embodiment of the present disclosure.

Referring to FIGS. 11A-11J, the patterned etch mask layer 57 may be removed, for example, by ashing. FIG. 11A is a vertical cross-sectional view of the embodiment structure after removal of a patterned photoresist layer according to an embodiment of the present disclosure. FIGS. 11B-11J are top-down views of various configurations of the embodiment structure of FIG. 11A. The vertical planes A-A' in FIGS. 11B, 11C, 11E, 11F, and 11I correspond to the cut plane in FIG. 11A.

An array of spatial light modulator cells 10 may be formed over the via-level dielectric layer 650. Each of the spatial light modulator cells 10 comprises a layer stack (20, 30, 40, 50) comprising a phase change material plate 40, a spacer dielectric material plate 30 that underlies the phase change material plate 40, and a metallic heater plate 20 underlying the spacer dielectric material plate 30 and comprising outer sidewalls. Further, each of the spatial light modulator cells comprises a pair of bottom electrode via structures 652 contacting a respective surface segment of a bottom surface of the metallic heater plate 20. In addition, each of the spatial light modulator cells 10 comprises at least one dielectric pillar structure 22 located in a respective opening through the metallic heater plate 20 and through an underlying portion of the via-level dielectric layer 650. In one embodiment, each of the at least one dielectric pillar structure 22 is located entirely within an area defined by outer sidewalls of the metallic heater plate 20.

Within each layer stack (20, 30, 40, 50), each of the outer sidewalls of the metallic heater plate 20 is vertically coincident with a respective sidewall of the spacer dielectric material plate 30 and with a respective sidewall of the phase change material plate 40. In one embodiment, each layer stack (20, 30, 40, 50) comprises a capping dielectric material plate 50 that overlies the phase change material plate 40. In one embodiment, each sidewall of the capping dielectric material plate 50 is vertically coincident with a respective outer sidewall to the outer sidewalls of the metallic heater plate 20.

In one embodiment, each of the at least one dielectric pillar structure 22 comprises a top surface that contacts a bottom surface of the spacer dielectric material plate 30. In one embodiment, the pair of bottom electrode via structures 652 underneath each layer stack (20, 30, 40, 50) is formed within a via-level dielectric layer 650, and the at least one dielectric pillar structure 22 underneath each layer stack (20, 30, 40, 50) comprises a bottom surface that contacts a top surface of a dielectric material layer (such as the fourth interconnect-level dielectric material layer 640) that underlies the via-level dielectric layer 650.

Generally, each of the at least one dielectric pillar structure 22 comprises a top surface that contacts a bottom surface of the spacer dielectric material plate 30 and has a thickness that is not less than a thickness of the metallic heater plate 20. In one embodiment, the thickness of the at least one dielectric pillar structure 22 may be the same as the sum of the thickness of a metallic heater plate 20 and the thickness of the via-level dielectric layer 650.

Figure 11B:
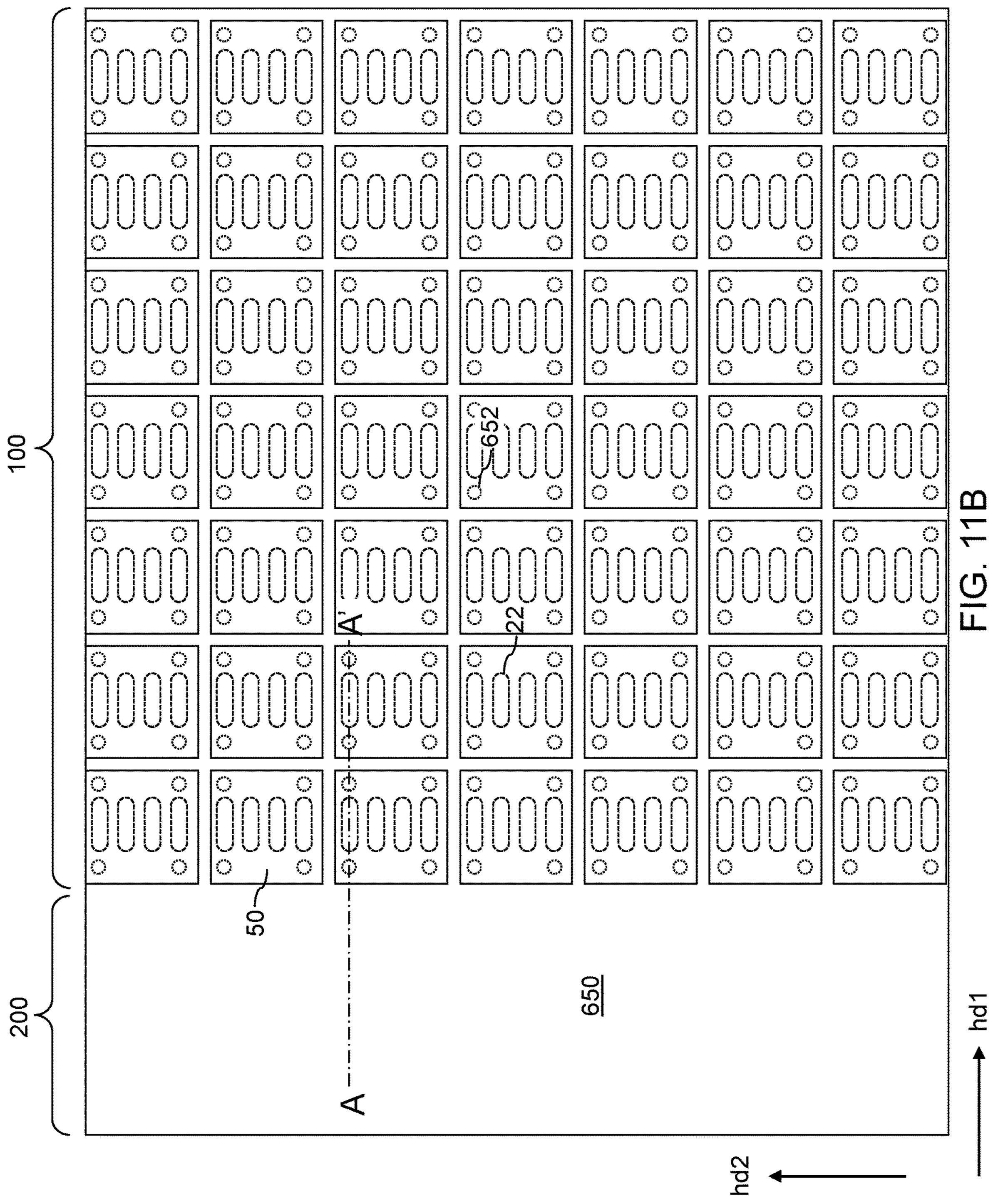
FIGS. 11B-11J are top-down views of various configurations of the embodiment structure of FIG. 11A. The vertical planes A-A' in FIGS. 11B, 11C, 11E, 11F, and 11I correspond to the cut plane in FIG. 11A.
Figure 11C:
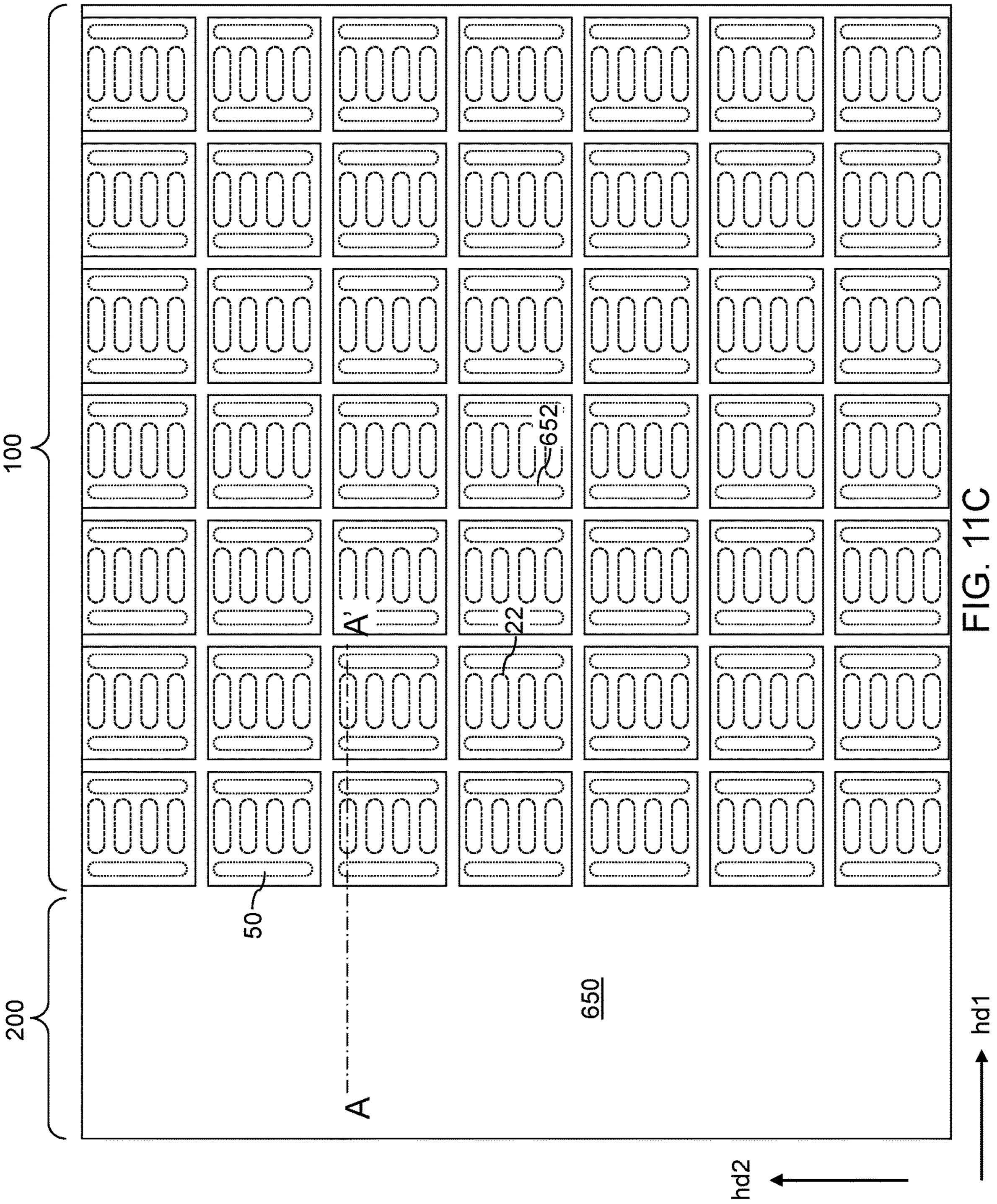
Figure 11D:
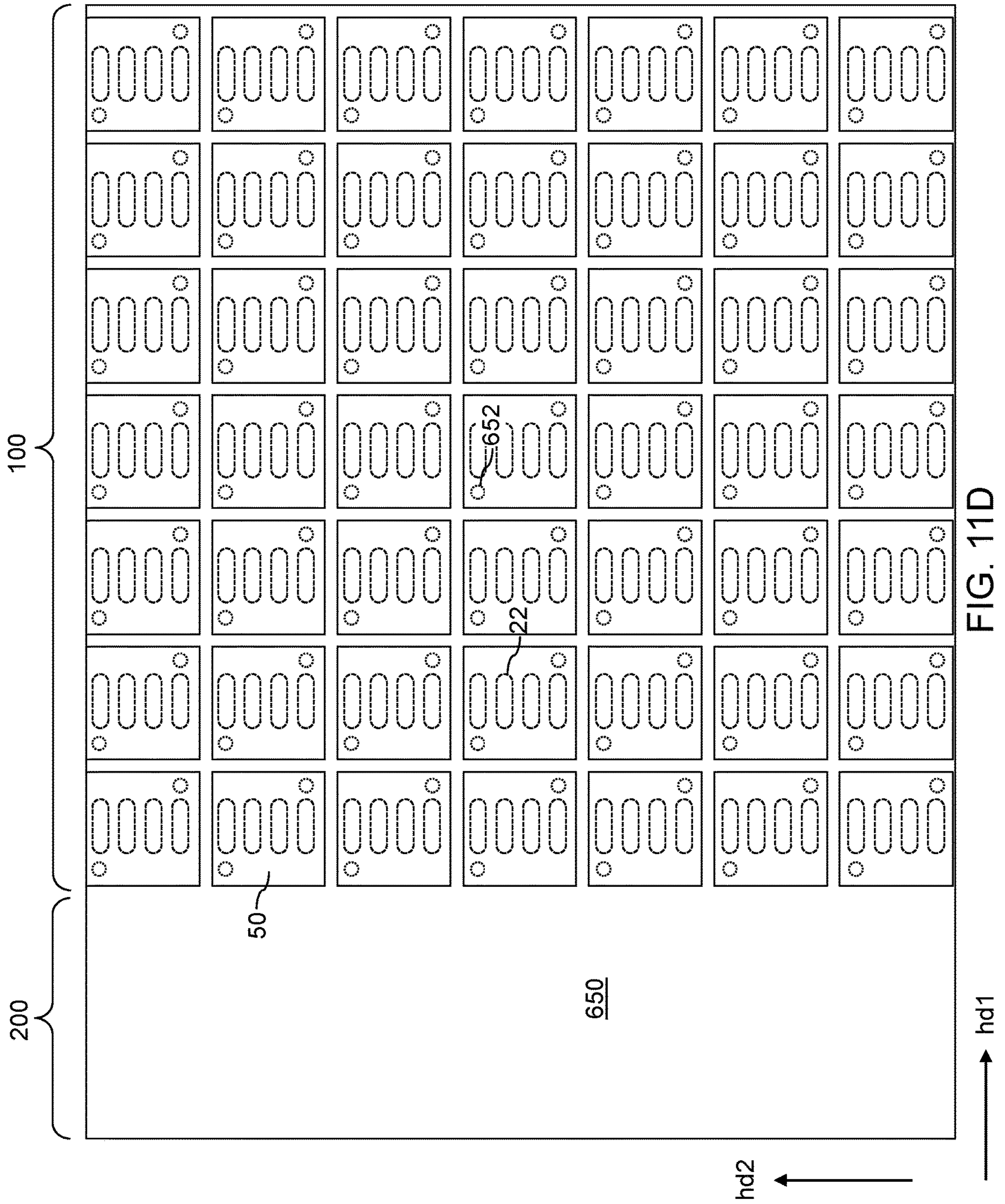
Figure 11E:
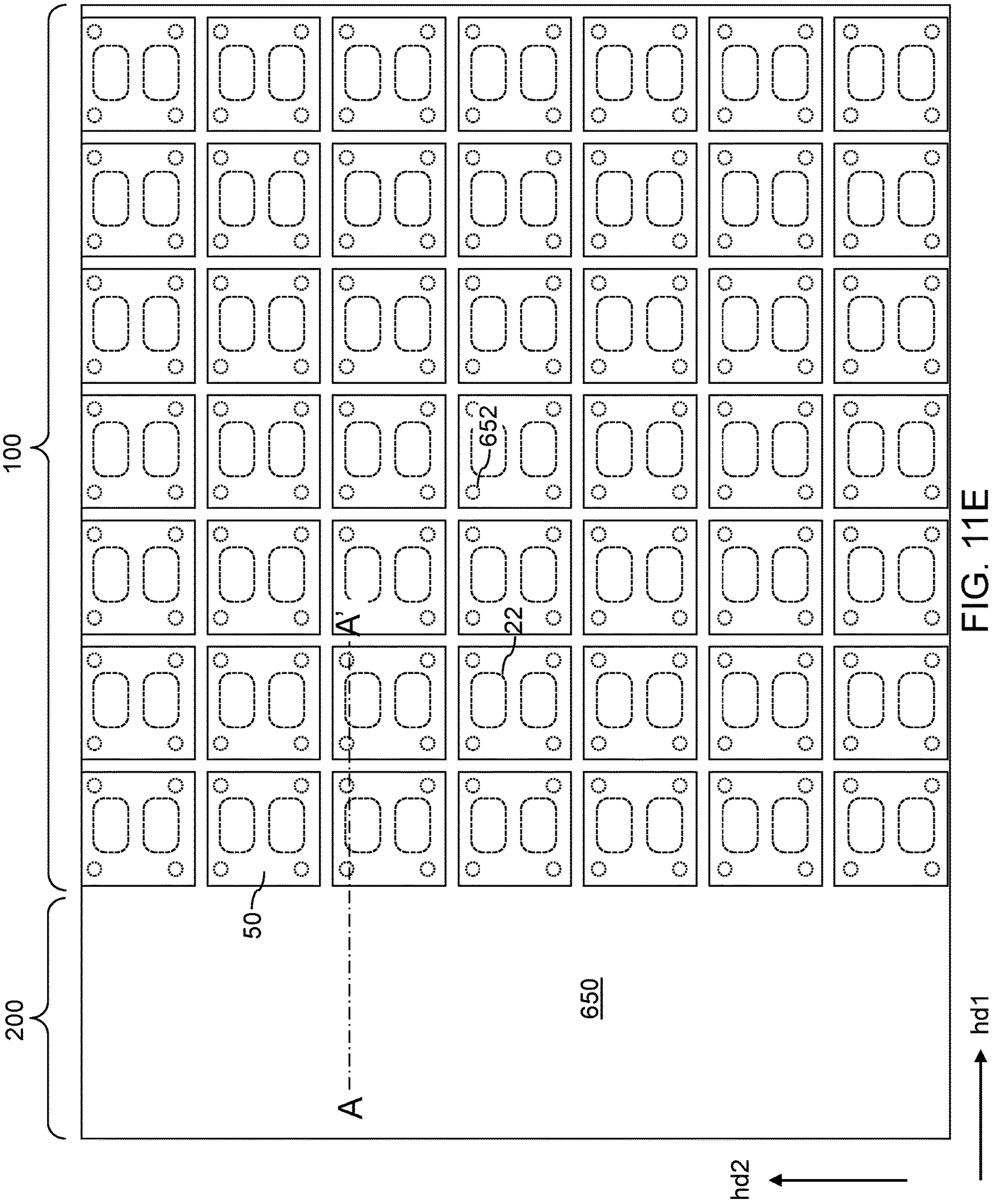
Figure 11F:
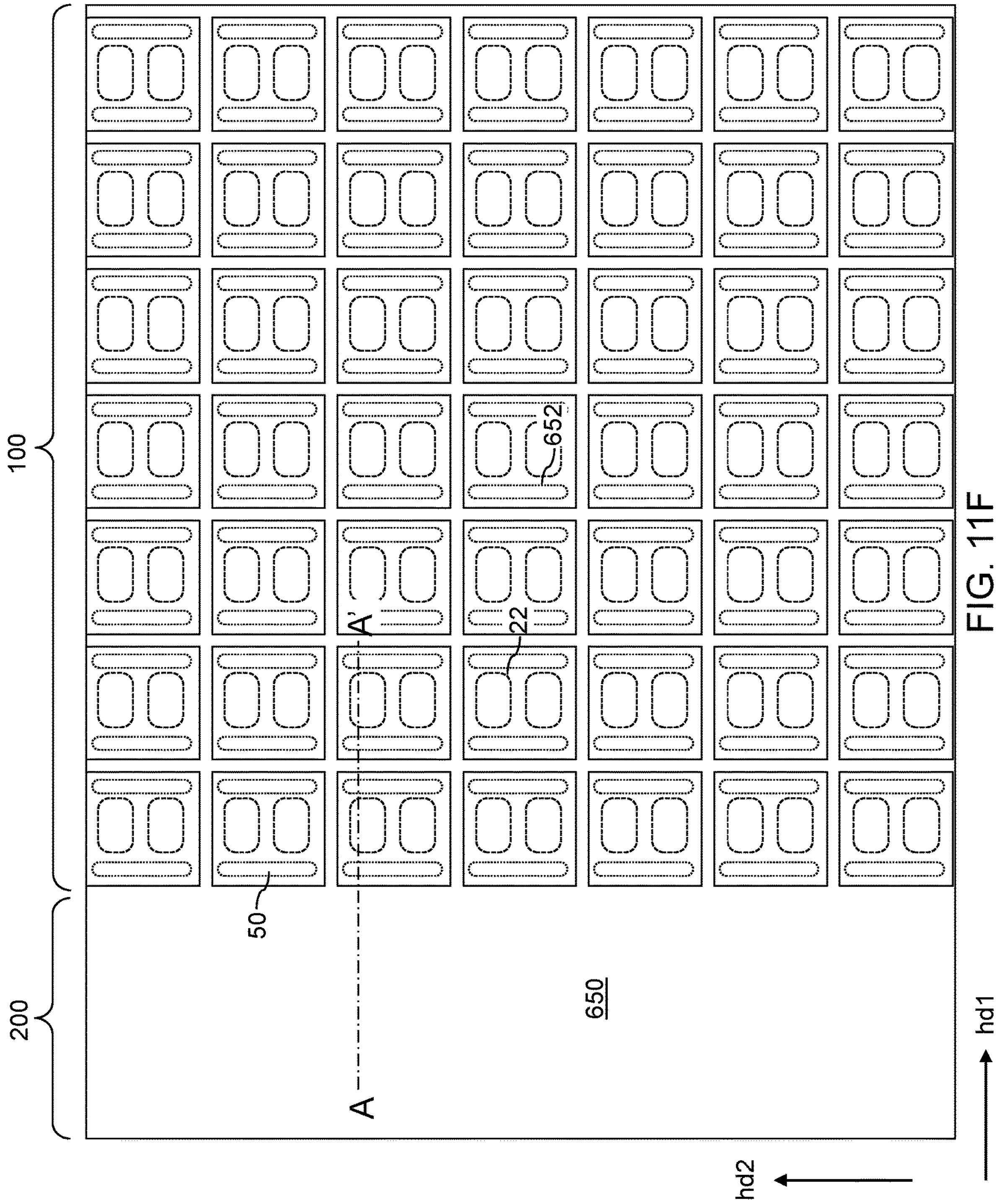
Figure 11G:
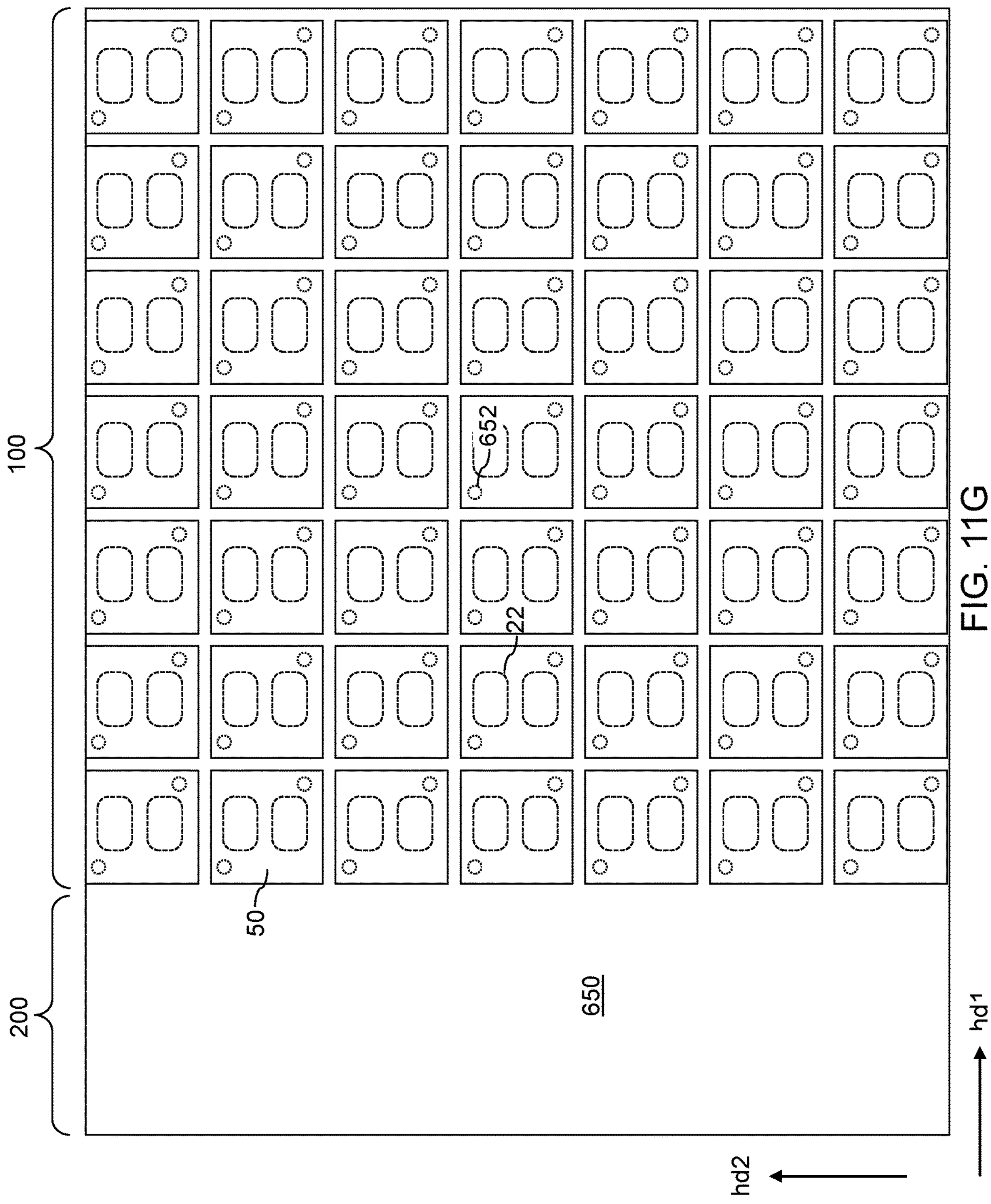
Figure 11H:
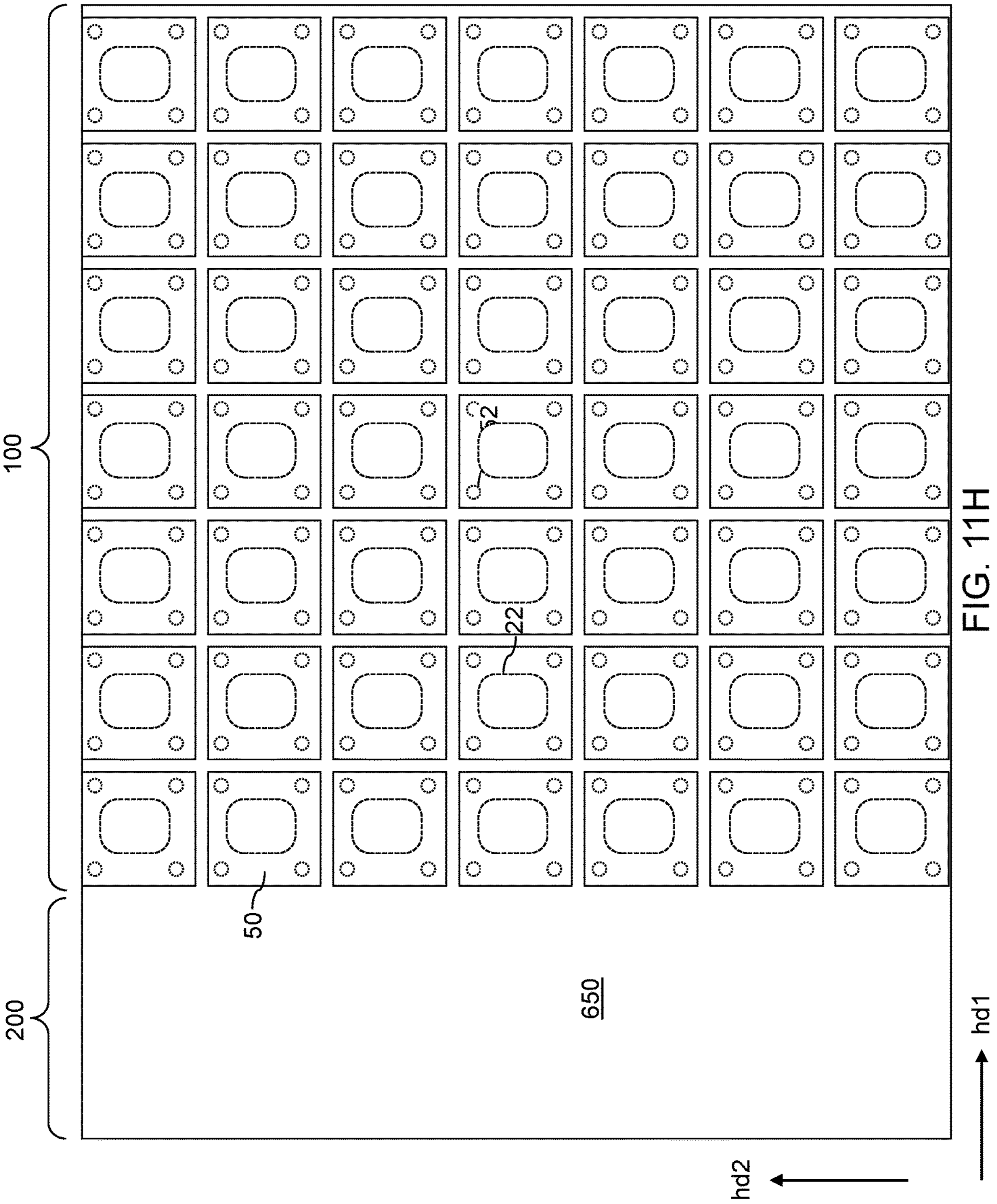
Figure 11I:
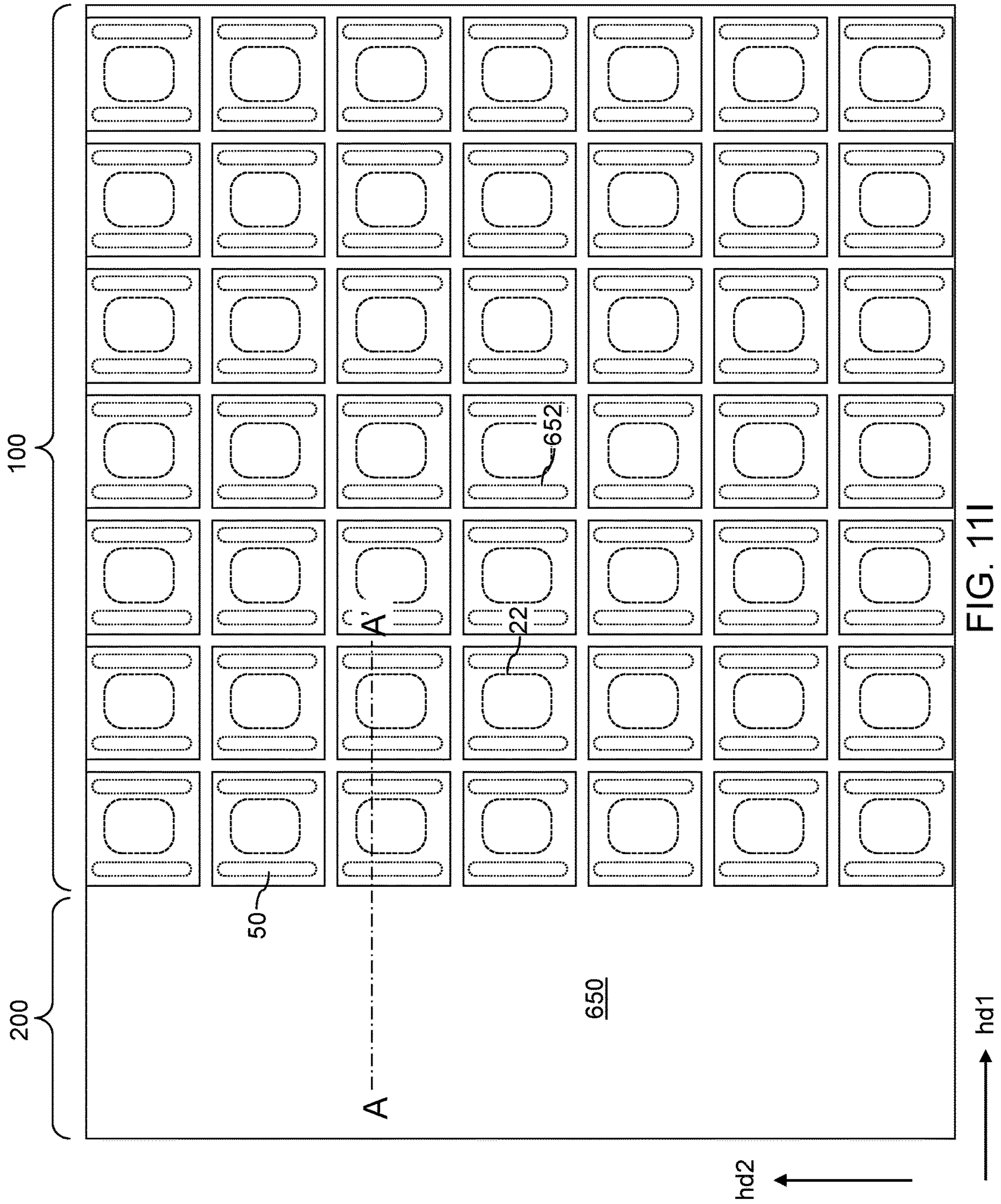
Figure 11J:
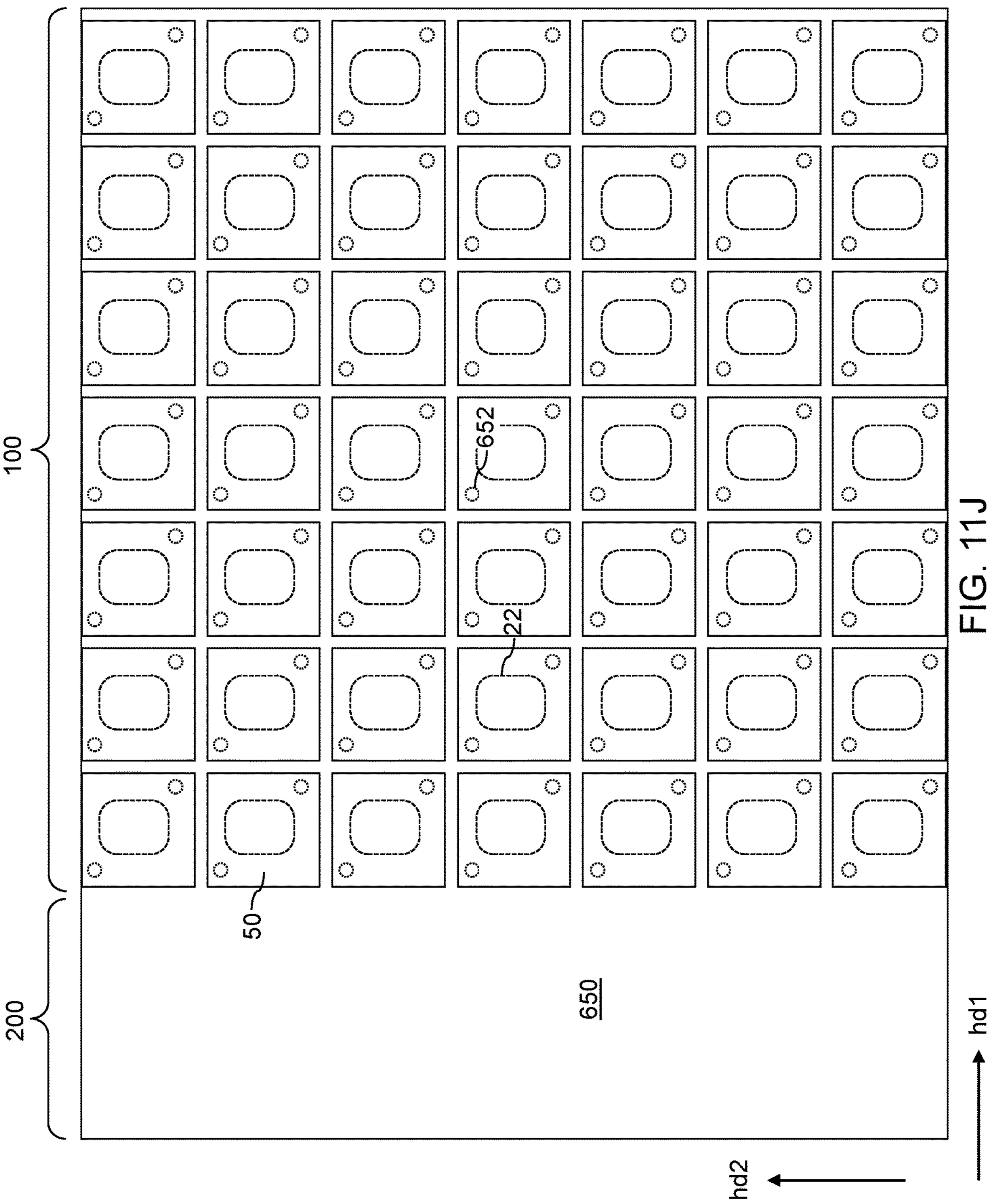

FIGS. 11B, 11E, and 11H correspond to embodiments in which the bottom electrode via structures 652 have a configuration described with reference to FIG. 3B. FIGS. 11C, 11F, and 11I correspond to embodiments in which the bottom electrode via structures 652 have a configuration described with reference to FIG. 3C. FIGS. 11D, 11G, and 11J correspond to embodiments in which the bottom electrode via structures 652 have a configuration described with reference to FIG. 3D. FIGS. 11B, 11C, and 11D correspond to embodiments in which a set of four dielectric pillar structures 22 is formed through a metallic heater plate 20 within the volume of a set of four openings per unit area UA illustrated in FIGS. 5B, 5C, and 5D. FIGS. 11E, 11F, and 11G correspond to embodiments in which a set of two dielectric pillar structures 22 is formed through a metallic heater plate 20 within the volume of a set of two openings per unit area UA illustrated in FIGS. 5E, 5F, and 5G. FIGS. 11H, 11I, and 11J correspond to embodiments in which a single dielectric pillar structure 22 is formed through a metallic heater plate 20 within the volume of a single opening per unit area UA illustrated in FIGS. 5H, 5I, and 5J. Generally, the set of at least one dielectric pillar structure 22 in each unit area UA is configured to provide at least one electrically conductive path between a first set of at least one bottom electrode via structure 652 that is used as a first electrode for the metallic heater plate 20 of a spatial light modulator cell 10 and a set of at least another bottom electrode via structure 652 that is used as a second electrode for the metallic heater plate 20 of the spatial light modulator cell 10. The total number of electrically conductive paths within each metallic heater plate 20 may be 1, 2, 3, 4, 5, etc.

The field effect transistors 701 comprise heater driver transistors. Each of the heater driver transistors is configured to drive electrical current through the metallic heater plate 20 and the pair of bottom electrode via structures 652 within a respective spatial light modulator cell 10 within the array of spatial light modulator cells 10.

Generally, the metallic heater material layer 20L may be patterned such that each metallic heater plate 20 comprises a respective set of at least one opening among the openings in the metallic heater material layer 20L. Each metallic heater plate 20 may contact a respective set of at least one pair of bottom electrode via structures 652 among the bottom electrode via structures 652 that are present in the via-level dielectric layer 650. In one embodiment, each pair of bottom electrode via structures 652 contacting a respective overlying metallic heater plate 20 may be laterally spaced from each other by at least one opening in the respective overlying metallic heater plate 20. In one embodiment, each pair of bottom electrode via structures 652 contacting a respective overlying metallic heater plate 20L may be laterally spaced from each other along the first horizontal direction hd1. In one embodiment, the respective set of at least one opening comprises a plurality of openings.

Figure 12:
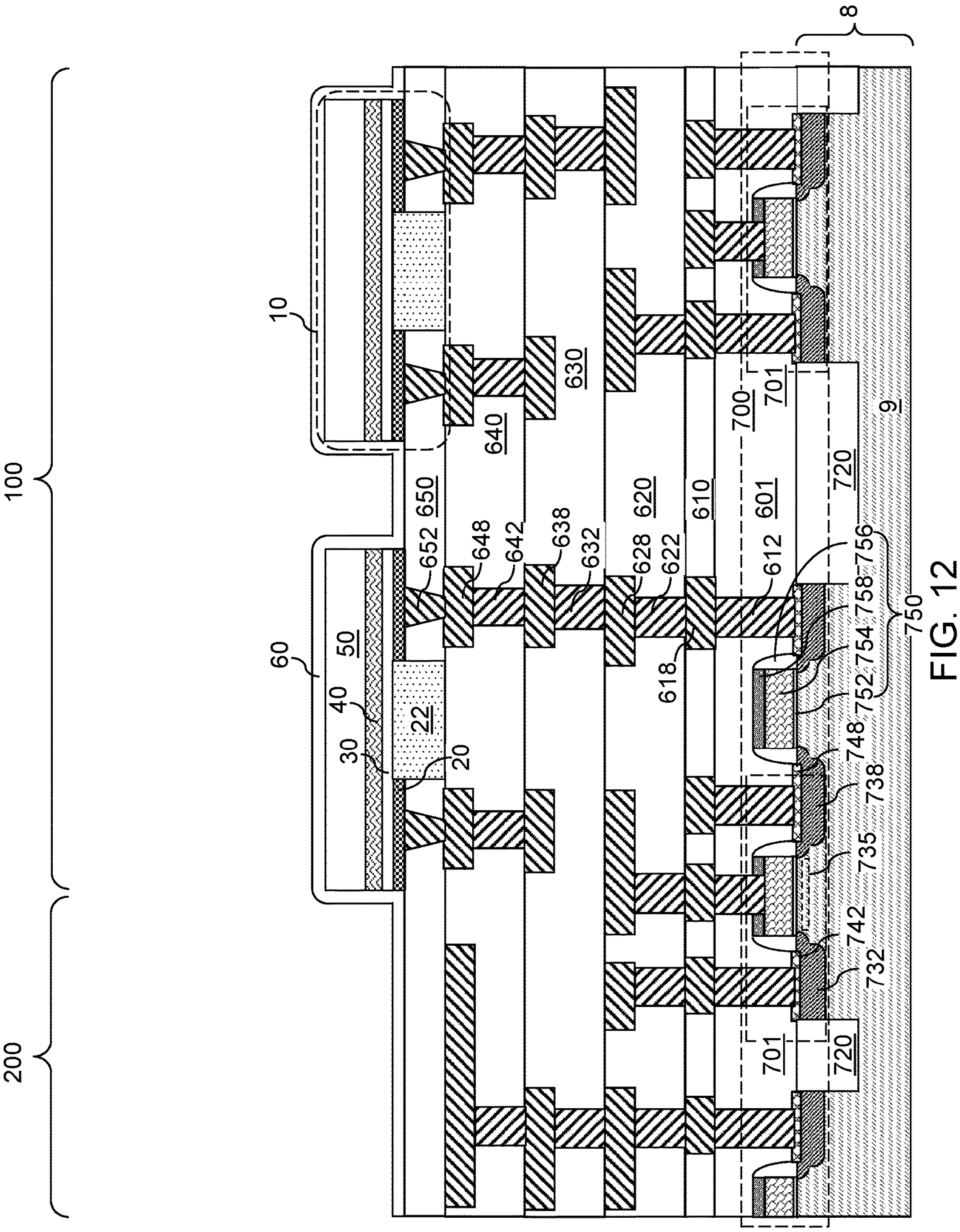
FIG. 12 is a vertical cross-sectional view of the embodiment structure after formation of a dielectric liner according to an embodiment of the present disclosure.

Referring to FIG. 12, a dielectric liner 60 may be conformally deposited over the array of spatial light modulator cells 10. The dielectric liner 60 comprises a dielectric material such as silicon nitride, silicon oxynitride, silicon carbide nitride, silicon oxide, a dielectric metal oxide, etc. In one embodiment, the dielectric liner 60 comprises, and/or consists essentially of, a passivation dielectric material such as silicon nitride, silicon oxynitride, or silicon carbide nitride. The dielectric liner 60 may be deposited by a conformal deposition process. The thickness of the dielectric liner 60 may be in a range from 5 nm to 40 nm, such as from 8 nm to 20 nm, although lesser and greater thicknesses may also be used. The dielectric liner 60 overlies top surfaces and sidewalls of each layer stack (20, 30, 40, 50) within the array of spatial light modulator cells 10, and contacts a top surface of a via-level dielectric layer 650 that laterally surrounds the bottom electrode via structures 652 within the array of spatial light modulator cells 10.

Figure 13:
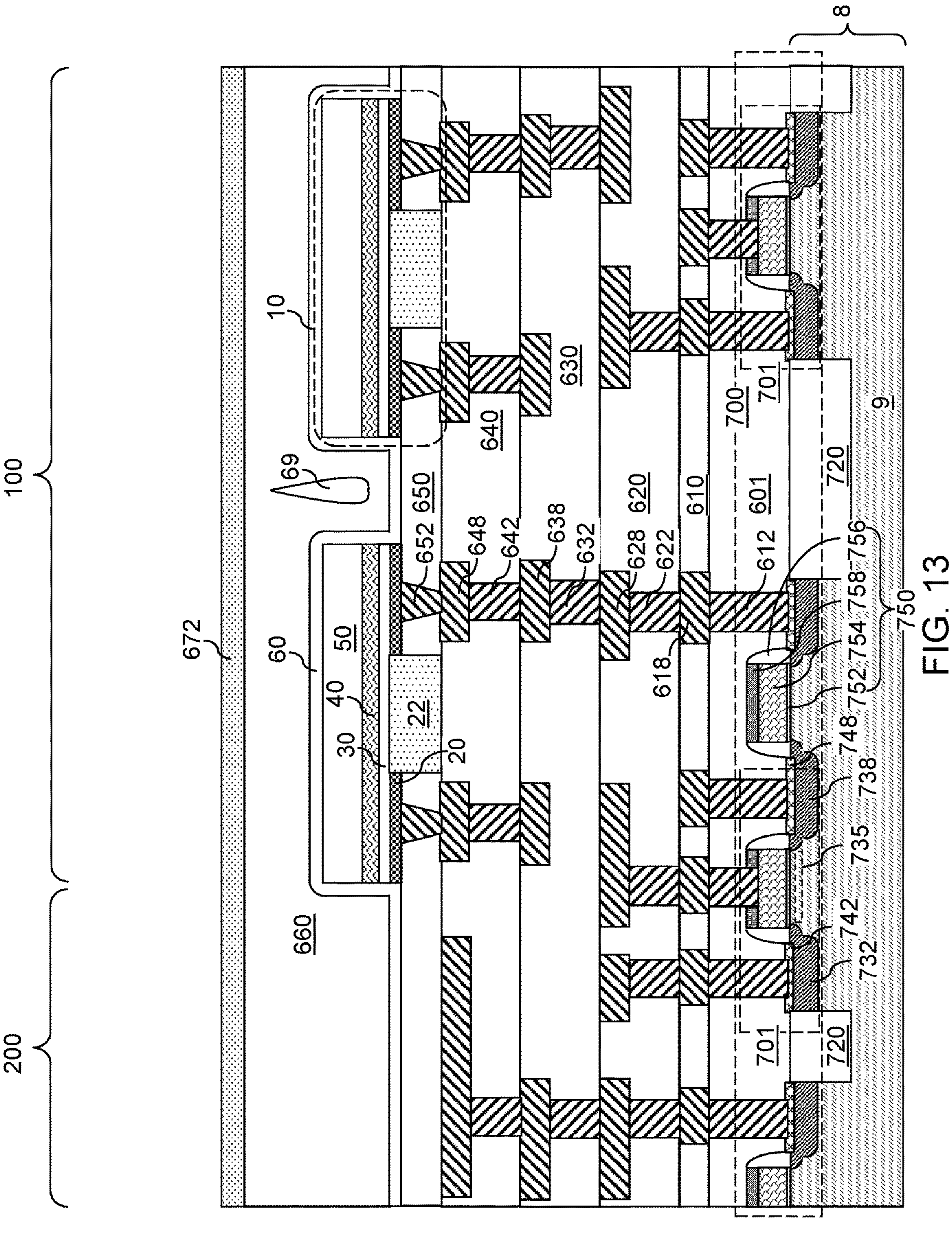
FIG. 13 is a vertical cross-sectional view of the embodiment structure after formation of a dielectric cover layer 660 and a first passivation dielectric layer according to an embodiment of the present disclosure.

Referring to FIG. 13, a dielectric cover layer 660 may be formed over the dielectric liner 60. The dielectric cover layer 660 comprises a dielectric material such as undoped silicate glass, a doped silicate glass, silicon nitride, silicon oxynitride, silicon carbide nitride, organosilicate glass, a polymer material, or combination thereof. The thickness of the dielectric cover layer 660 may be in a range from 300 nm to 2,000 nm, such as from 600 nm to 1,000 nm, although lesser and greater thicknesses may also be used. In some embodiments, encapsulated cavities 69 may be formed in the dielectric cover layer 660. The encapsulated cavities 69 are free of any solid phase material therein, and are formed within the dielectric cover layer 660 in gap areas between neighboring pairs of layer stacks (20, 30, 40, 50) within the array of spatial light modulator cells 10.

A first passivation dielectric layer 672 may be formed over the dielectric cover layer 660. The first passivation dielectric layer 672 comprises a passivation dielectric material such as silicon nitride, silicon nitride carbide, or silicon oxynitride. The thickness of the first passivation dielectric layer 672 may be in a range from 100 nm to 300 nm, although lesser and greater thicknesses may also be used.

Figure 14:
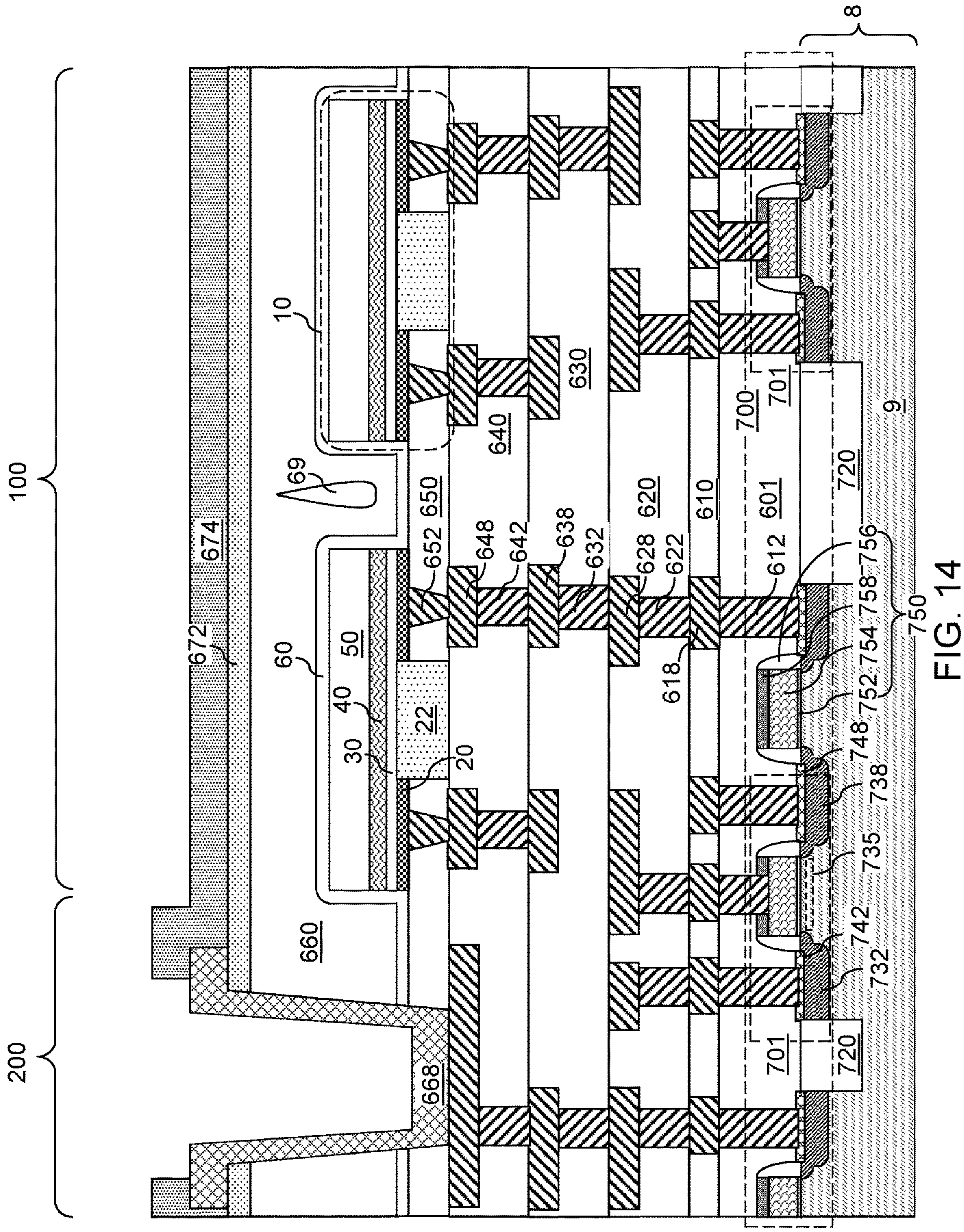
FIG. 14 is a vertical cross-sectional view of the embodiment structure after formation of metallic contact structures and a second passivation dielectric layer according to an embodiment of the present disclosure.

Referring to FIG. 14, via cavities may be formed in the peripheral region 200 through the first passivation dielectric layer 672 and the dielectric cover layer 660 by a combination of a lithographic patterning step and an anisotropic etch process. A top surface of an underlying metal interconnect structure (such as a fourth conductive line structure 648 having a configuration of a metal pad) may be physically exposed underneath each via cavity. Metallic contact structures 668 may be formed in the via cavities on the physically exposed top surfaces of the metal interconnect structures. The metallic contact structures 668 may comprise copper, aluminum, and/or an aluminum copper alloy. Suitable metallic barrier liners and/or underbump metallurgy layers may be used as needed. A second passivation dielectric layer 674 may be formed over the first passivation dielectric layer 672 and over the metallic contact structures 668, and may be patterned to physically expose surfaces of the metallic contact structures 668. The metallic contact structures 668 may be any type of metallic contact structures known in the art, and may be, but are not limited to, solder bonding pads, metal-to-metal bonding pads (for metal-to-metal bonding such as copper-to-copper bonding), microbump structures, etc.

Figure 15:
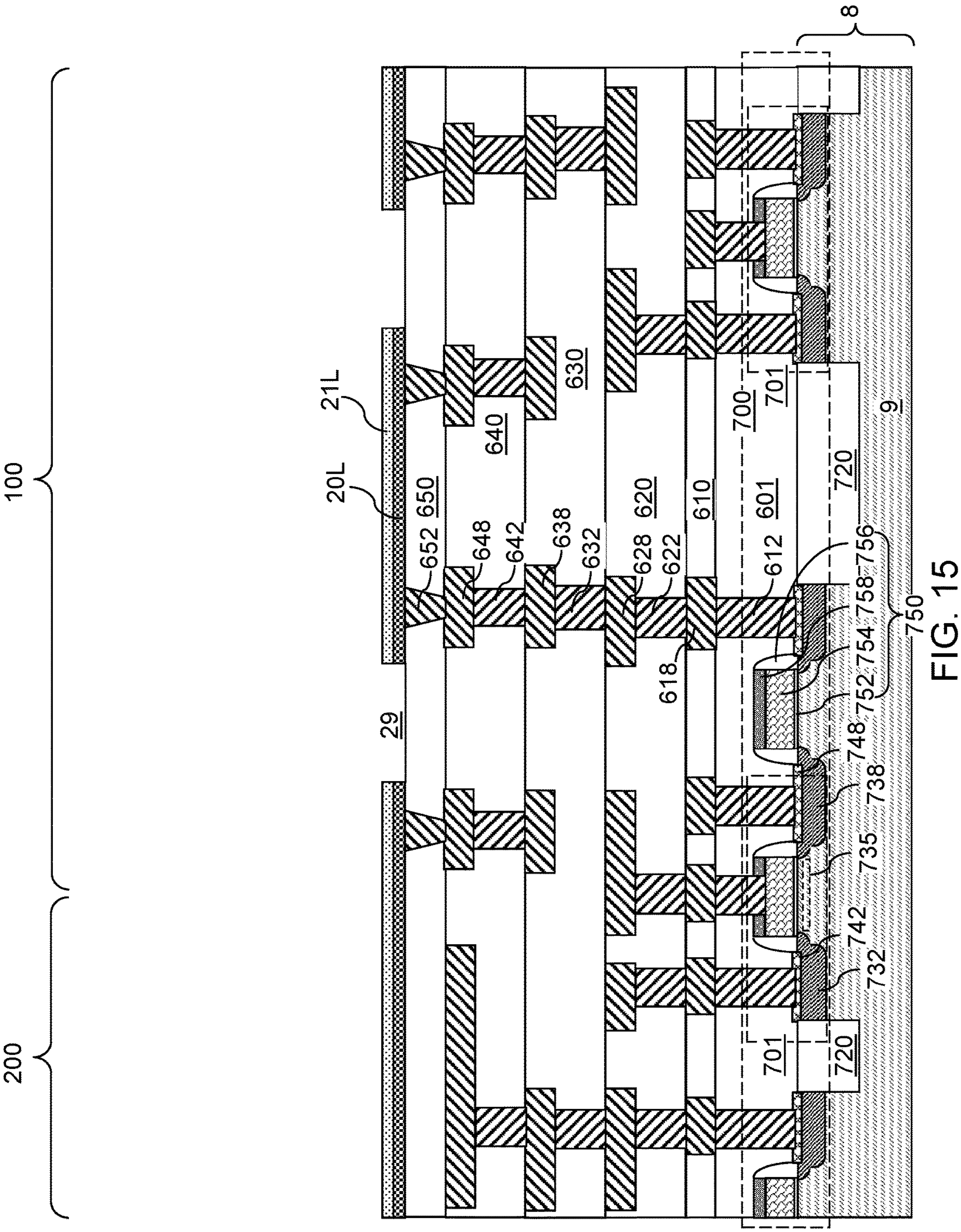
FIG. 15 is a vertical cross-sectional view of a first alternative embodiment structure after formation of openings through the hardmask layer and the metallic heater material layer according to an embodiment of the present disclosure.

Referring to FIG. 15, a first alternative embodiment structure may be derived from the embodiment structure illustrated in FIG. 4 by performing an anisotropic etch process that etches materials of the hardmask layer 21L and the metallic heater material layer 20L selective to the material of the via-level dielectric layer 650. In the first alternative embodiment structure, the discrete openings 29 do not extend into the via-level dielectric layer 650. Thus, while the pattern of the discrete openings 29 for the first alternative embodiment structure is the same as the pattern of the discrete openings 29 for the embodiment structure described above, the discrete openings 29 do not extend to the dielectric layer that underlies the via-level dielectric layer 650. In one embodiment, the discrete openings 29 do not extend into the via-level dielectric layer 650. In one embodiment, the physically exposed segments of the via-level dielectric layer 650 underlying the discrete openings 29 may be located within a same horizontal plane as the interface between the via-level dielectric layer 650 and the metallic heater material layer 20L.

Figure 16:
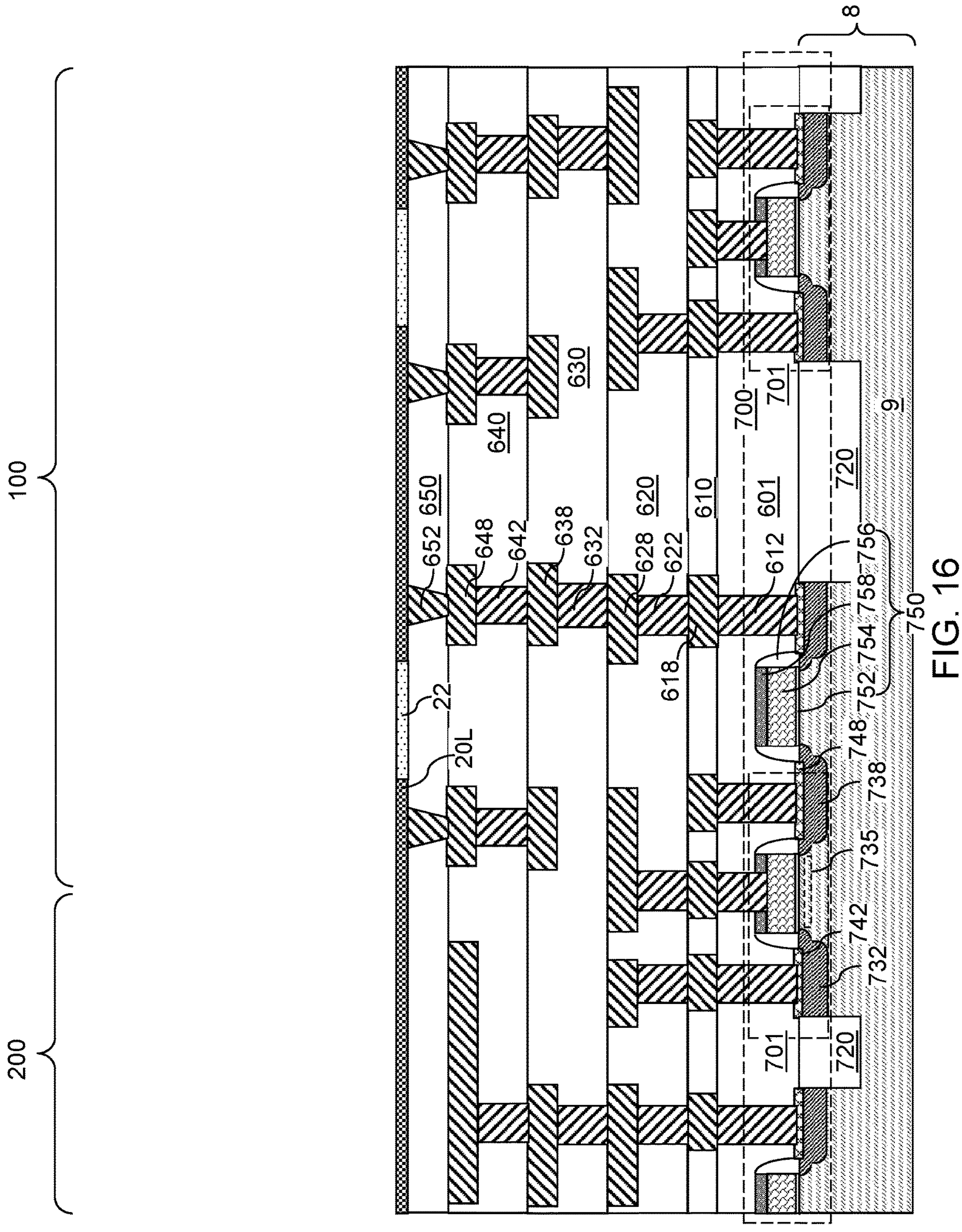
FIG. 16 is a vertical cross-sectional view of the first alternative embodiment structure after formation of dielectric pillar structures according to an embodiment of the present disclosure.

Referring to FIG. 16, the processing steps described with reference to FIGS. 6, 7, and 8 may be performed to form dielectric pillar structures 22 in the discrete openings 29 in the metallic heater material layer 20L. In this embodiment, each dielectric pillar structure 22 comprises a bottom surface that contacts a top surface of the via-level dielectric layer 650. In one embodiment, the bottom surfaces of the dielectric pillar structures 22 may be formed within a horizontal plane including the interface between the via-level dielectric layer 650 and the metallic heater material layer 20L.

In summary, the dielectric pillar structures 22 may be formed in the openings in the metallic heater material layer 20L by depositing a dielectric fill material layer 22L in the openings in the metallic heater material layer 20L and by removing portions of the dielectric fill material layer 22L from above a horizontal plane including a top surface of the metallic heater material layer 20L. In one embodiment, a top surface of the via-level dielectric layer 650 may be exposed underneath the openings in the metallic heater material layer 20L upon formation of the openings in the metallic heater material layer 20L, and the dielectric pillar structures 22 may be formed directly on segments of the top surface of the via-level dielectric layer 650.

Figure 17:
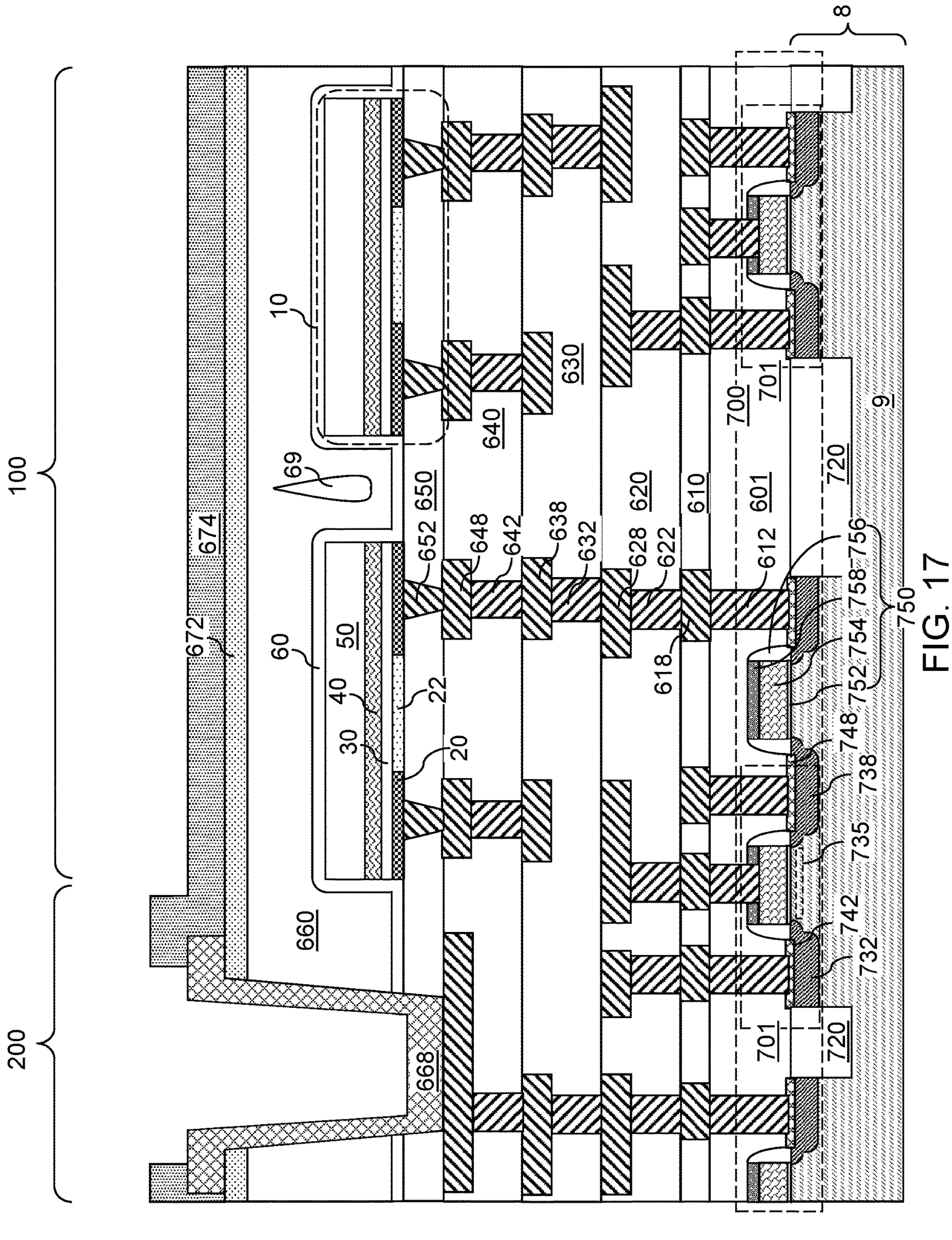
FIG. 17 is a vertical cross-sectional view of the first alternative embodiment structure after formation of metallic contact structures and a second passivation dielectric layer according to an embodiment of the present disclosure.

Referring to FIG. 17, the processing steps described with reference to FIGS. 9-14 may be performed to form an array of spatial light modulator cells 10, a dielectric liner 60, a dielectric cover layer 660, passivation dielectric layers (672, 674), and metallic contact structures 668.

Figure 18:
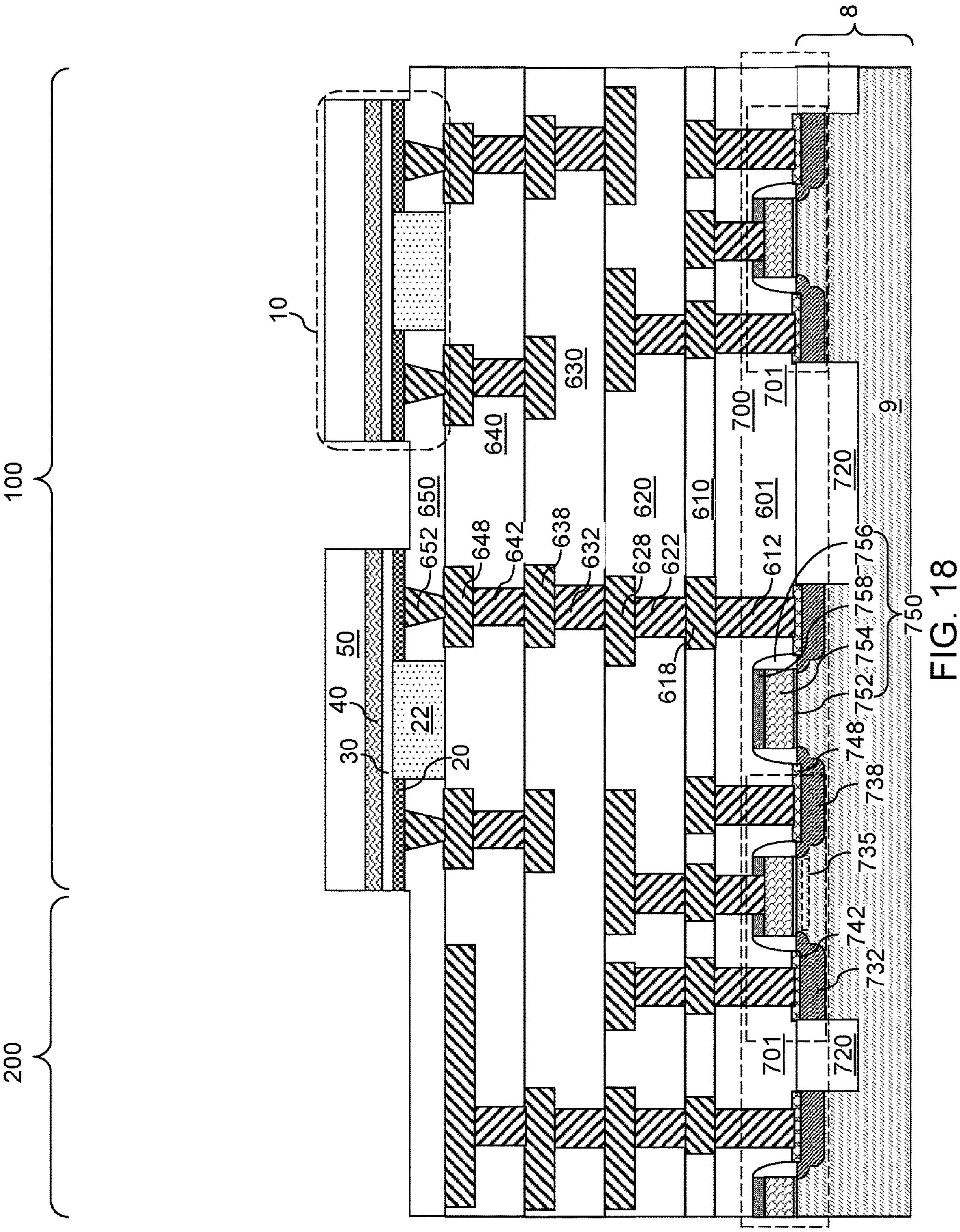
FIG. 18 is a vertical cross-sectional view of a second alternative embodiment structure after patterning an array of spatial light modulator cells according to an embodiment of the present disclosure.

Referring to FIG. 18, a second alternative embodiment structure may be derived from the embodiment structure illustrated in FIG. 10 by continuing the at least one anisotropic etch process with an optional change in the etch chemistry to vertically recess physically exposed portions of the via-level dielectric layer 650. The patterned etch mask layer 57 may be subsequently removed. In this embodiment, the via-level dielectric layer 650 may have topmost planar surface segments and a recessed planar surface segments. The topmost planar surface segments are in contact with bottom surfaces of the layer stacks (20, 30, 40, 50). The recessed planar surface segments are not in contact with the layer stacks (20, 30, 40, 50), and are vertically recessed from the topmost planar surface segments by a vertical recess distance, which may be, for example, in a range from 1 nm to 100 nm, such as from 5 nm to 50 nm, although lesser and greater vertical recess distances may also be used. Each of the outer sidewalls of the metallic heater plate 20 is vertically coincident with a respective sidewall segment of the via-level dielectric layer 650 that connects a respective one of the topmost planar surface segments and a respective one of the recessed planar surface segments.

Figure 19:
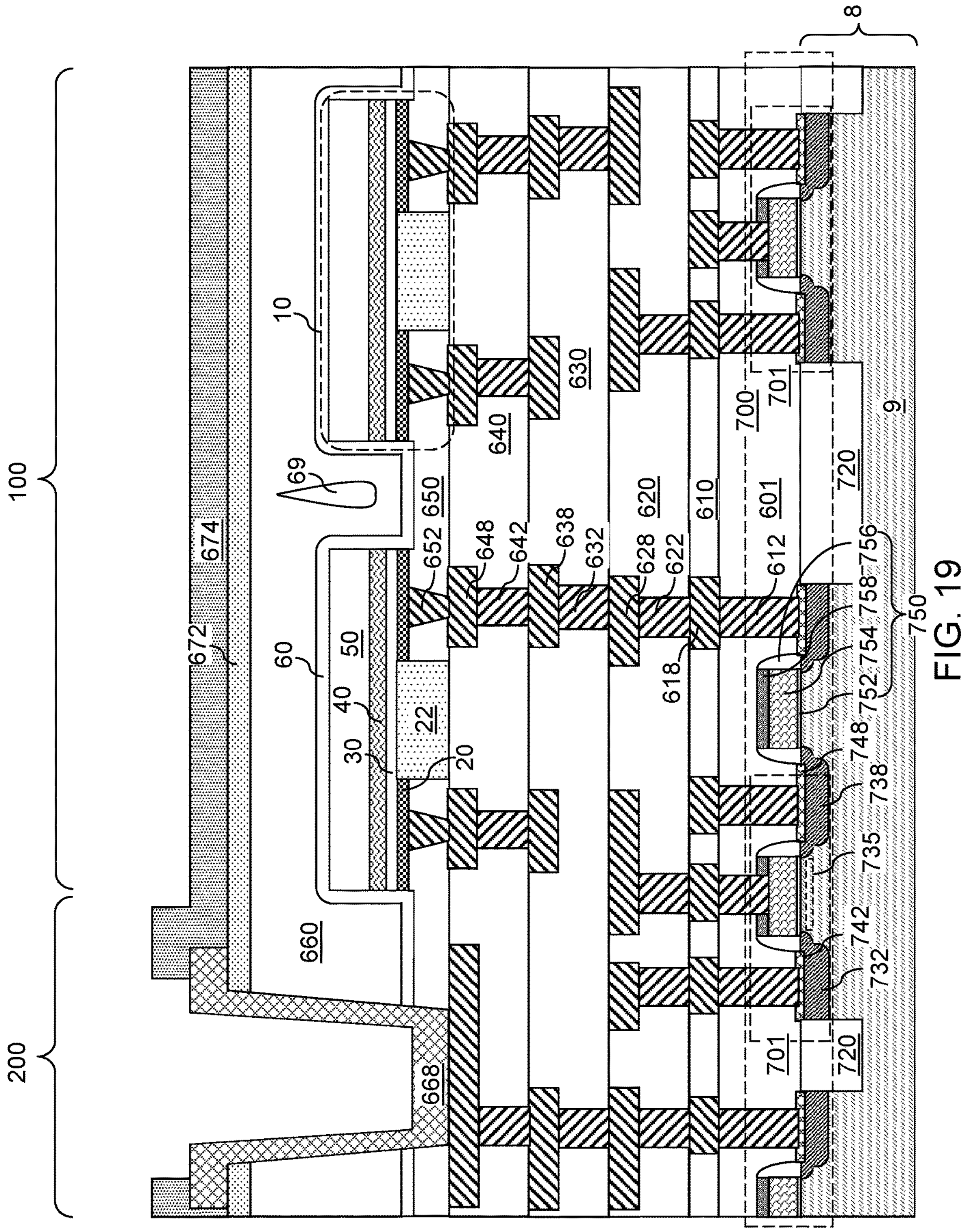
FIG. 19 is a vertical cross-sectional view of the second alternative embodiment structure after formation of metallic contact structures and a second passivation dielectric layer according to an embodiment of the present disclosure.

Referring to FIG. 19, the processing steps described with reference to FIGS. 12-14 may be performed to form an array of spatial light modulator cells 10, a dielectric liner 60, a dielectric cover layer 660, passivation dielectric layers (672, 674), and metallic contact structures 668.

Figure 20:
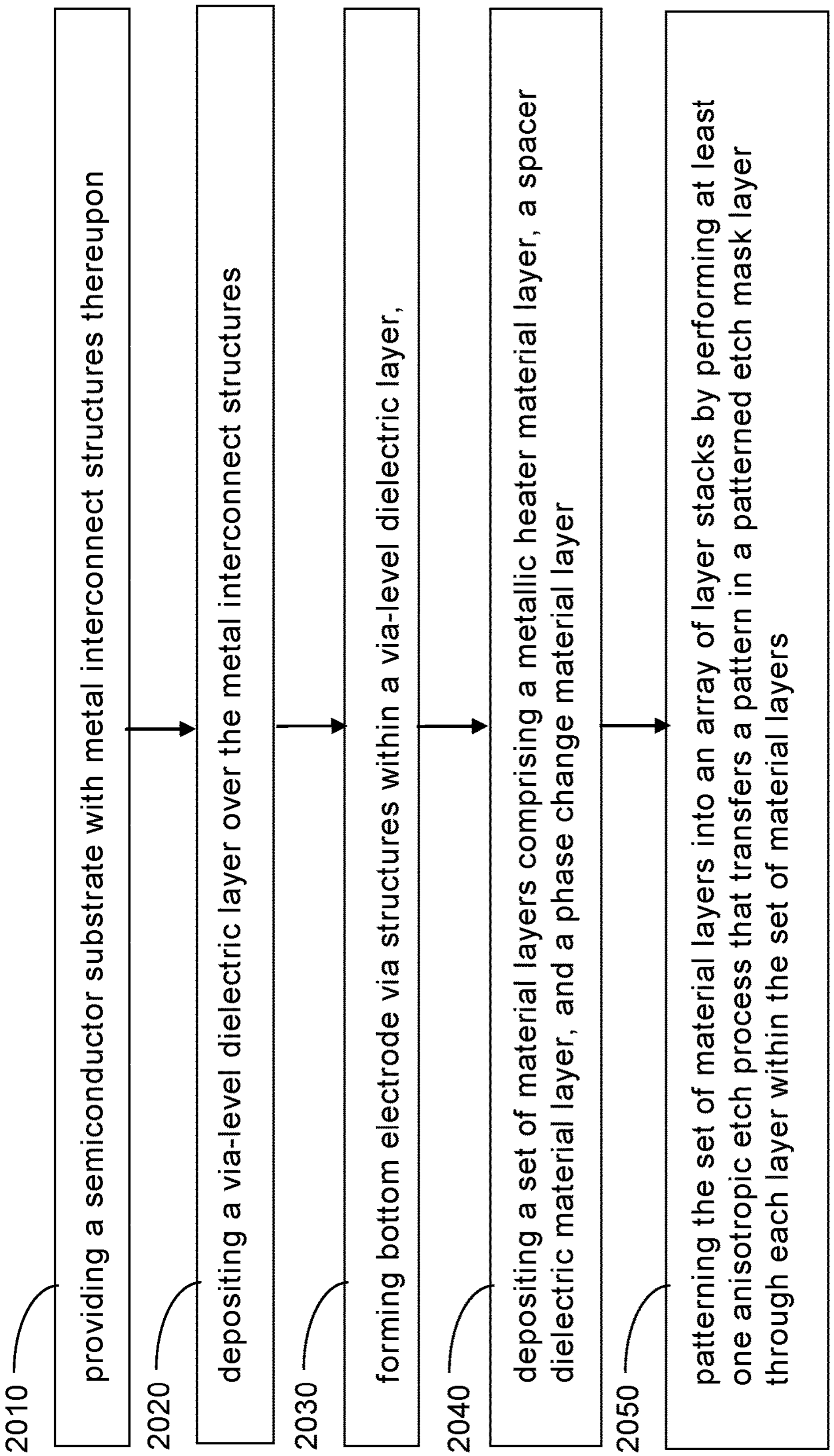
FIG. 20 is a first flowchart that illustrates general processing steps for manufacturing a device structure according to an embodiment of the present disclosure.

FIG. 20 is a first flowchart that illustrates general processing steps for manufacturing a device structure, which may be used to form a spatial light modulator device.

Referring to step 2010 and FIG. 1, a semiconductor substrate 8 with metal interconnect structures (612, 618, 622, 628, 632, 638, 642, 648) thereupon may be provided.

Referring to step 2020 and FIG. 2, a via-level dielectric layer 650 may be deposited over the metal interconnect structures (612, 618, 622, 628, 632, 638, 642, 648).

Referring to step 2030 and FIGS. 2-3D, bottom electrode via structures 652 may be formed within the via-level dielectric layer 650.

Referring to step 2040 and FIGS. 4-9 and 15-19, a set of material layers (20L, 30L, 40L, 50L) comprising a metallic heater material layer 20L, a spacer dielectric material layer 30L, and a phase change material layer 40L may be deposited.

Referring to step 2050 and FIGS. 10-14, 17, and 20, the set of material layers (20L, 30L, 40L, 50L) may be patterned into an array of layer stacks (20, 30, 40, 50) by performing at least one anisotropic etch process that transfers a pattern in a patterned etch mask layer 57 through each layer within the set of material layers (20L, 30L, 40L, 50L).

Figure 21:
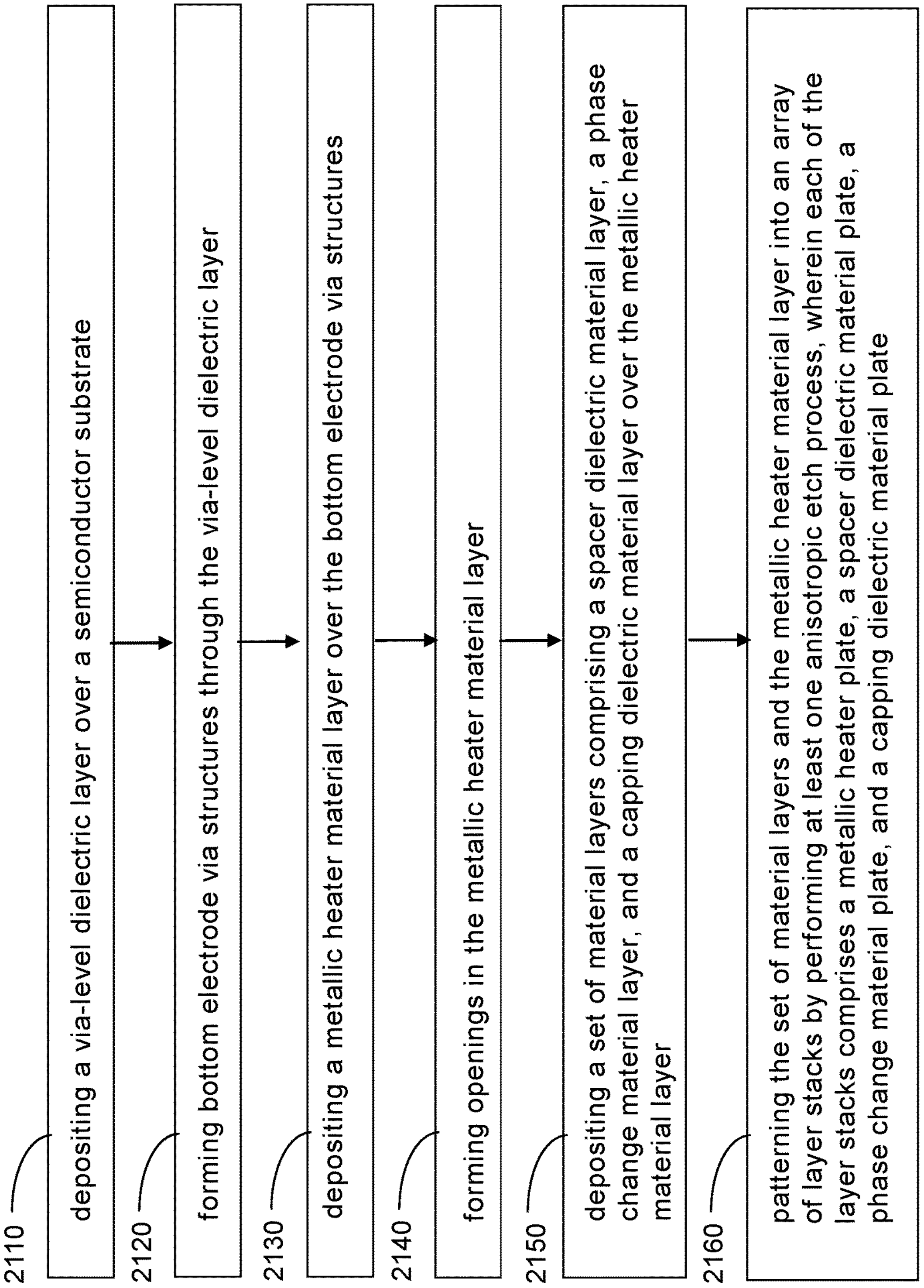
FIG. 21 is a second flowchart that illustrates general processing steps for manufacturing a device structure according to an embodiment of the present disclosure.

FIG. 21 is a second flowchart that illustrates general processing steps for manufacturing a device structure, which may be used to form a spatial light modulator device.

Referring to step 2110 and FIGS. 1 and 2, a via-level dielectric layer 650 may be deposited over a semiconductor substrate 8.

Referring to step 2120 and FIGS. 2-3D, bottom electrode via structures 652 may be formed through the via-level dielectric layer 650.

Referring to step 2130 and FIG. 4, a metallic heater material layer 20L may be deposited over the bottom electrode via structures 652.

Referring to step 2140 and FIGS. 5A-5J, openings may be formed in the metallic heater material layer 20L.

Referring to step 2150 and FIGS. 6-9 and 15-19, a set of material layers (30L, 40L, 50L) comprising a spacer dielectric material layer 30L, and a phase change material layer 40L may be sequentially deposited over the metallic heater material layer 20L.

Referring to step 2160 and FIGS. 10-14, 17, and 20, the set of material layers (30L, 40L, 50L) and the metallic heater material layer 20L may be patterned into an array of layer stacks (20, 30, 40, 50) by performing at least one anisotropic etch process. Each of the layer stacks (20, 30, 40, 50) comprises a metallic heater plate 20, a spacer dielectric material plate 30, a phase change material plate 40, and a capping dielectric material plate 50.

Referring to all drawings and according to various embodiments of the present disclosure, a spatial light modulator device is provided, which comprises an array of spatial light modulator cells 10 located over a substrate. Each of the spatial light modulator cells 10 comprises: a layer stack (20, 30, 40, 50) comprising a phase change material plate 40, a spacer dielectric material plate 30 that underlies the phase change material plate 40, and a metallic heater plate 20 underlying the spacer dielectric material plate 30 and comprising outer sidewalls; and a pair of bottom electrode via structures 652 contacting a respective surface segment of a bottom surface of the metallic heater plate 20, wherein each of the outer sidewalls of the metallic heater plate 20 is vertically coincident with a respective sidewall of the spacer dielectric material plate 30 and with a respective sidewall of the phase change material plate 40.

In one embodiment, each of the spatial light modulator cells 10 comprises at least one dielectric pillar structure 22 located in a respective opening through the metallic heater plate 20. In one embodiment, each of the at least one dielectric pillar structure 22 comprises a top surface that contacts a bottom surface of the spacer dielectric material plate 30. In one embodiment, the pair of bottom electrode via structures 652 may be formed within a via-level dielectric layer 650; and the pair of bottom electrode via structures 652 comprises a bottom surface that contacts a top surface of a dielectric material layer that underlies the via-level dielectric layer 650.

In one embodiment, the pair of bottom electrode via structures 652 may be formed within a via-level dielectric layer 650; and the pair of bottom electrode via structures 652 comprises a bottom surface that contacts a top surface of the via-level dielectric layer 650. In one embodiment, each of the at least one dielectric pillar structure 22 is located entirely within an area defined by the outer sidewalls of the metallic heater plate 20.

In one embodiment, the layer stack (20, 30, 40, 50) comprises a capping dielectric material plate 50 that overlies the phase change material plate 40; and each sidewall of the capping dielectric material plate 50 is vertically coincident with a respective outer sidewall selected from the outer sidewalls of the metallic heater plate 20. In one embodiment, the pair of bottom electrode via structures 652 may be formed within a via-level dielectric layer 650 having topmost planar surface segments and a recessed planar surface segments; and each of the outer sidewalls of the metallic heater plate 20 is vertically coincident with a respective sidewall segment of the via-level dielectric layer 650 that connects a respective one of the topmost planar surface segments and a respective one of the recessed planar surface segments.

In one embodiment, the spatial light modulator device further comprises a dielectric liner 60 overlying top surfaces and sidewalls of each layer stack (20, 30, 40, 50) within the array of spatial light modulator cells 10 and contacting a top surface of a via-level dielectric layer 650 that laterally surrounds the bottom electrode via structures 652 within the array of spatial light modulator cells 10. In one embodiment, the spatial light modulator device further comprises a dielectric cover layer 660 overlying the dielectric liner 60, wherein encapsulated cavities that are free of any solid phase material are formed within the dielectric cover layer 660 in gap areas between neighboring pairs of layer stacks (20, 30, 40, 50) within the array of spatial light modulator cells 10.

According to another aspect of the present disclosure, a device structure is provided, which comprises: field effect transistors 701 located on a semiconductor substrate 8; metal interconnect structures (612, 618, 622, 628, 632, 638, 642, 648) formed within dielectric material layers that overlie the field effect transistors 701 and electrically connected to the field effect transistors 701; and an array of spatial light modulator cells 10 located over the dielectric material layers, wherein: each of the spatial light modulator cells 10 comprises a layer stack (20, 30, 40, 50) comprising a phase change material plate 40, a spacer dielectric material plate 30 that underlies the phase change material plate 40, and a metallic heater plate 20 underlying the spacer dielectric material plate 30 and comprising outer sidewalls; and each of the outer sidewalls of the metallic heater plate 20 is vertically coincident with a respective sidewall of the spacer dielectric material plate 30 and with a respective sidewall of the phase change material plate 40.

In one embodiment, each of the spatial light modulator cells 10 comprises a pair of bottom electrode via structures 652 contacting a respective surface segment of a bottom surface of the metallic heater plate 20. In one embodiment, the field effect transistors 701 comprise heater driver transistors; and each of the heater driver transistors is configured to drive electrical current through the metallic heater plate 20 and the pair of bottom electrode via structures 652 within a respective spatial light modulator cell within the array of spatial light modulator cells 10.

In one embodiment, each of the spatial light modulator cells 10 comprises at least one dielectric pillar structure 22 located in a respective opening through the metallic heater plate 20. In one embodiment, each of the at least one dielectric pillar structure 22 comprises a top surface that contacts a bottom surface of the spacer dielectric material plate 30 and has a thickness that is not less than a thickness of the metallic heater plate 20.

Referring to all drawings and according to various embodiments of the present disclosure, a method of forming a spatial light modulator device is provided. The method may include the steps of: providing a semiconductor substrate 8 with metal interconnect structures (612, 618, 622, 628, 632, 638, 642, 648) thereupon; depositing a via-level dielectric layer 650 over the metal interconnect structures; forming bottom electrode via structures 652 within the via-level dielectric layer 650; depositing a set of material layers (20L, 30L, 40L, 50L) including a metallic heater material layer 20L, a spacer dielectric material layer 30L, and a phase change material layer 40L; and patterning the set of material layers (20L, 30L, 40L, 50L) into an array of layer stacks (20, 30, 40, 50) by performing at least one anisotropic etch process that transfers a pattern in a patterned etch mask layer 57 through each layer within the set of material layers (20L, 30L, 40L, 50L).

In one embodiment, a top surface of the via-level dielectric layer 650 may be exposed after the at least one anisotropic etch process; and each of the layer stacks (20, 30, 40, 50) may include a phase change material plate 40 which may be a patterned portion of the phase change material layer 40L, a spacer dielectric material plate 30 which is a patterned portion of the spacer dielectric material layer 30L, and a metallic heater plate 20 which may be a patterned portion of the metallic heater material layer 20L. In one embodiment, the method may further include the steps of forming an array of openings through the metallic heater material layer 20; and forming an array of dielectric pillar structures 22 in the array of openings prior to formation of the spacer dielectric material layer 30. In one embodiment, the method may further include the steps of depositing a hardmask layer 21L over the metallic heater material layer 20; forming a patterned etch mask layer 27 over the hardmask layer 21L; and removing portions of the hardmask layer 21 and the metallic heater material layer 20 that are not covered by the patterned etch mask layer, whereby the array of openings may be formed through the metallic heater material layer 20. In one embodiment, the method may further include the steps depositing a dielectric fill material layer 22L in the array of openings through the metallic heater material layer 20; and removing portions of the dielectric fill material 22 from above the hardmask layer 21, whereby the array of dielectric pillar structures 22 may be formed. In one embodiment, the method may further include the steps forming a dielectric cover layer 660 over an array of spatial light modulator cells 10 and the array of dielectric pillar structures 22. In one embodiment, the metallic heater material layer 20 may be free of any opening in a peripheral region after formation of the array of openings and prior to patterning the set of material layers (20L, 30L, 40L, 50L); and the method may also include the step of forming metal contact structures through the dielectric cover layer 660 in the peripheral region.

According to another aspect of the present disclosure, a method of forming a spatial light modulator device may be provided, the method may include the steps of: depositing a via-level dielectric layer 650 over a semiconductor substrate 8; forming bottom electrode via structures 652 through the via-level dielectric layer 650; depositing a metallic heater material layer 20L over the bottom electrode via structures 652; forming openings in the metallic heater material layer 20L; depositing a set of material layers (20L, 30L, 40L, 50L) comprising a spacer dielectric material layer 30L, a phase change material layer 40L, and a capping dielectric material layer 50L over the metallic heater material layer 20L; and patterning the set of material layers (20L, 30L, 40L, 50L) and the metallic heater material layer 20L into an array of layer stacks (20L, 30L, 40L, 50L) by performing at least one anisotropic etch process, wherein each of the layer stacks (20L, 30L, 40L, 50L) comprises a metallic heater plate 20, a spacer dielectric material plate 30, a phase change material plate 40, and a capping dielectric material plate 50.

In one embodiment, the method may further include the steps of forming a patterned etch mask layer 57 including an array of etch mask material portions over the set of material layers (20L, 30L, 40L, 50L); and the at least one anisotropic etch process may transfer a pattern in the patterned etch mask layer 57 through each layer within the set of material layers and through the metallic heater material layer 20L. In one embodiment, the method may further include the steps of forming dielectric pillar structures 22 in the openings in the metallic heater material layer 20L by depositing a dielectric fill material layer 22 in the openings in the metallic heater material layer 20L and by removing portions of the dielectric fill material layer 22 from above a horizontal plane including a top surface of the metallic heater material layer 20L. In one embodiment, the openings in the metallic heater material layer 20L vertically extend to a bottom surface of the via-level dielectric layer 650; and the dielectric pillar structures 22 may have sidewalls that vertically extend from the top surface of the metallic heater material layer 20L to the bottom surface of the via-level dielectric layer 650. In one embodiment, a top surface of the via-level dielectric layer 650 may be exposed underneath the openings in the metallic heater material layer 20L upon formation of the openings in the metallic heater material layer 20L; and the dielectric pillar structures 22 may be formed directly on segments of the top surface of the via-level dielectric layer 650. In one embodiment, the metallic heater material layer 20L may be patterned such that each metallic heater plate 20 may include a respective set of at least one opening among the openings in the metallic heater material layer 20L and contacts a respective set of at least one pair of bottom electrode via structures 652 among the bottom electrode via structures that are present in the via-level dielectric layer 650. In one embodiment, the respective set of at least one opening may include a plurality of openings. In one embodiment, the method may further include the steps of depositing a dielectric liner 60 over top surfaces and sidewalls of the array of layer stacks and on a top surface of the via-level dielectric layer 650; and depositing a dielectric cover layer 660 over the dielectric liner 60, wherein encapsulated cavities that are free of any solid phase material are formed within the dielectric cover layer in gap areas between neighboring pairs of layer stacks within the array of layer stacks.

The various embodiments of the present disclosure may be used to provide a spatial light modulator device in which each phase change material plate 40 is self-aligned to an underlying metallic heater plate 20. Each metallic heater plate 20 may comprise a respective set of at least one opening that is filled with a respective dielectric pillar structure 22. A small pattern factor used during planarization of the dielectric fill material that forms the dielectric pillar structures 22 enhances coplanarity of the top surfaces of the dielectric pillar structures 22 with the metallic heater plates 20. By forming the top surfaces of the dielectric pillar structures 22 within the horizontal plane including the top surfaces of the metallic heater plates 20, the planarity of the phase change material plates 40 may be enhanced. The various self-alignment features of the spatial light modulator cells 10 of the present disclosure may enhance device performance uniformity and reliability of the spatial light modulator device of the present disclosure.

The foregoing outlines features of several embodiments so that those skilled in the art may better understand the aspects of the present disclosure. Each embodiment described using the term "comprises" also inherently discloses that the term "comprises" may be replaced with "consists essentially of" or with the term "consists of" in some embodiments, unless expressly disclosed otherwise herein. Whenever two or more elements are listed as alternatives in a same paragraph of in different paragraphs, a Markush group including a listing of the two or more elements may be also impliedly disclosed in some embodiments. Whenever the auxiliary verb "can" is used in this disclosure to describe formation of an element or performance of a processing step, an embodiment in which such an element or such a processing step is not performed is also expressly contemplated, provided that the resulting apparatus or device may provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a spatial light modulator device, the method comprising:

providing a semiconductor substrate with metal interconnect structures thereupon;

depositing a via-level dielectric layer over the metal interconnect structures;

forming bottom electrode via structures within the via-level dielectric layer;

depositing a set of material layers comprising a metallic heater material layer, a spacer dielectric material layer, and a phase change material layer; and patterning the set of material layers into an array of layer stacks by performing at least one anisotropic etch process that transfers a pattern in a patterned etch mask layer through each layer within the set of material layers.

2. The method of claim 1, wherein:

a top surface of the via-level dielectric layer is exposed after the at least one anisotropic etch process; and each of the layer stacks comprises a phase change material plate which is a patterned portion of the phase change material layer, a spacer dielectric material plate which is a patterned portion of the spacer dielectric material layer, and a metallic heater plate which is a patterned portion of the metallic heater material layer.

3. The method of claim 1, further comprising:

forming an array of openings through the metallic heater material layer; and forming an array of dielectric pillar structures in the array of openings prior to formation of the spacer dielectric material layer.

4. The method of claim 3, further comprising:

depositing a hardmask layer over the metallic heater material layer;

forming a patterned etch mask layer over the hardmask layer; and removing portions of the hardmask layer and the metallic heater material layer that are not covered by the patterned etch mask layer, whereby the array of openings is formed through the metallic heater material layer.

5. The method of claim 4, further comprising:

depositing a dielectric fill material in the array of openings through the metallic heater material layer; and removing portions of the dielectric fill material from above the hardmask layer, whereby the array of dielectric pillar structures is formed.

6. The method of claim 3, further comprising forming a dielectric cover layer over an array of spatial light modulator cells and an array of dielectric pillar structures.

7. The method of claim 6, wherein:

the metallic heater material layer is free of any opening in a peripheral region after formation of the array of openings and prior to patterning the set of material layers; and the method comprises forming metal contact structures through the dielectric cover layer in the peripheral region.

8. A method of forming a spatial light modulator device, the method comprising:

depositing a via-level dielectric layer over a semiconductor substrate;

forming bottom electrode via structures through the via-level dielectric layer;

depositing a metallic heater material layer over the bottom electrode via structures;

forming openings in the metallic heater material layer;

depositing a set of material layers comprising a spacer dielectric material layer, a phase change material layer, and a capping dielectric material layer over the metallic heater material layer; and patterning the set of material layers and the metallic heater material layer into an array of layer stacks by performing at least one anisotropic etch process, wherein each of the layer stacks comprises a metallic heater plate, a spacer dielectric material plate, a phase change material plate, and a capping dielectric material plate.

9. The method of claim 8, wherein:

the method comprises forming a patterned etch mask layer including an array of etch mask material portions over the set of material layers; and the at least one anisotropic etch process transfers a pattern in the patterned etch mask layer through each layer within the set of material layers and through the metallic heater material layer.

10. The method of claim 8, further comprising forming dielectric pillar structures in the openings in the metallic heater material layer by depositing a dielectric fill material layer in the openings in the metallic heater material layer and by removing portions of the dielectric fill material layer from above a horizontal plane including a top surface of the metallic heater material layer.

11. The method of claim 10, wherein:

the openings in the metallic heater material layer vertically extend to a bottom surface of the via-level dielectric layer; and the dielectric pillar structures have sidewalls that vertically extend from the top surface of the metallic heater material layer to the bottom surface of the via-level dielectric layer.

12. The method of claim 10, wherein:

a top surface of the via-level dielectric layer is exposed underneath the openings in the metallic heater material layer upon formation of the openings in the metallic heater material layer; and the dielectric pillar structures are formed directly on segments of the top surface of the via-level dielectric layer.

13. The method of claim 8, wherein the metallic heater material layer is patterned such that each metallic heater plate comprises a respective set of at least one opening among the openings in the metallic heater material layer and contacts a respective set of at least one pair of bottom electrode via structures among the bottom electrode via structures that are present in the via-level dielectric layer.

14. The method of claim 13, wherein the respective set of at least one opening comprises a plurality of openings.

15. The method of claim 8, further comprising:

depositing a dielectric liner over top surfaces and sidewalls of the array of layer stacks and on a top surface of the via-level dielectric layer; and depositing a dielectric cover layer over the dielectric liner, wherein encapsulated cavities that are free of any solid phase material are formed within the dielectric cover layer in gap areas between neighboring pairs of layer stacks within the array of layer stacks.

16. A method of forming a spatial light modulator device, the method comprising:

forming field effect transistors over a semiconductor substrate;

forming metal interconnect structures within dielectric material layers over the field effect transistors;

forming an array of spatial light modulator cells over the dielectric material layers by patterning a metallic heater material layer, a spacer dielectric material layer, and a phase change material layer into layer stacks, wherein each layer stack comprises a metallic heater plate, a spacer dielectric material plate over the metallic heater plate, and a phase change material plate over the spacer dielectric material plate, and wherein outer sidewalls of the metallic heater plate are vertically coincident with sidewalls of the spacer dielectric material plate and sidewalls of the phase change material plate.

17. The method of claim 16, further comprising forming a pair of bottom electrode via structures within a via-level dielectric layer before patterning the metallic heater material layer, wherein the pair of bottom electrode via structures contacts surface segments of a bottom surface of the metallic heater plate in one of the layer stacks.

18. The method of claim 16, further comprising forming a dielectric pillar structure in an opening through the metallic heater plate, wherein the dielectric pillar structure has a top surface that contacts a bottom surface of the spacer dielectric material plate and is located entirely within an area defined by the outer sidewalls of the metallic heater plate.

19. The method of claim 16, further comprising forming a dielectric liner over top surfaces and sidewalls of the layer stacks and forming a dielectric cover layer over the dielectric liner, wherein encapsulated cavities that are free of any solid phase material are located in gap areas between neighboring pairs of the layer stacks.

20. The method of claim 17, wherein forming the metal interconnect structures comprises electrically connecting a heater driver transistor selected from the field effect transistors to the pair of bottom electrode via structures that contacts the metallic heater plate in the one of the layer stacks.

* * * * *